US009557214B2

(12) United States Patent
Ho et al.

(10) Patent No.: US 9,557,214 B2
(45) Date of Patent: Jan. 31, 2017

(54) ILLUMINATION DEVICE AND METHOD FOR CALIBRATING AN ILLUMINATION DEVICE OVER CHANGES IN TEMPERATURE, DRIVE CURRENT, AND TIME

(71) Applicant: Ketra, Inc., Austin, TX (US)

(72) Inventors: Horace C. Ho, Austin, TX (US); Jason E. Lewis, Driftwood, TX (US); David J. Knapp, Austin, TX (US)

(73) Assignee: Ketra, Inc., Austin, TX (US)

( * ) Notice: Subject to any disclaimer, the term of this patent is extended or adjusted under 35 U.S.C. 154(b) by 176 days.

(21) Appl. No.: 14/314,451

(22) Filed: Jun. 25, 2014

(65) Prior Publication Data

US 2015/0377699 A1 Dec. 31, 2015

(51) Int. Cl.
*G01J 1/32* (2006.01)
*G01J 3/46* (2006.01)
(Continued)

(52) U.S. Cl.
CPC .............. *G01J 1/32* (2013.01); *G01J 1/0252* (2013.01); *G01J 3/0286* (2013.01); *G01J 3/465* (2013.01);
(Continued)

(58) Field of Classification Search
CPC .... G01J 1/0252; G01J 1/32; G01J 2001/4252; G01J 2001/444; G01J 3/0286; G01J 3/465; G01J 3/505; H05B 37/02
See application file for complete search history.

(56) References Cited

U.S. PATENT DOCUMENTS

| 4,029,976 A | 6/1977 | Fish et al. |
| 4,402,090 A | 8/1983 | Gfeller et al. |

(Continued)

FOREIGN PATENT DOCUMENTS

| CN | 1291282 | 4/2001 |
| CN | 1396616 | 2/2003 |

(Continued)

OTHER PUBLICATIONS

Office Action mailed Mar. 11, 2014 for JP Application 2012-523605.

(Continued)

*Primary Examiner* — Francis M Legasse, Jr.
(74) *Attorney, Agent, or Firm* — Kevin L. Daffer; Matheson Keys Daffer & Kordzik PLLC

(57) ABSTRACT

An illumination device and method is provided herein for calibrating individual LEDs in the illumination device, so as to obtain a desired luminous flux and a desired chromaticity of the device over changes in drive current, temperature, and over time as the LEDs age. The calibration method may include subjecting the illumination device to a first ambient temperature, successively applying at least three different drive currents to a first LED to produce illumination at three or more different levels of brightness, obtaining a plurality of optical measurements from the illumination produced by the first LED at each of the at least three different drive currents, obtaining a plurality of electrical measurements from the photodetector and storing results of the obtaining steps within the illumination device to calibrate the first LED at the first ambient temperature. The plurality of optical measurements may generally include luminous flux and chromaticity, the plurality of electrical measurements may generally include induced photocurrents and forward voltages, and the calibration method steps may be repeated for (Continued)

each LED included within the illumination device and upon subjecting the illumination device to a second ambient temperature.

17 Claims, 14 Drawing Sheets

(51) Int. Cl.
    *G01J 3/50*           (2006.01)
    *H05B 37/02*         (2006.01)
    *G01J 1/02*           (2006.01)
    *G01J 3/02*           (2006.01)
    *G01J 1/42*           (2006.01)
    *G01J 1/44*           (2006.01)

(52) U.S. Cl.
    CPC ............... *G01J 3/505* (2013.01); *H05B 37/02* (2013.01); *G01J 2001/4252* (2013.01); *G01J 2001/444* (2013.01)

(56) References Cited

U.S. PATENT DOCUMENTS

| | | | |
|---|---|---|---|
| 4,713,841 A | 12/1987 | Porter et al. | |
| 4,745,402 A | 5/1988 | Auerbach | |
| 4,809,359 A | 2/1989 | Dockery | |
| 5,018,057 A | 5/1991 | Biggs et al. | |
| 5,103,466 A | 4/1992 | Bazes | |
| 5,181,015 A | 1/1993 | Marshall et al. | |
| 5,193,201 A | 3/1993 | Tymes | |
| 5,218,356 A | 6/1993 | Knapp | |
| 5,299,046 A | 3/1994 | Spaeth et al. | |
| 5,317,441 A | 5/1994 | Sidman | |
| 5,541,759 A | 7/1996 | Neff et al. | |
| 5,619,262 A | 4/1997 | Uno | |
| 5,657,145 A | 8/1997 | Smith | |
| 5,797,085 A | 8/1998 | Beuk et al. | |
| 5,905,445 A | 5/1999 | Gurney et al. | |
| 6,016,038 A | 1/2000 | Mueller et al. | |
| 6,067,595 A | 5/2000 | Lindenstruth | |
| 6,069,929 A | 5/2000 | Yabe et al. | |
| 6,084,231 A | 7/2000 | Popat | |
| 6,094,014 A | 7/2000 | Bucks et al. | |
| 6,094,340 A | 7/2000 | Min | |
| 6,108,114 A | 8/2000 | Gilliland et al. | |
| 6,127,783 A | 10/2000 | Pashley et al. | |
| 6,147,458 A | 11/2000 | Bucks et al. | |
| 6,150,774 A | 11/2000 | Mueller et al. | |
| 6,234,645 B1 | 5/2001 | Borner et al. | |
| 6,234,648 B1 | 5/2001 | Borner et al. | |
| 6,250,774 B1 | 6/2001 | Begemann et al. | |
| 6,333,605 B1 | 12/2001 | Grouev et al. | |
| 6,344,641 B1 | 2/2002 | Blalock et al. | |
| 6,356,774 B1 | 3/2002 | Bernstein et al. | |
| 6,359,712 B1 | 3/2002 | Kamitani | |
| 6,384,545 B1 | 5/2002 | Lau | |
| 6,396,815 B1 | 5/2002 | Greaves et al. | |
| 6,414,661 B1 | 7/2002 | Shen et al. | |
| 6,441,558 B1 | 8/2002 | Muthu et al. | |
| 6,448,550 B1 | 9/2002 | Nishimura | |
| 6,495,964 B1 | 12/2002 | Muthu et al. | |
| 6,498,440 B2 | 12/2002 | Stam et al. | |
| 6,513,949 B1 | 2/2003 | Marshall et al. | |
| 6,577,512 B2 | 6/2003 | Tripathi et al. | |
| 6,617,795 B2 | 9/2003 | Bruning | |
| 6,636,003 B2 | 10/2003 | Rahm et al. | |
| 6,639,574 B2 | 10/2003 | Scheibe | |
| 6,664,744 B2 | 12/2003 | Dietz | |
| 6,692,136 B2 | 2/2004 | Marshall et al. | |
| 6,741,351 B2 | 5/2004 | Marshall et al. | |
| 6,753,661 B2 | 6/2004 | Muthu et al. | |
| 6,788,011 B2 | 9/2004 | Mueller et al. | |
| 6,806,659 B1 | 10/2004 | Mueller et al. | |
| 6,831,569 B2 | 12/2004 | Wang et al. | |
| 6,831,626 B2 | 12/2004 | Nakamura et al. | |
| 6,853,150 B2 | 2/2005 | Clauberg et al. | |
| 6,879,263 B2 | 4/2005 | Pederson et al. | |
| 6,965,205 B2 | 11/2005 | Piepgras et al. | |
| 6,969,954 B2 | 11/2005 | Lys | |
| 6,975,079 B2 | 12/2005 | Lys et al. | |
| 7,006,768 B1 | 2/2006 | Franklin | |
| 7,014,336 B1 | 3/2006 | Ducharme et al. | |
| 7,038,399 B2 | 5/2006 | Lys et al. | |
| 7,046,160 B2 | 5/2006 | Pederson et al. | |
| 7,072,587 B2 | 7/2006 | Dietz et al. | |
| 7,088,031 B2 | 8/2006 | Brantner et al. | |
| 7,119,500 B2 | 10/2006 | Young | |
| 7,135,824 B2 | 11/2006 | Lys et al. | |
| 7,161,311 B2 | 1/2007 | Mueller et al. | |
| 7,166,966 B2 | 1/2007 | Naugler, Jr. et al. | |
| 7,194,209 B1 | 3/2007 | Robbins et al. | |
| 7,233,115 B2 | 6/2007 | Lys | |
| 7,233,831 B2 | 6/2007 | Blackwell | |
| 7,252,408 B2 | 8/2007 | Mazzochette et al. | |
| 7,255,458 B2 | 8/2007 | Ashdown | |
| 7,256,554 B2 | 8/2007 | Lys | |
| 7,262,559 B2 | 8/2007 | Tripathi et al. | |
| 7,294,816 B2 | 11/2007 | Ng et al. | |
| 7,315,139 B1 | 1/2008 | Selvan et al. | |
| 7,319,298 B2 | 1/2008 | Jungwirth et al. | |
| 7,329,998 B2 | 2/2008 | Jungwirth | |
| 7,330,002 B2 | 2/2008 | Joung | |
| 7,330,662 B2 | 2/2008 | Zimmerman | |
| 7,352,972 B2 | 4/2008 | Franklin | |
| 7,358,706 B2 | 4/2008 | Lys | |
| 7,359,640 B2 | 4/2008 | Onde et al. | |
| 7,362,320 B2 | 4/2008 | Payne et al. | |
| 7,372,859 B2 | 5/2008 | Hall et al. | |
| 7,400,310 B2 | 7/2008 | LeMay | |
| 7,445,340 B2 | 11/2008 | Conner et al. | |
| 7,511,695 B2 | 3/2009 | Furukawa et al. | |
| 7,525,611 B2 | 4/2009 | Zagar et al. | |
| 7,554,514 B2 | 6/2009 | Nozawa | |
| 7,573,210 B2 | 8/2009 | Ashdown et al. | |
| 7,583,901 B2 | 9/2009 | Nakagawa et al. | |
| 7,606,451 B2 | 10/2009 | Morita | |
| 7,607,798 B2 | 10/2009 | Panotopoulos | |
| 7,619,193 B2 | 11/2009 | Deurenberg | |
| 7,649,527 B2 | 1/2010 | Cho et al. | |
| 7,659,672 B2 | 2/2010 | Yang | |
| 7,683,864 B2 | 3/2010 | Lee et al. | |
| 7,701,151 B2 | 4/2010 | Petrucci et al. | |
| 7,737,936 B2 | 6/2010 | Daly | |
| 7,828,479 B1 | 11/2010 | Aslan et al. | |
| 8,013,538 B2 | 9/2011 | Zampini et al. | |
| 8,018,135 B2 | 9/2011 | Van De Ven et al. | |
| 8,040,299 B2 | 10/2011 | Kretz et al. | |
| 8,044,899 B2 | 10/2011 | Ng et al. | |
| 8,044,918 B2 | 10/2011 | Choi | |
| 8,057,072 B2 | 11/2011 | Takenaka et al. | |
| 8,075,182 B2 | 12/2011 | Dai et al. | |
| 8,076,869 B2 | 12/2011 | Shatford et al. | |
| 8,159,150 B2 * | 4/2012 | Ashdown ........... | H05B 33/0818 315/149 |
| 8,174,197 B2 | 5/2012 | Ghanem et al. | |
| 8,174,205 B2 | 5/2012 | Myers et al. | |
| 8,283,876 B2 | 10/2012 | Ji | |
| 8,299,722 B2 | 10/2012 | Melanson | |
| 8,362,707 B2 | 1/2013 | Draper et al. | |
| 8,471,496 B2 | 6/2013 | Knapp | |
| 8,521,035 B2 | 8/2013 | Knapp et al. | |
| 8,556,438 B2 | 10/2013 | McKenzie et al. | |
| 8,569,974 B2 | 10/2013 | Chobot | |
| 8,595,748 B1 | 11/2013 | Haggerty et al. | |
| 8,633,655 B2 | 1/2014 | Kao et al. | |
| 8,653,758 B2 | 2/2014 | Radermacher et al. | |
| 8,680,787 B2 | 3/2014 | Veskovic | |
| 8,704,666 B2 | 4/2014 | Baker, Jr. | |
| 8,721,115 B2 | 5/2014 | Ing et al. | |
| 8,749,172 B2 | 6/2014 | Knapp | |
| 8,773,032 B2 | 7/2014 | May et al. | |
| 8,791,647 B2 | 7/2014 | Kesterson et al. | |
| 8,816,600 B2 | 8/2014 | Elder | |

(56) References Cited

U.S. PATENT DOCUMENTS

| | | |
|---|---|---|
| 8,911,160 B2 | 12/2014 | Seo et al. |
| 2001/0020123 A1 | 9/2001 | Diab et al. |
| 2001/0030668 A1 | 10/2001 | Erten et al. |
| 2002/0014643 A1 | 2/2002 | Kubo et al. |
| 2002/0033981 A1 | 3/2002 | Keller et al. |
| 2002/0047624 A1 | 4/2002 | Stam et al. |
| 2002/0049933 A1 | 4/2002 | Nyu |
| 2002/0134908 A1 | 9/2002 | Johnson |
| 2002/0138850 A1 | 9/2002 | Basil et al. |
| 2002/0171608 A1 | 11/2002 | Kanai et al. |
| 2003/0103413 A1 | 6/2003 | Jacobi, Jr. et al. |
| 2003/0122749 A1 | 7/2003 | Booth, Jr. et al. |
| 2003/0133491 A1 | 7/2003 | Shih |
| 2003/0179721 A1 | 9/2003 | Shurmantine et al. |
| 2004/0044709 A1 | 3/2004 | Cabrera et al. |
| 2004/0052076 A1 | 3/2004 | Mueller et al. |
| 2004/0052299 A1 | 3/2004 | Jay et al. |
| 2004/0101312 A1 | 5/2004 | Cabrera |
| 2004/0136682 A1 | 7/2004 | Watanabe |
| 2004/0201793 A1 | 10/2004 | Anandan et al. |
| 2004/0220922 A1 | 11/2004 | Lovison et al. |
| 2004/0257311 A1 | 12/2004 | Kanai et al. |
| 2005/0004727 A1 | 1/2005 | Remboski et al. |
| 2005/0030203 A1 | 2/2005 | Sharp et al. |
| 2005/0030267 A1 | 2/2005 | Tanghe et al. |
| 2005/0053378 A1 | 3/2005 | Stanchfield et al. |
| 2005/0077838 A1 | 4/2005 | Blumel |
| 2005/0110777 A1 | 5/2005 | Geaghan et al. |
| 2005/0169643 A1 | 8/2005 | Franklin |
| 2005/0200292 A1 | 9/2005 | Naugler, Jr. et al. |
| 2005/0207157 A1 | 9/2005 | Tani |
| 2005/0242742 A1 | 11/2005 | Cheang et al. |
| 2005/0265731 A1 | 12/2005 | Keum et al. |
| 2006/0145887 A1 | 7/2006 | McMahon |
| 2006/0164291 A1 | 7/2006 | Gunnarsson |
| 2006/0198463 A1 | 9/2006 | Godin |
| 2006/0220990 A1 | 10/2006 | Coushaine et al. |
| 2006/0227085 A1 | 10/2006 | Boldt, Jr. et al. |
| 2007/0040512 A1 | 2/2007 | Jungwirth et al. |
| 2007/0109239 A1 | 5/2007 | den Boer et al. |
| 2007/0132592 A1 | 6/2007 | Stewart et al. |
| 2007/0139957 A1 | 6/2007 | Haim et al. |
| 2007/0248180 A1 | 10/2007 | Bowman et al. |
| 2007/0254694 A1 | 11/2007 | Nakagwa et al. |
| 2007/0279346 A1 | 12/2007 | den Boer et al. |
| 2008/0061717 A1 | 3/2008 | Bogner et al. |
| 2008/0107029 A1 | 5/2008 | Hall et al. |
| 2008/0120559 A1 | 5/2008 | Yee |
| 2008/0136334 A1 | 6/2008 | Robinson et al. |
| 2008/0136770 A1 | 6/2008 | Peker et al. |
| 2008/0136771 A1 | 6/2008 | Chen et al. |
| 2008/0150864 A1 | 6/2008 | Bergquist |
| 2008/0186898 A1 | 8/2008 | Petite |
| 2008/0222367 A1 | 9/2008 | Co |
| 2008/0235418 A1 | 9/2008 | Werthen et al. |
| 2008/0253766 A1 | 10/2008 | Yu et al. |
| 2008/0265799 A1 | 10/2008 | Sibert |
| 2008/0297070 A1 | 12/2008 | Kuenzler et al. |
| 2008/0304833 A1 | 12/2008 | Zheng |
| 2008/0309255 A1* | 12/2008 | Myers .................. F21K 9/00 315/297 |
| 2008/0317475 A1 | 12/2008 | Pederson et al. |
| 2009/0016390 A1* | 1/2009 | Sumiyama ............ G01J 1/0414 372/29.01 |
| 2009/0026978 A1 | 1/2009 | Robinson |
| 2009/0040154 A1 | 2/2009 | Scheibe |
| 2009/0049295 A1 | 2/2009 | Erickson et al. |
| 2009/0051496 A1 | 2/2009 | Pahlavan et al. |
| 2009/0121238 A1 | 5/2009 | Peck |
| 2009/0171571 A1 | 7/2009 | Son et al. |
| 2009/0196282 A1 | 8/2009 | Fellman et al. |
| 2009/0245101 A1 | 10/2009 | Kwon et al. |
| 2009/0278789 A1 | 11/2009 | Declercq et al. |
| 2009/0284511 A1 | 11/2009 | Takasugi et al. |
| 2009/0303972 A1 | 12/2009 | Flammer, III et al. |
| 2010/0005533 A1 | 1/2010 | Shamir |
| 2010/0054748 A1 | 3/2010 | Sato |
| 2010/0061734 A1 | 3/2010 | Knapp |
| 2010/0096447 A1 | 4/2010 | Kwon et al. |
| 2010/0134021 A1 | 6/2010 | Ayres |
| 2010/0134024 A1 | 6/2010 | Brandes |
| 2010/0141159 A1 | 6/2010 | Shiu et al. |
| 2010/0182294 A1 | 7/2010 | Roshan et al. |
| 2010/0188443 A1 | 7/2010 | Lewis et al. |
| 2010/0188972 A1 | 7/2010 | Knapp |
| 2010/0194299 A1 | 8/2010 | Ye et al. |
| 2010/0213856 A1 | 8/2010 | Mizusako |
| 2010/0272437 A1 | 10/2010 | Yoon et al. |
| 2010/0301777 A1 | 12/2010 | Kraemer |
| 2010/0327764 A1 | 12/2010 | Knapp |
| 2011/0031894 A1 | 2/2011 | Van De Ven |
| 2011/0044343 A1 | 2/2011 | Sethuram et al. |
| 2011/0052214 A1 | 3/2011 | Shimada et al. |
| 2011/0062874 A1 | 3/2011 | Knapp |
| 2011/0063214 A1 | 3/2011 | Knapp |
| 2011/0063268 A1 | 3/2011 | Knapp |
| 2011/0068699 A1 | 3/2011 | Knapp |
| 2011/0069094 A1 | 3/2011 | Knapp |
| 2011/0069960 A1 | 3/2011 | Knapp et al. |
| 2011/0133654 A1 | 6/2011 | McKenzie et al. |
| 2011/0148315 A1 | 6/2011 | Van Der Veen et al. |
| 2011/0150028 A1 | 6/2011 | Nguyen et al. |
| 2011/0187281 A1* | 8/2011 | Lu .......................... H05B 37/02 315/291 |
| 2011/0248640 A1 | 10/2011 | Welten |
| 2011/0253915 A1 | 10/2011 | Knapp |
| 2011/0299854 A1 | 12/2011 | Jonsson et al. |
| 2011/0309754 A1 | 12/2011 | Ashdown et al. |
| 2012/0056545 A1 | 3/2012 | Radermacher et al. |
| 2012/0153839 A1 | 6/2012 | Farley et al. |
| 2012/0229032 A1 | 9/2012 | Van De Ven et al. |
| 2012/0299481 A1 | 11/2012 | Stevens |
| 2012/0306370 A1 | 12/2012 | Van De Ven et al. |
| 2013/0016978 A1 | 1/2013 | Son et al. |
| 2013/0088522 A1 | 4/2013 | Gettemy et al. |
| 2013/0201690 A1 | 8/2013 | Vissenberg et al. |
| 2013/0257314 A1 | 10/2013 | Alvord et al. |
| 2013/0293147 A1 | 11/2013 | Rogers et al. |
| 2014/0028377 A1 | 1/2014 | Rosik et al. |
| 2015/0022110 A1 | 1/2015 | Sisto |

FOREIGN PATENT DOCUMENTS

| | | |
|---|---|---|
| CN | 1573881 | 2/2005 |
| CN | 1650673 | 8/2005 |
| CN | 1849707 | 10/2006 |
| CN | 101083866 | 12/2007 |
| CN | 101150904 | 3/2008 |
| CN | 101331798 | 12/2008 |
| CN | 101458067 | 6/2009 |
| EP | 0196347 | 10/1986 |
| EP | 0456462 | 11/1991 |
| EP | 2273851 | 1/2011 |
| GB | 2307577 | 5/1997 |
| JP | 06-302384 | 10/1994 |
| JP | 08-201472 | 8/1996 |
| JP | 11-025822 | 1/1999 |
| JP | 2001-514432 | 9/2001 |
| JP | 2004-325643 | 11/2004 |
| JP | 2005-539247 | 12/2005 |
| JP | 2006-260927 | 9/2006 |
| JP | 2007-266974 | 10/2007 |
| JP | 2007-267037 | 10/2007 |
| JP | 2008-507150 | 3/2008 |
| JP | 2008-300152 | 12/2008 |
| JP | 2009-134877 | 6/2009 |
| WO | 00/37904 | 6/2000 |
| WO | 03/075617 | 9/2003 |
| WO | 2005/024898 | 3/2005 |
| WO | 2007/069149 | 6/2007 |
| WO | 2008/065607 | 6/2008 |
| WO | 2008/129453 | 10/2008 |
| WO | 2010/124315 | 11/2010 |

(56) References Cited

FOREIGN PATENT DOCUMENTS

| | | |
|---|---|---|
| WO | 2012/005771 | 1/2012 |
| WO | 2012/042429 | 4/2012 |
| WO | 2013/142437 | 9/2013 |

OTHER PUBLICATIONS

Office Action mailed Sep. 24, 2014 for JP Application 2012-523605.
Office Action mailed Mar. 25, 2015 for U.S. Appl. No. 14/305,472.
Notice of Allowance mailed Mar. 30, 2015 for U.S. Appl. No. 14/097,355.
Office Action mailed Apr. 8, 2015 for U.S. Appl. No. 14/305,456.
Notice of Allowance mailed May 22, 2015 for U.S. Appl. No. 14/510,212.
Office Action mailed May 27, 2015 for U.S. Appl. No. 12/806,117.
Partial International Search Report mailed Mar. 27, 2015 for PCT/US2014/068556.
"LED Fundamentals, How to Read a Datasheet (Part 2 of 2) Characteristic Curves, Dimensions and Packaging," Aug. 19, 2011, OSRAM Opto Semiconductors, 17 pages.
International Search Report & Written Opinion for PCT/US2014/068556 mailed Jun. 22, 2015.
Final Office Action for U.S. Appl. No. 12/803,805 mailed Jun. 23, 2015.
Office Action for U.S. Appl. No. 13/970,964 mailed Jun. 29, 2015.
Office Action for U.S. Appl. No. 14/510,243 mailed Jul. 28, 2015.
Office Action for U.S. Appl. No. 14/510,283 mailed Jul. 29, 2015.
Office Action for U.S. Appl. No. 14/510,266 mailed Jul. 31, 2015.
Office Action for U.S. Appl. No. 13/970,990 mailed Aug. 20, 2015.
Partial International Search Report for PCT/US2015/037660 mailed Aug. 21, 2015.
Final Office Action for U.S. Appl. No. 13/773,322 mailed Sep. 2, 2015.
Notice of Allowance for U.S. Appl. No. 13/970,944 mailed Sep. 11, 2015.
Notice of Allowance for U.S. Appl. No. 14/604,886 mailed Sep. 25, 2015.
Notice of Allowance for U.S. Appl. No. 14/604,881 mailed Oct. 9, 2015.
Bouchet et al., "Visible-light communication system enabling 73 Mb/s data streaming," IEEE Globecom Workshop on Optical Wireless Communications, 2010, pp. 1042-1046.
International Search Report & Written Opinion for PCT/US2015/037660 mailed Oct. 28, 2015.
Office Action for U.S. Appl. No. 14/573,207 mailed Nov. 4, 2015.
Notice of Allowance for U.S. Appl. No. 14/510,243 mailed Nov. 6, 2015.
Notice of Allowance for U.S. Appl. No. 12/806,117 mailed Nov. 18, 2015.
Partial International Search Report for PCT/US2015/045252 mailed Nov. 18, 2015.
Final Office Action mailed Jan. 28, 2015 for U.S. Appl. No. 12/806,117.
Office Action mailed Mar. 6, 2015 for U.S. Appl. No. 13/773,322.
Office Action mailed Feb. 2, 2015 for CN Application 201080035731.X.
Office Action mailed Jul. 1, 2014 for JP Application 2012-520587.
Office Action mailed Feb. 17, 2015 for JP Application 2012-520587.
Hall et al., "Jet Engine Control Using Ethernet with a BRAIN (Postprint)," AIAA/ASME/SAE/ASEE Joint Propulsion Conference and Exhibition, Jul. 2008, pp. 1-18.
Kebemou, "A Partitioning-Centric Approach for the Modeling and the Methodical Design of Automotive Embedded System Architectures," Dissertation of Technical University of Berlin, 2008, 176 pages.
O'Brien et al., "Visible Light Communications and Other Developments in Optical Wireless," Wireless World Research Forum, 2006, 26 pages.
Zalewski et al., "Safety Issues in Avionics and Automotive Databuses," IFAC World Congress, Jul. 2005, 6 pages.
"Visible Light Communication: Tutorial," Project IEEE P802.15 Working Group for Wireless Personal Area Networks (WPANs), Mar. 2008.
Johnson, "Visible Light Communications," CTC Tech Brief, Nov. 2009, 2 pages.
Chonko, "Use Forward Voltage Drop to Measure Junction Temperature," Dec. 2005, (c) 2013 Penton Media, Inc., 5 pages.
International Search Report & Written Opinion, PCT/US2010/000219, mailed Oct. 12, 2010.
International Search Report & Written Opinion, PCT/US2010/002171, mailed Nov. 24, 2010.
International Search Report & Written Opinion, PCT/US2010/004953, mailed Mar. 22, 2010.
International Search Report & Written Opinion, PCT/US2010/001919, mailed Feb. 24, 2011.
Office Action mailed May 12, 2011 for U.S. Appl. No. 12/360,467.
Final Office Action mailed Nov. 28, 2011 for U.S. Appl. No. 12/360,467.
Notice of Allowance mailed Jan. 20, 2012 for U.S. Appl. No. 12/360,467.
Office Action Mailed Feb. 1, 2012 for U.S. Appl. No. 12/584,143.
Final Office Action Mailed Sep. 12, 2012 for U.S. Appl. No. 12/584,143.
Office Action Mailed Aug. 2, 2012 for U.S. Appl. No. 12/806,114.
Office Action Mailed Oct. 2, 2012 for U.S. Appl. No. 12/806,117.
Office Action Mailed Jul. 11, 2012 for U.S. Appl. No. 12/806,121.
Final Office Action Mailed Oct. 11, 2012 for U.S. Appl. No. 12/806,121.
Office Action mailed Dec. 17, 2012 for U.S. Appl. No. 12/806,118.
Office Action mailed Oct. 9, 2012 for U.S. Appl. No. 12/806,126.
Office Action mailed Jul. 10, 2012 for U.S. Appl. No. 12/806,113.
Notice of Allowance mailed Oct. 15, 2012 for U.S. Appl. No. 12/806,113.
International Search Report & Written Opinion mailed Sep. 19, 2012 for PCT/US2012/045392.
Partial International Search Report mailed Nov. 16, 2012 for PCT/US2012/052774.
International Search Report & Written Opinion for PCT/US2012/052774 mailed Feb. 4, 2013.
Notice of Allowance mailed Feb. 4, 2013 for U.S. Appl. No. 12/806,113.
Notice of Allowance mailed Feb. 25, 2013 for U.S. Appl. No. 12/806,121.
Notice of Allowance mailed May 3, 2013 for U.S. Appl. No. 12/806,126.
International Search Report & Written Opinion, PCT/US2013/027157, May 16, 2013.
Office Action mailed Jun. 10, 2013 for U.S. Appl. No. 12/924,628.
Final Office Action mailed Jun. 14, 2013 for U.S. Appl. No. 12/806,117.
Office Action mailed Jun. 27, 2013 for U.S. Appl. No. 13/178,686.
Final Office Action mailed Jul. 9, 2013 for U.S. Appl. No. 12/806,118.
Office Action mailed Oct. 24, 2013 for U.S. Appl. No. 12/806,117.
Notice of Allowance mailed Oct. 31, 2013 for U.S. Appl. No. 12/924,628.
Office Action mailed Nov. 12, 2013 for U.S. Appl. No. 13/231,077.
Office Action mailed Dec. 4, 2013 for U.S. Appl. No. 12/803,805.
Office Action mailed Nov. 4, 2013 for CN Application No. 201080032373.7.
Notice of Allowance mailed Jan. 28, 2014 for U.S. Appl. No. 13/178,686.
Notice of Allowance mailed Feb. 21, 2014 for U.S. Appl. No. 12/806,118.
Office Action mailed Apr. 22, 2014 for U.S. Appl. No. 12/806,114.
Final Office Action mailed Jun. 18, 2014 for U.S. Appl. No. 13/231,077.
Office Action mailed Jun. 23, 2014 for U.S. Appl. No. 12/806,117.
Notice of Allowance mailed Aug. 21, 2014 for U.S. Appl. No. 12/584,143.
Office Action mailed Sep. 10, 2014 for U.S. Appl. No. 12/803,805.
"Color Management of a Red, Green, and Blue LED Combinational Light Source," Avago Technologies, Mar. 2010, pp. 1-8.

* cited by examiner

| Temp | Drive | Param | White | Blue | Green | Red |
|---|---|---|---|---|---|---|
| T0 | 10% | Luma | x | x | x | x |
| | | X chrom | x | x | x | x |
| | | Y chrom | x | x | x | x |
| | | Iph_d1 | x | x | x | x |
| | | Vfd1 | x | x | x | x |
| | | Vfe | x | x | x | x |
| | | *Iph_d2* | x | x | | |
| | | *Vfd2* | x | x | | |
| | 30% | Luma | x | x | x | x |
| | | X chrom | x | x | x | x |
| | | Y chrom | x | x | x | x |
| | | Iph_d1 | x | x | x | x |
| | | Vfd1 | x | x | x | x |
| | | Vfe | x | x | x | x |
| | | *Iph_d2* | x | x | | |
| | | *Vfd2* | x | x | | |
| | 100% | Luma | x | x | x | x |
| | | X chrom | x | x | x | x |
| | | Y chrom | x | x | x | x |
| | | Iph_d1 | x | x | x | x |
| | | Vfd1 | x | x | x | x |
| | | Vfe | x | x | x | x |
| | | *Iph_d2* | x | x | | |
| | | *Vfd2* | x | x | | |
| T1 | 10% | Luma | x | x | x | x |
| | | X chrom | x | x | x | x |
| | | Y chrom | x | x | x | x |
| | | Iph_d1 | x | x | x | x |
| | | Vfd1 | x | x | x | x |
| | | Vfe | x | x | x | x |
| | | *Iph_d2* | x | x | | |
| | | *Vfd2* | x | x | | |
| | 30% | Luma | x | x | x | x |
| | | X chrom | x | x | x | x |
| | | Y chrom | x | x | x | x |
| | | Iph_d1 | x | x | x | x |
| | | Vfd1 | x | x | x | x |
| | | Vfe | x | x | x | x |
| | | *Iph_d2* | x | x | | |
| | | *Vfd2* | x | x | | |
| | 100% | Luma | x | x | x | x |
| | | X chrom | x | x | x | x |
| | | Y chrom | x | x | x | x |
| | | Iph_d1 | x | x | x | x |
| | | Vfd1 | x | x | x | x |
| | | Vfe | x | x | x | x |
| | | *Iph_d2* | x | x | | |
| | | *Vfd2* | x | x | | |

FIG. 7

ILLUMINATION DEVICE AND METHOD FOR CALIBRATING AN ILLUMINATION DEVICE OVER CHANGES IN TEMPERATURE, DRIVE CURRENT, AND TIME

RELATED APPLICATIONS

This application is related to commonly assigned U.S. application Ser. No. 13/970,944, now U.S. Pat. No. 9,237,620, Ser. Nos. 13/970,964, and 13/970,990; U.S. Provisional Application No. 61/886,471; and U.S. application Ser. No. 14/097,339. The entirety of these applications is incorporated herein by reference.

BACKGROUND OF THE INVENTION

1. Field of the Invention

This invention relates to illumination devices comprising a plurality of light emitting diodes (LEDs) and, more particularly, to illumination devices and methods for calibrating individual LEDs in the illumination device, so as to obtain a desired luminous flux and a desired chromaticity of the device over changes in drive current, temperature, and over time as the LEDs age.

2. Description of the Relevant Art

The following descriptions and examples are provided as background only and are intended to reveal information that is believed to be of possible relevance to the present invention. No admission is necessarily intended, or should be construed, that any of the following information constitutes prior art impacting the patentable character of the subject matter claimed herein.

Lamps and displays using LEDs (light emitting diodes) for illumination are becoming increasingly popular in many different markets. LEDs provide a number of advantages over traditional light sources, such as incandescent and fluorescent light bulbs, including low power consumption, long lifetime, no hazardous materials, and additional specific advantages for different applications. When used for general illumination, LEDs provide the opportunity to adjust the color (e.g., from white, to blue, to green, etc.) or the color temperature (e.g., from "warm white" to "cool white") to produce different lighting effects.

Although LEDs have many advantages over conventional light sources, one disadvantage of LEDs is that their output characteristics (e.g., luminous flux and chromaticity) vary over changes in drive current, temperature and over time as the LEDs age. These effects are particularly evident in multi-colored LED illumination devices, which combine a number of differently colored emission LEDs into a single package.

An example of a multi-colored LED illumination device is one in which two or more different colors of LEDs are combined within the same package to produce white or near-white light. There are many different types of white light lamps on the market, some of which combine red, green and blue (RGB) LEDs, red, green, blue and yellow (RGBY) LEDs, phosphor-converted white and red (WR) LEDs, RGBW LEDs, etc. By combining different colors of LEDs within the same package, and driving the differently colored LEDs with different drive currents, these lamps may be configured to generate white or near-white light within a wide gamut of color points or correlated color temperatures (CCTs) ranging from "warm white" (e.g., roughly 2600K-3700K), to "neutral white" (e.g., 3700K-5000K) to "cool white" (e.g., 5000K-8300K). Some multi-colored LED illumination devices also enable the brightness and/or color of the illumination to be changed to a particular set point. These tunable illumination devices should all produce the same color and color rendering index (CRI) when set to a particular dimming level and chromaticity setting (or color set point) on a standardized chromaticity diagram.

A chromaticity diagram maps the gamut of colors the human eye can perceive in terms of chromaticity coordinates and spectral wavelengths. The spectral wavelengths of all saturated colors are distributed around the edge of an outlined space (called the "gamut" of human vision), which encompasses all of the hues perceived by the human eye. The curved edge of the gamut is called the spectral locus and corresponds to monochromatic light, with each point representing a pure hue of a single wavelength. The straight edge on the lower part of the gamut is called the line of purples. These colors, although they are on the border of the gamut, have no counterpart in monochromatic light. Less saturated colors appear in the interior of the figure, with white and near-white colors near the center.

In the 1931 CIE Chromaticity Diagram, colors within the gamut of human vision are mapped in terms of chromaticity coordinates (x, y). For example, a red (R) LED with a peak wavelength of 625 nm may have a chromaticity coordinate of (0.69, 0.31), a green (G) LED with a peak wavelength of 528 nm may have a chromaticity coordinate of (0.18, 0.73), and a blue (B) LED with a peak wavelength of 460 nm may have a chromaticity coordinate of (0.14, 0.04). The chromaticity coordinates (i.e., color points) that lie along the blackbody locus obey Planck's equation, $E(\lambda)=A\lambda^{-5}/(e^{(B/T)}-1)$. Color points that lie on or near the blackbody locus provide a range of white or near-white light with color temperatures ranging between approximately 2500K and 10,000K. These color points are typically achieved by mixing light from two or more differently colored LEDs. For example, light emitted from the RGB LEDs shown in FIG. 1 may be mixed to produce a substantially white light with a color temperature in the range of about 2500K to about 5000K.

Although an illumination device is typically configured to produce a range of white or near-white color temperatures arranged along the blackbody curve (e.g., about 2500K to 5000K), some illumination devices may be configured to produce any color within the color gamut 18 (triangle) formed by the individual LEDs (e.g., RGB). The chromaticity coordinates of the combined light, e.g., (0.437, 0.404) for 3000K white light, define the target chromaticity or color set point at which the device is intended to operate. In some devices, the target chromaticity or color set point may be changed by altering the ratio of drive currents supplied to the individual LEDs.

In general, the target chromaticity of the illumination device may be changed by adjusting the drive current levels (in current dimming) or duty cycle (in PWM dimming) supplied to one or more of the emission LEDs. For example, an illumination device comprising RGB LEDs may be configured to produce "warmer" white light by increasing the drive current supplied to the red LEDs and decreasing the drive currents supplied to the blue and/or green LEDs. Since adjusting the drive currents also affects the lumen output and temperature of the illumination device, the target chromaticity must be carefully calibrated and controlled to ensure that the actual chromaticity equals the target value. Most prior art illumination devices fail to provide an accurate calibration and compensation method for controlling the color of the illumination device.

Some prior art illumination devices also provide dimming capabilities, i.e., the ability to change the brightness or luminous flux output from the emission LEDs, in addition to (or instead of) color tuning. In most cases, the dimming level is changed by adjusting the drive current levels (in current dimming) or the duty cycle of the drive currents (in PWM dimming) supplied to all emission LEDs to produce a target dimming level. However, adjusting the supplied drive currents changes the chromaticity of the illumination, and this change in chromaticity differs for different LED devices and different dimming methods. For example, the chromaticity of an RGB LED illumination device may change rather significantly with changes drive current level and duty cycle, while the chromaticity of a phosphor-converted white LED illumination device is more consistent. In order to maintain a consistent target chromaticity, a range of target chromaticity values must be carefully calibrated over a range of target dimming levels.

In practice, the lumen output and chromaticity produced by prior art illumination devices often differs from the target dimming level and target chromaticity setting, due to changes in temperature and over time as the LEDs age. In general, changes in temperature affect the lumen output and chromaticity of all phosphor converted and non-phosphor converted LEDs. While prior art devices may perform some level of temperature compensation, they fail to provide accurate results by failing to recognize that temperature affects the lumen output and chromaticity of different colors of LEDs differently. Moreover, these prior art devices fail to account for chromaticity shifts in the illumination produced by phosphor converted LEDs, which result from phosphor aging. As a consequence, these prior art devices cannot maintain a desired luminous flux and a desired chromaticity for an LED illumination device over operating conditions and over the lifetime of the illumination device.

A need remains for improved illumination devices and methods for calibrating and compensating individual LEDs within an LED illumination device, so as to accurately maintain a desired luminous flux and a desired chromaticity for the illumination device over changes in temperature, changes in drive current and over time, as the LEDs age. This need is particularly warranted in multi-color LED illumination devices, since different colors of LEDs are affected differently by temperature and age, and in tunable illumination devices that enable the target dimming level and/or the target chromaticity setting to be changed by adjusting the drive currents supplied to one or more of the LEDs, since changes in drive current inherently affect the lumen output, color and temperature of the illumination device.

SUMMARY OF THE INVENTION

The following description of various embodiments of an illumination device and a method for calibrating an illumination device is not to be construed in any way as limiting the subject matter of the appended claims.

According to one embodiment, a method is provided herein for calibrating individual light emitting diodes (LEDs) in an LED illumination device, so that a desired luminous flux and a desired chromaticity of the device can be maintained over changes in drive current, temperature, and over time as the LEDs age. In general, the illumination device described herein may include a plurality of emission LEDs, or a plurality of chains of emission LEDs, and at least one dedicated photodetector. For the sake of simplicity, the term "LED" will be used herein to refer to a single LED or a chain of serially connected LEDs supplied with the same drive current. Although the calibration method described below refers only to a first LED, the method may be performed for each emission LED included within the illumination device.

According to one embodiment, the calibration method described herein may include subjecting the illumination device to a first ambient temperature and successively applying at least three different drive currents to a first LED of the illumination device to produce illumination at three or more different levels of brightness. At each of the at least three different drive currents, the calibration method may obtain a plurality of optical measurements from the illumination produced by the first LED and a plurality of electrical measurements from the at least one dedicated photodetector. In some embodiments, the plurality of optical measurements may comprise a plurality of luminous flux and chromaticity measurements, which are obtained from the illumination produced by the first LED at each of the at least three different drive currents.

In some embodiments, the plurality of electrical measurements may comprise a plurality of photocurrents, which are induced on the photodetector by the illumination produced by the first LED at each of the at least three different drive currents, and a plurality of forward voltages that are measured across the photodetector before, during or after each induced photocurrent is measured. The forward voltages are generally measured across the photodetector by applying a non-operative drive current to the photodetector. The non-operative drive current applied to the photodetector for measuring forward voltages may range between approximately 100 $\mu$A and approximately 1 mA, depending on the number of photodetectors included within the illumination device, the size of the photodetector(s) and the manner in which they are connected.

In some embodiments, the method may also measure a forward voltage that develops across the anode and cathode of the first LED by applying a non-operative drive current to the first LED sometime before, during or after each induced photocurrent is measured from the photodetector. The non-operative drive current applied to the first LED for measuring forward voltage may range between approximately 1 mA and approximately 10 mA, depending on the size of the first LED.

In general, the drive currents supplied to the first LED for obtaining luminous flux, chromaticity and induced photocurrent measurements may be operative drive current levels (e.g., about 20 mA to about 500 mA), and thus, may be substantially greater than the non-operative drive current (e.g., about 0.1 mA to about 1 mA) supplied to the photodetector and the non-operative drive current (e.g., about 0.1 mA to about 10 mA) supplied to first LED to measure forward voltage. In some cases, increasingly greater drive current levels may be successively applied to the first LED to obtain the luminous flux, chromaticity and induced photocurrent measurements. In other cases, the luminous flux, chromaticity and induced photocurrent measurements may be obtained upon successively applying decreasing levels of drive current to the first LED. The order in which the drive currents are applied during the optical and electrical measurements is largely unimportant, only that the drive currents be different from one another.

In one embodiment, three luminous flux measurements, three x chromaticity measurements, three y chromaticity measurements and three induced photocurrent measurements may be obtained from the first LED upon successively applying a first operative drive current, a second operative drive current that is substantially less than the first operative drive current, and a third operative drive current that is substantially less than the second operative drive current to the first LED. In one example, the first operative drive current may be substantially equal to a maximum drive current associated with the first LED (e.g., about 500 mA, depending on LED part number and manufacturer), the second operative drive current may be about 30% of the maximum drive current, and the third operative drive current may be about 10% of the maximum drive current. Although examples are provided herein, the calibration method is not limited to any particular value or any particular number of drive current levels, and may apply substantially any value and/or any number of drive current levels to the first LED within the operating current level range of that LED. In addition, the calibration method is not limited measuring chromaticity in only the CIE 1931 XYZ color space, and may additionally or alternatively measure chromaticity in any color space that can be used to describe the gamut of an LED illumination device comprising combinations of emission LEDs as described herein.

In some embodiments, the first LED may be a phosphor converted LED and the calibration method may be configured for calibrating separate portions of the phosphor converted LED spectrum, as if it were two separate LEDs. For example, a spectrum of the illumination emitted from the phosphor converted LED may include a first portion having a first peak emission wavelength (e.g., about 400-500 nm) and a second portion having a second peak emission wavelength (e.g., about 500-650 nm), which differs from the first peak emission wavelength. In such embodiments, the calibration method may obtain a plurality of optical measurements (e.g., luminous flux, x chromaticity and y chromaticity) from the illumination, which is separately produced by each portion of the phosphor converted LED spectrum at each of the at least three different drive currents.

For a phosphor converted LED, the calibration method may also obtain a plurality of electrical measurements (e.g., induced photocurrents and forward voltages) from at least two different photodetectors at each of the at least three different drive currents. Specifically, a first photodetector (e.g., a green photodetector) with a first detection range may be used for measuring the photocurrent induced in the first photodetector by the first portion of the spectrum emitted by the phosphor converted LED. Likewise, a second photodetector (e.g., a red photodetector) with a second detection range may be used for measuring the photocurrent induced in the second photodetector by the second portion of the spectrum emitted by the phosphor converted LED. Sometime before, during or after each induced photocurrent is measured, a non-operative drive current may be supplied to the first and second photodetectors to measure the forward voltages developed there across.

Sometime after the optical and electrical measurement values are obtained at the first ambient temperature, the results of the obtaining steps may be stored within the illumination device to calibrate the first LED at the first temperature. In one embodiment, the optical and electrical measurement values obtained at the first ambient temperature may be stored within a table of calibration values.

In some cases, the calibration method may continue by subjecting the illumination device to a second ambient temperature, which is different from the first ambient temperature, and repeating the steps of successively applying at least three different drive currents to the first LED, obtaining a plurality of optical measurements from the illumination produced by the first LED at each of the at least three different drive currents, obtaining a plurality of electrical measurements from the photodetector, and storing the results of the obtaining steps within the illumination device to calibrate the first LED at the second ambient temperature. In one embodiment, the optical and electrical measurement values obtained at the second ambient temperature may also be stored within the table of calibration values.

In one embodiment, the second ambient temperature may be substantially less than the first ambient temperature. For example, the second ambient temperature may be approximately equal to room temperature (e.g., roughly 25° C.), and the first ambient temperature may be substantially greater than room temperature. In one example, the first ambient temperature may be closer to an elevated temperature (e.g., roughly 70° C.) or a maximum temperature (e.g., roughly 85° C.) at which the device is expected to operate. In an alternative embodiment, the second ambient temperature may be substantially greater than the first ambient temperature It is worth noting that the exact values, number and order in which the temperatures are applied to calibrate the first LED is somewhat unimportant. However, it is generally desired to obtain the obtain the luminous flux and chromaticity measurements from the first LED and the photocurrent measurements from the photodetector(s) at a sufficient number of different drive current levels, so that the non-linear relationship between these measurements and drive current can be accurately characterized across the operating current level range of the first LED. In one exemplary embodiment, the illumination device may be subjected to two (or more) substantially different ambient temperatures selected from across the operating temperature range of the illumination device.

According to another embodiment, an illumination device is provided herein with a plurality of light emitting diode (LED) chains, which are configured to produce illumination for the illumination device and a photodetector, which is configured for detecting the illumination produced by each of the plurality of LED chains. In general, each LED chain may include one or more LEDs of the same color. In some embodiments, each LED chain may be configured for producing illumination with a different peak emission wavelength. In other embodiments, two or more LED chains may be configured for producing illumination with the same peak emission wavelength.

The illumination device may further comprise an LED driver and receiver circuit, which is configured for successively applying at least three different drive currents to each of the LED chains, one LED chain at a time, to produce illumination at different levels of brightness when the LED chains are subjected to a first ambient temperature, measuring photocurrents induced on the photodetector by the illumination produced by each of the LED chains at each of the at least three different drive currents, and measuring forward voltages that develop across the photodetector before, during or after each induced photocurrent is measured. In addition, the LED driver and receiver circuit is also configured for repeating the steps of successively applying at least three different drive currents to each of the LED chains, measuring photocurrents induced on the photodetector, and measuring forward voltages that develop across the photodetector when the LED chains are subjected to a second ambient temperature, which is different from the first ambient temperature.

The illumination device further may further comprise an interface that is configured for receiving luminous flux and chromaticity measurements, which are measured by an external calibration tool upon receiving the illumination produced by each of the LED chains at each of the at least three different drive currents when the LED chains are subjected to the first and second ambient temperatures. In one embodiment, the interface may be a wireless interface configured to communicate using radio frequency (RF), infrared (IR) light or visible light. For example, the wireless interface may be configured to operate according to at least one of the ZigBee, WiFi, or Bluetooth communication protocols. In another embodiment, the interface may be a wired interface, which is configured to communicate over an AC mains, a dedicated conductor or a set of conductors.

The illumination device may further comprise a storage medium, which is configured for storing the photocurrent, forward voltage, luminous flux, and chromaticity measurements obtained for each of the LED chains within a table of calibration values. In some embodiments, the photocurrent, forward voltage, luminous flux, and chromaticity measurements stored within the storage medium may comprise measured values, which are obtained from the LED driver and receiver circuit and the external calibration tool. In other embodiments, the measured values may be used to calculate calibration coefficients, which are stored within the storage medium in addition to, or in lieu of, the received calibration values.

According to one embodiment, the table of calibration values may include, for each LED chain, a first plurality of photocurrent values obtained from the photodetector upon receiving illumination from the LED chain when the LED chain is subjected to the first ambient temperature and the at least three different drive currents are successively applied to the LED chain, a second plurality of photocurrent values obtained from the photodetector upon receiving illumination from the LED chain when the LED chain is subjected to the second ambient temperature and the at least three different drive currents are successively applied to the LED chain, and a plurality of forward voltage values measured across the photodetector before, during or after each photocurrent value is measured.

In some embodiments, the LED driver and receiver circuit may be further configured for applying a non-operative drive current to each LED chain and for measuring a forward voltage that develops across each LED chain before, during or after each induced photocurrent is measured. In such embodiments, the table of calibration values may include, for each LED chain, a first plurality of forward voltage values measured across the LED chain upon applying the non-operative drive current to the LED chain when the LED chain is subjected to the first ambient temperature, and a second plurality of forward voltage values measured across the LED chain upon applying the non-operative drive current to the LED chain when the LED chain is subjected to the second ambient temperature.

In some embodiments, the table of calibration values may further include, for each LED chain, a first plurality of luminous flux values detected from the LED chain upon applying the at least three different drive currents to the LED chain when the LED chain is subjected to the first ambient temperature, and a second plurality of luminous flux values detected from the LED chain upon applying the at least three different drive currents to the LED chain when the LED chain is subjected to the second ambient temperature.

In some embodiments, the table of calibration values may further include, for each LED chain, a first plurality of x chromaticity values and a first plurality of y chromaticity values, which are detected from the LED chain upon applying the at least three different drive currents to the LED chain when the LED chain is subjected to the first ambient temperature, and a second plurality of x chromaticity values and a second plurality of y chromaticity values, which are detected from the LED chain upon applying the at least three different drive currents to the LED chain when the LED chain is subjected to the second ambient temperature. However, the table of calibration values is not limited to storing chromaticity vales from only the CIE 1931 XYZ color space, and may additionally or alternatively store chromaticity values from any color space that can be used to describe the gamut of an LED illumination device comprising combinations of emission LEDs as described herein.

In some embodiments, the illumination device may comprise an additional photodetector, which is configured for detecting the illumination produced by a subset of the plurality of LED chains. In one example, the subset of LED chains may comprise a chain of phosphor converted LEDs (e.g., a chain of phosphor converted white LEDs) and a chain of reference LEDs (e.g., a chain of blue LEDs).

In such embodiments, the LED driver and receiver circuit may be further configured for measuring photocurrents induced on the additional photodetector by the illumination individually produced by the chain of phosphor converted LEDs and the chain of reference LEDs at each of the at least three different drive currents when the LED chains are subjected to the first and second ambient temperatures, and measuring forward voltages that develop across the additional photodetector before, during or after each induced photocurrent is measured.

In such embodiments, the table of calibration values may further include, for each LED chain within the subset, a first plurality of photocurrent values obtained from the additional photodetector upon receiving illumination from the LED chain when the LED chain is subjected to the first ambient temperature and the at least three different drive currents are successively applied to the LED chain, a second plurality of photocurrent values obtained from the additional photodetector upon receiving illumination from the LED chain when the LED chain is subjected to the second ambient temperature and the at least three different drive currents are successively applied to the LED chain, and a plurality of forward voltage values measured across the additional photodetector before, during, or after each photocurrent value is measured. The induced photocurrents and forward voltages measured across the additional photodetector may be stored within the storage medium as measured values or calculated coefficients.

BRIEF DESCRIPTION OF THE DRAWINGS

Other objects and advantages of the invention will become apparent upon reading the following detailed description and upon reference to the accompanying drawings.

FIG. 7 is a chart illustrating an exemplary table of calibration values that may be obtained in accordance with the calibration method of FIG. 6 and stored within the illumination device;

Figure 1:
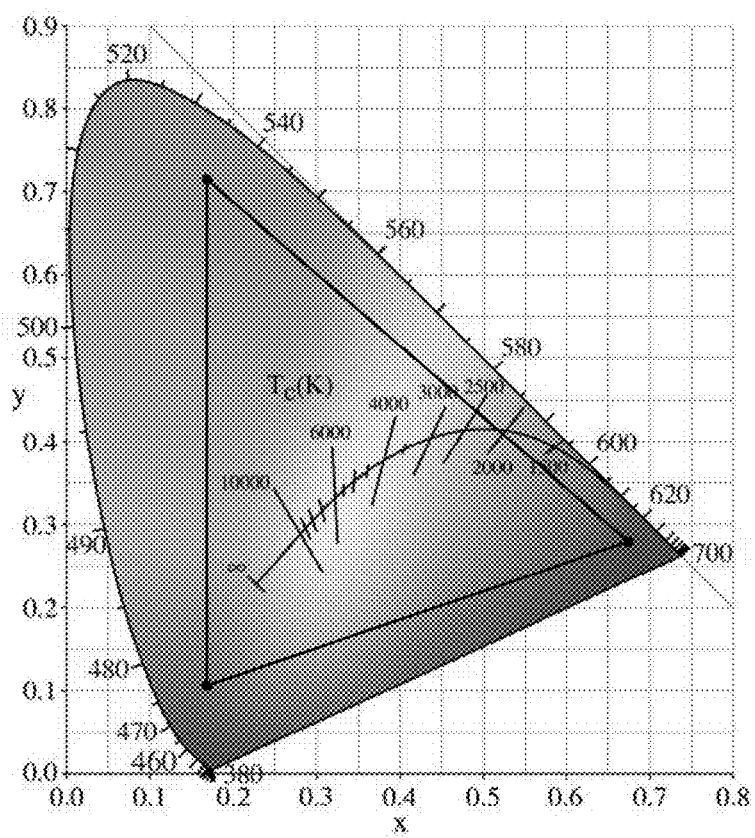
FIG. 1 is a graph of the 1931 CIE chromaticity diagram illustrating the gamut of human color perception and the gamut achievable by an illumination device comprising a plurality of multiple color LEDs (e.g., red, green and blue)

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

An LED generally comprises a chip of semiconducting material doped with impurities to create a p-n junction. As in other diodes, current flows easily from the p-side, or anode, to the n-side, or cathode, but not in the reverse direction. Charge-carriers—electrons and holes—flow into the junction from electrodes with different voltages. When an electron meets a hole, it falls into a lower energy level, and releases energy in the form of a photon (i.e., light). The wavelength of the light emitted by the LED, and thus its color, depends on the band gap energy of the materials forming the p-n junction of the LED.

Red and yellow LEDs are commonly composed of materials (e.g., AlInGaP) having a relatively low band gap energy, and thus produce longer wavelengths of light. For example, most red and yellow LEDs have a peak wavelength in the range of approximately 610-650 nm and approximately 580-600 nm, respectively. On the other hand, green and blue LEDs are commonly composed of materials (e.g., GaN or InGaN) having a larger band gap energy, and thus, produce shorter wavelengths of light. For example, most green and blue LEDs have a peak wavelength in the range of approximately 515-550 nm and approximately 450-490 nm, respectively.

In some cases, a "white" LED may be formed by covering or coating, e.g., a blue LED having a peak emission wavelength of about 450-490 nm with a phosphor (e.g., YAG), which down-converts the photons emitted by the blue LED to a lower energy level, or a longer peak emission wavelength, such as about 525 nm to about 600 nm. In some cases, such an LED may be configured to produce substantially white light having a correlated color temperature (CCT) of about 3000K. However, a skilled artisan would understand how different colors of LEDs and/or different phosphors may be used to produce a "white" LED with a potentially different CCT.

When two or more differently colored LEDs are combined within a single package, the spectral content of the individual LEDs are combined to produce blended light. In some cases, differently colored LEDs may be combined to produce white or near-white light within a wide gamut of color points or CCTs ranging from "warm white" (e.g., roughly 2600K-3000K), to "neutral white" (e.g., 3000K-4000K) to "cool white" (e.g., 4000K-8300K). Examples of white light illumination devices include, but are not limited to, those that combine red, green and blue (RGB) LEDs, red, green, blue and yellow (RGBY) LEDs, white and red (WR) LEDs, and RGBW LEDs.

The present invention is generally directed to illumination devices having a plurality of light emitting diodes (LEDs) and one or more photodetectors. For the sake of simplicity, the term "LED" will be used throughout this disclosure to refer to a single LED, or a chain of serially connected LEDs supplied with the same drive current. According to one embodiment, the present invention provides improved methods for calibrating and compensating individual LEDs within an LED illumination device, so as to accurately maintain a desired luminous flux and a desired chromaticity for the illumination device over changes in drive current, temperature and/or time.

Although not limited to such, the present invention is particularly well suited to illumination devices (i.e., multi-colored illumination devices) in which two or more different colors of LEDs are combined to produce blended white or near-white light, since the output characteristics of differently colored LEDs vary differently over drive current, temperature and time. The present invention is also particularly well suited to illumination devices (i.e., tunable illumination devices) that enable the target dimming level and/or the target chromaticity setting to be changed by adjusting the drive currents supplied to one or more of the LEDs, since changes in drive current inherently affect the lumen output, color and temperature of the illumination device.

Figure 2:
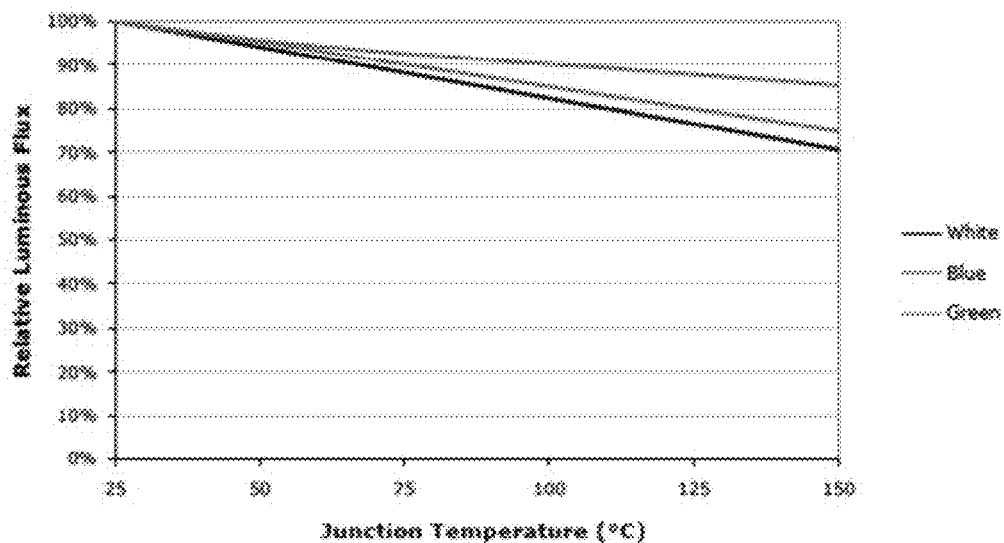
FIG. 2 is a graph illustrating the non-linear relationship between relative luminous flux and junction temperature for white, blue and green LEDs.
Figure 3:
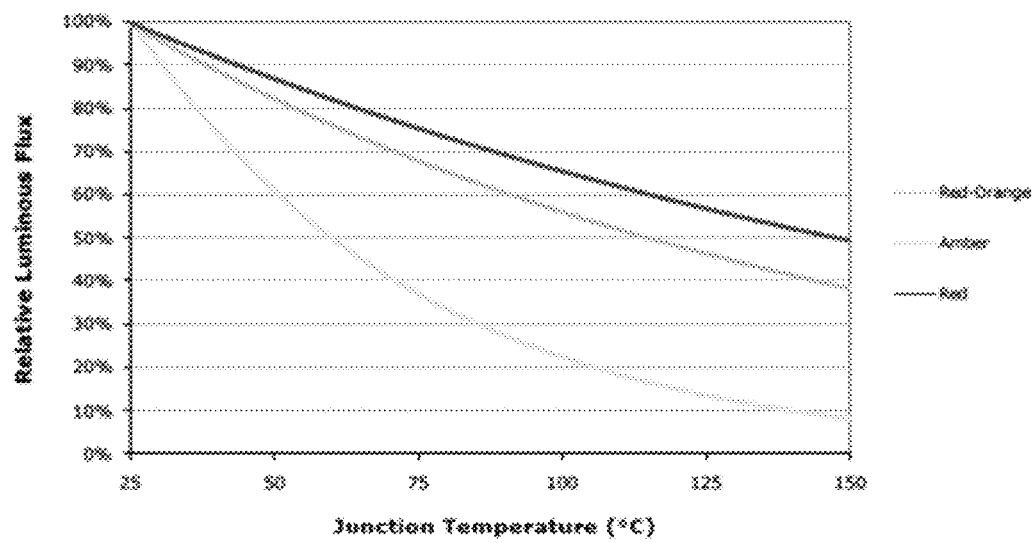
FIG. 3 is a graph illustrating the substantially more non-linear relationship between relative luminous flux and junction temperature for red, red-orange and yellow (amber) LEDs.

FIGS. 2-3 illustrate how the relative luminous flux of an individual LED changes over junction temperature for different colors of LEDs. As shown in FIGS. 2-3, the luminous flux output from all LEDs generally decreases with increasing temperature. For some colors (e.g., white, blue and green), the relationship between luminous flux and junction temperature is relatively linear (see FIG. 2), while for other colors (e.g., red, orange and especially yellow) the relationship is significantly non-linear (see, FIG. 3). The chromaticity of an LED also changes with temperature, due to shifts in the dominant wavelength (for both phosphor converted and non-phosphor converted LEDs) and changes in the phosphor efficiency (for phosphor converted LEDs). In general, the peak emission wavelength of green LEDs tends to decrease with increasing temperature, while the peak emission wavelength of red and blue LEDs tends to increase with increasing temperature. While the change in chromacity is relatively linear with temperature for most colors, red and yellow LEDs tend to exhibit a more significant non-linear change.

As LEDs age, the luminous flux output from both phosphor converted and non-phosphor converted LEDs, and the chromaticity of phosphor converted LEDs, also changes over time. Early on in life, the luminous flux can either increase (get brighter) or decrease (get dimmer), while late in life, the luminous flux generally decreases. As expected, the lumen output decreases faster over time when the LEDs are subjected to higher drive currents and higher temperatures. As a phosphor converted LED ages, the phosphor becomes less efficient and the amount of blue light that passes through the phosphor increases. This decrease in phosphor efficiency causes the overall color produced by the phosphor converted LED to appear "cooler" over time. Although the dominant wavelength and chromaticity of a non-phosphor converted LED does not change over time, the luminous flux decreases as the LED ages, which in effect causes the chromaticity of a multi-colored LED illumination device to change over time.

When differently colored LEDs are combined within a multi-colored illumination device, the color point of the resulting device often changes significantly with variations in temperature and over time. For example, when red, green and blue LEDs are combined within a white light illumination device, the color point of the device may appear increasingly "cooler" as the temperature rises. This is because the luminous flux produced by the red LEDs decreases significantly as temperatures increase, while the luminous flux produced by the green and blue LEDs remains relatively stable (see, FIGS. 2-3).

To account for temperature and aging effects, some prior art illumination devices attempt to maintain a consistent lumen output and/or a consistent chromaticity over temperature and time by measuring characteristics of the emission LEDs and increasing the drive current supplied to one or more of the emission LEDs. For example, some prior art illumination devices measure the temperature of the illumination device (either directly through an ambient temperature sensor or heat sink measurement, or indirectly through a forward voltage measurement), and adjust the drive currents supplied to one or more of the emission LEDs to account for temperature related changes in lumen output. Other prior art illumination devices measure the lumen output from individual emission LEDs, and if the measured value differs from a target value, the drive currents supplied to the emission LED are increased to account for changes in luminous flux that occur over time.

Figure 4:
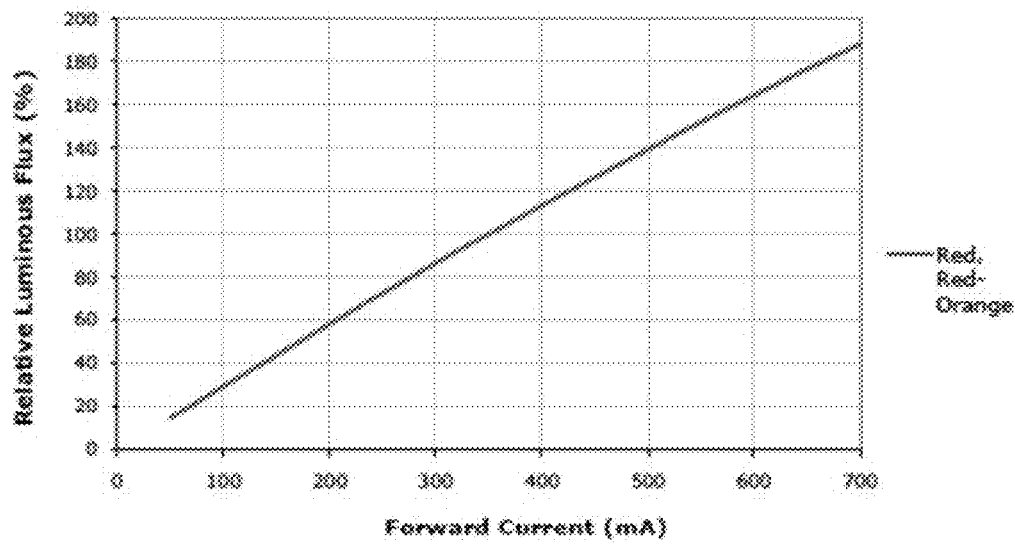
FIG. 4 is a graph illustrating the non-linear relationship between relative luminous flux and drive current for red and red-orange LEDs.
Figure 5:
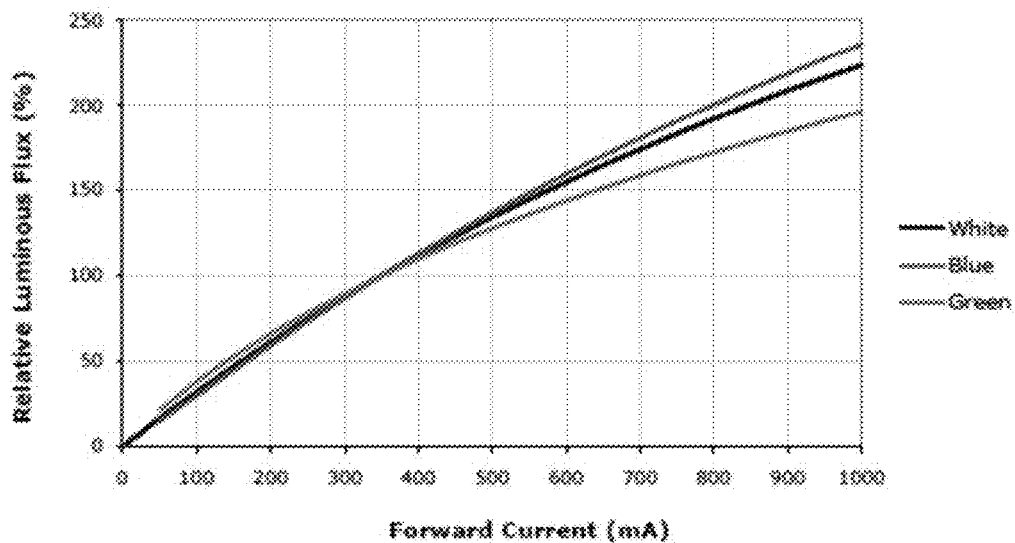
FIG. 5 is a graph illustrating the substantially more non-linear relationship between relative luminous flux and drive current for white, blue and green LEDs.

However, changing the drive currents supplied to the emission LEDs inherently affects the luminous flux and the chromaticity produced by the LED illumination device. FIGS. 4 and 5 illustrate the relationship between luminous flux and drive current for different colors of LEDs (e.g., red, red-orange, white, blue and green LEDs). In general, the luminous flux increases with larger drive currents, and decreases with smaller drive currents. However, the change in luminous flux with drive current is non-linear for all colors of LEDs, and this non-linear relationship is substantially more pronounced for certain colors of LEDs (e.g., blue and green LEDs) than others. The chromaticity of the illumination also changes when drive currents are increased to combat temperature and/or aging effects, since larger drive currents inherently result in higher LED junction temperatures (see, FIGS. 2-3). While the change in chromaticity with drive current/temperature is relatively linear for all colors of LEDs, the rate of change is different for different LED colors and even from part to part.

Although some prior art illumination devices may adjust the drive currents supplied to the emission LEDs, these devices fail to provide accurate temperature and age compensation by failing to account for the non-linear relationship that exists between luminous flux and junction temperature for certain colors of LEDs (FIGS. 2-3), the non-linear relationship that exists between luminous flux and drive current for all colors of LEDs (FIGS. 4-5), and the fact that these relationships differ for different colors of LEDs. These devices also fail to account for the fact that the rate of change in chromaticity with drive current/temperature is different for different colors of LEDs. Without accounting for these behaviors, prior art illumination devices cannot provide accurate temperature and age compensation for all LEDs included within a multi-colored LED illumination device.

A need remains for improved illumination devices and methods for calibrating and compensating individual LEDs included within an illumination device, so as to maintain a desired luminous flux and a desired chromaticity over variations in drive current and temperature and over time, as the LEDs age. This need is particularly relevant to multi-colored LED illumination devices, since different LED colors respond differently over temperature and time, and to illumination devices that provide dimming and/or color tuning capabilities, since changes in drive current inherently affect the lumen output, color and temperature of the illumination device.

In order to meet these needs, improved illumination devices and methods are provided herein to individually calibrate and compensate each LED used in the LED illumination device. The improved calibration and compensation methods described herein overcome the disadvantages of conventional methods, which fail to provide accurate temperature and age compensation for all LEDs included within an LED illumination device.

Figure 6:
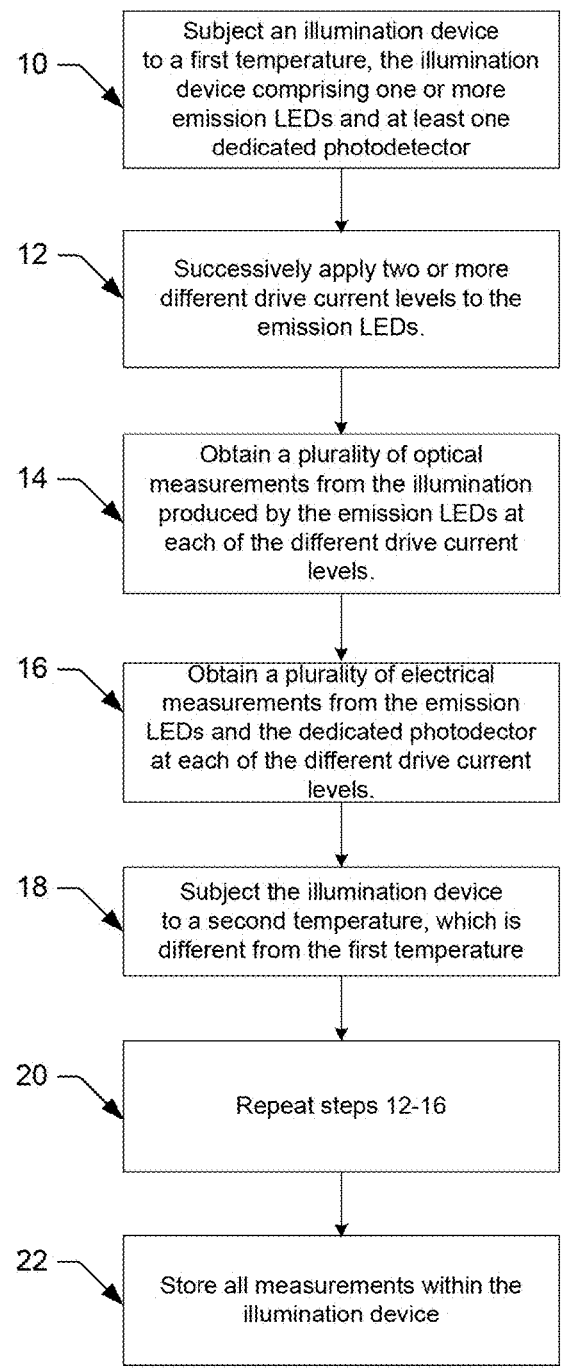
FIG. 6 is a flow chart diagram of an improved method for calibrating an illumination device comprising a plurality of LEDs and one or more photodetectors, in accordance with one embodiment of the invention.

Exemplary Embodiments of Improved Methods for Calibrating an Illumination Device FIG. 6 illustrates one embodiment of an improved method for calibrating an illumination device comprising a plurality of LEDs and at least one dedicated photodetector. In some embodiments, the calibration method shown in FIG. 6 may be used to calibrate an illumination device having LEDs all of the same color. However, the calibration method described herein is particularly well-suited for calibrating an illumination device comprising two or more differently colored LEDs (i.e., a multi-colored LED illumination device), since output characteristics of differently colored LEDs vary differently over drive current, temperature and time. The calibration method described herein is also particularly well-suited for calibrating an illumination device that provides dimming and/or color tuning capabilities (i.e., a tunable LED illumination device), since changes in drive current inherently affect the lumen output, color and temperature of the illumination device.

Exemplary embodiments of an improved illumination device will be described below with reference to FIGS. 16-20, which show different types of LED illumination devices, each having one or more emitter modules. As described below, each emitter module may generally include a plurality of emission LEDs arranged in an array, and at least one dedicated photodetector spaced about a periphery of the array. In one exemplary embodiment, the array of emission LEDs may include red, green, blue and white (or yellow) LEDs, and the at least one dedicated photodetector may include one or more red, orange, yellow and/or green LEDs. However, the present invention is not limited to any particular color, number, combination or arrangement of emission LEDs or photodetectors. A skilled artisan would understand how the method steps described herein may be applied to other LED illumination devices having substantially different emitter modules.

As shown in FIG. 6, the improved calibration method may generally begin by subjecting the illumination device to a first ambient temperature (in step 10). Once subjected to this temperature, a plurality of different drive current levels may be applied to the emission LEDs (in step 12) and a plurality of measurements may be obtained from both the emission LEDs and the dedicated photodetector LED(s) at each of the different drive current levels (in steps 14 and 16). Specifically, two or more different drive current levels may be successively applied to each emission LED, one LED at a time, for the purpose of obtaining measurements from the illumination device. These measurements may generally include optical measurements and electrical measurements.

For example, a plurality of optical measurements may be obtained from the illumination produced by each emission LED at each of the different drive current levels (in step 14). According to one embodiment, the optical measurements may include a plurality of luminous flux, x chromaticity and y chromaticity measurements, which are obtained for each emission LED at two or more different drive current levels. However, the optical measurements described herein are not limited to luminous flux, x chromaticity and y chromaticity, and may include additional or alternative optical measurements in other embodiments of the invention.

In general, the chromaticity calibration values described herein may correspond to the CIE 1931 XYZ color space, the CIE 1931 RGB color space, the CIE 1976 LUV color space, and various other RGB color spaces (e.g., sRGB, Adobe RGB, etc.). Although the calibration and compensation methods described herein acquire and utilize only x and y chromaticity calibration values, one skilled in the art would understand how chromaticity values from other color spaces could be alternatively acquired and used in the methods described herein. As such, the calibration and compensation methods described herein and recited in the claims are considered to encompass chromaticity calibration values from any color space that can be used to describe the gamut of an LED illumination device comprising substantially any combination of emission LEDs as described herein.

In one preferred embodiment, three luminous flux (Luma) measurements, three x chromaticity (x chrom) measurements, and three y chromaticity (y chrom) measurements are measured from each emission LED at roughly a maximum drive current level (typically about 500 mA, depending on LED part number and manufacturer), roughly 30% of the maximum drive current, and roughly 10% of the maximum drive current, as shown in FIG. 7 and discussed below. In some embodiments, the luminous flux and x, y chromaticity measurements may be obtained from the emission LEDs using an external calibration tool, such as a spectrophotometer. In some embodiments, the measurement values obtained from the external calibration tool may be transmitted wirelessly to the illumination device, as described in more detail below with respect to FIG. 19.

Figure 19:
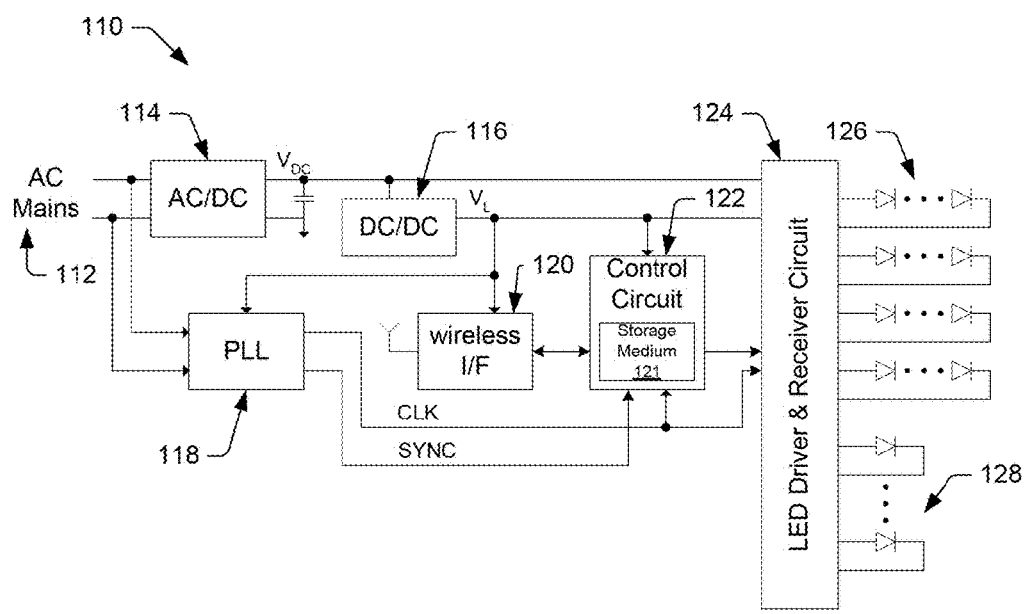
FIG. 19 is an exemplary block diagram of circuit components that may be included within an illumination device, according to one embodiment of the invention.
Figure 20:
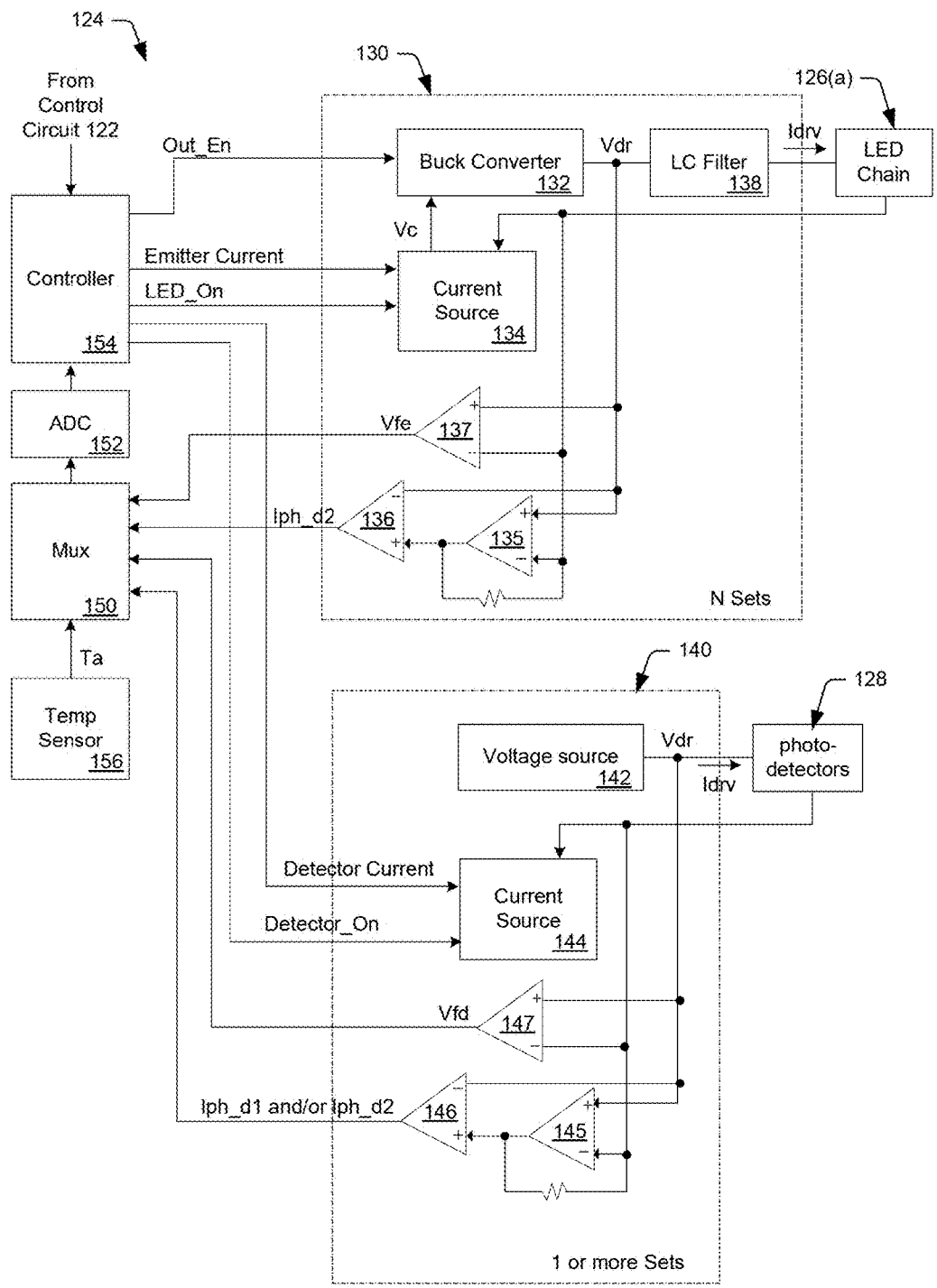
FIG. 20 is an exemplary block diagram of an LED driver and receiver circuit that may be included within the illumination device of FIG. 19, according to one embodiment of the invention.

In addition, a plurality of electrical measurements may be obtained from each of the emission LEDs and each of the dedicated photodetector(s) at each of the different drive current levels (in step 16). These electrical measurements may include, but are not limited to, photocurrents induced on the dedicated photodetector(s) and forward voltages measured across the dedicated photodetector(s) and/or the emission LEDs. Unlike the optical measurements described above, the electrical measurements may be obtained from the dedicated photodetector(s) and the emission LEDs using the LED driver and receiver circuit included within the illumination device. An exemplary embodiment of such a circuit is shown in FIGS. 19-20 and described in more detail below.

At each of the different drive currents levels, the LED driver and receiver circuit measures the photocurrents that are induced on the dedicated photodetector by the illumination individually produced by each emission LED. In one preferred embodiment, three photocurrent (Iph_d1) measurements may be obtained from the dedicated photodetector for each emission LED when the emission LEDs are successively driven to produce illumination at three different drive current levels (e.g., 100%, 30% and 10% of a max drive level). In some embodiments, the LED driver and receiver circuit may obtain the photocurrent (Iph_d1) measurements at substantially the same time the external calibration tool is measuring the luminous flux and x and y chromaticity of the illumination produced by the emission LEDs at each of the different drive current levels.

In general, the drive currents applied to the emission LEDs to measure luminous flux, chromaticity and induced photocurrent may be operative drive current levels (e.g., about 20 mA to about 500 mA). In some cases, increasingly greater drive current levels may be successively applied to each of the emission LEDs to obtain the measurements described herein. In other cases, the measurements may be obtained upon successively applying decreasing levels of drive current to the emission LEDs. The order in which the drive current levels are applied is largely unimportant, only that the drive currents be different from one another.

Although examples are provided herein, the present invention is not limited to any particular value or any particular number of drive current levels, and may apply substantially any value and any number of drive current levels to an emission LED within the operating current level range of that LED. However, it is generally desired to obtain the luminous flux and chromaticity measurements from the emission LEDs and the photocurrent measurements from the photodetector at a sufficient number of different drive current levels, so that the non-linear relationship between these measurements and drive current can be accurately characterized across the operating current level range of the LED.

While increasing the number of measurements does improve the accuracy with which the non-linear relationships are characterized, it also increases the calibration time and costs. While the increase in calibration time and cost may not be warranted in all cases, it may be beneficial in some. For example, additional luminous flux measurements may be beneficial when attempting to characterize the luminous flux vs. drive current relationship for certain colors of LEDs (e.g., blue and green LEDs), which tend to exhibit a significantly more non-linear relationship than other colors of LEDs (see, FIGS. 4-5). Thus, a balance should be struck between accuracy and calibration time/costs when selecting a desired number of drive current levels with which to obtain measurements for a particular color of LED.

Since increasing drive currents affect the junction temperature of the emission LEDs, a forward voltage may be measured across each emission LED and each photodetector immediately after each operative drive current level is supplied to the emission LEDs (in step 16). For each operative drive current level, the forward voltages can be measured across each emission LED and each photodetector before or after the photocurrent measurements for that operative drive current level are obtained. Unlike the optical measurements, however, relatively small drive currents are applied to the emission LEDs and the dedicated photodetector(s) to measure the forward voltages developed there across.

In one preferred embodiment, three forward voltage (Vfe) measurements may be obtained from each emission LED and three forward voltage (Vfd1) measurements may be obtained from each dedicated photodetector (in step 16) immediately after each of the different drive current levels (e.g., 100%, 30% and 10% of a max drive level) is applied to the emission LEDs to measure the luminous flux, x chromaticity and y chromaticity. The forward voltage (Vfe and Vfd1) measurements can be obtained before or after the induced photocurrents (Iph_d1) are measured at each of the different drive current levels. By measuring the forward voltage (Vfe) across each emission LED and the forward voltage (Vfd1) across each dedicated photodetector immediately after each operative drive current level is applied to the emission LEDs, the Vfe and Vfd1 measurements may be used to provide a good indication of how the junction temperature of the emission LEDs and the dedicated photodetector change with changes in drive current.

When taking forward voltage measurements, a relatively small drive current is supplied to each of the emission LEDs and each of the dedicated photodetector LEDs, one LED at a time, so that a forward voltage (Vfe or Vfd1) developed across the anode and cathode of the individual LEDs can be measured (in step 16). When taking these measurements, all other emission LEDs in the illumination device are preferably turned "off" to avoid inaccurate forward voltage measurements (since light from other emission LEDs would induce additional photocurrents in the LED being measured).

As used herein, a "relatively small drive current" may be broadly defined as a non-operative drive current, or a drive current level which is insufficient to produce significant illumination from the LED. Most LED device manufacturers, which use forward voltage measurements to compensate for temperature variations, supply a relatively large drive current to the LEDs (e.g., an operative drive current level sufficient to produce illumination from the LEDs) when taking forward voltage measurements. Unfortunately, forward voltages measured at operative drive current levels tend to vary significantly over the lifetime of an LED. As an LED ages, the parasitic resistance within the junction increases, which in turn, causes the forward voltage measured at operating current levels to increase over time, regardless of temperature. For this reason, a relatively small (i.e., non-operative) drive current is used herein when obtaining forward voltage measurements to limit the resistive portion of the forward voltage drop.

For some common types of emission LEDs with one square millimeter of junction area, the optimum drive current used herein to obtain forward voltage measurements from the emission LEDs may be roughly 0.1-10 mA, and more preferably may be about 0.3-3 mA. In one embodiment, the optimum drive current level may be about 1 mA for obtaining forward voltage measurements from the emission LEDs. However, smaller/larger LEDs may use proportionally less/more current to keep the current density roughly the same. In the embodiments that use a significantly smaller LED as the dedicated photodetector, the optimum drive current level for obtaining forward voltage measurements from a single photodetector may range between about 100 µA to about 300 µA. In one embodiment, the optimum drive current level used for obtaining forward voltage measurements from a plurality of dedicated photodetectors connected in parallel may be about 1 mA. The relatively small, non-operative drive currents used to obtain forward voltage measurements from the emission LEDs (e.g., about 0.3 mA to about 3 mA) and the relatively small, non-operative drive currents used to obtain forward voltage measurements from a dedicated photodetector (e.g., about 100 µA to about 300 µA) are substantially smaller than the operative drive current levels (e.g., about 20 mA to about 500 mA) used in steps 14 and 16 to measure luminous flux, chromaticity and induced photocurrent.

After the measurements described in steps 14-16 are obtained at the first temperature, the illumination device is subjected to a second ambient temperature, which is substantially different from the first ambient temperature (in step 18). Once subjected to this second temperature, steps 12-16 are repeated (in step 20) to obtain an additional plurality of optical measurements from each of the emission LEDs (in step 14), and an additional plurality of electrical measurements from the emission LEDs and the dedicated photodetector (in step 16). The additional measurements may be obtained at the second ambient temperature in the same manner described above for the first ambient temperature.

In one embodiment, the second ambient temperature may be substantially less than the first ambient temperature. For example, the second ambient temperature may be approximately equal to room temperature (e.g., roughly 25° C.), and the first ambient temperature may be substantially greater than room temperature. In one example, the first ambient temperature may be closer to an elevated temperature (e.g., roughly 70° C.) or a maximum temperature (e.g., roughly 85° C.) at which the device is expected to operate. In an alternative embodiment, the second ambient temperature may be substantially greater than the first ambient temperature.

It is worth noting that the exact values, number and order in which the temperatures are applied to calibrate the individual LEDs is somewhat unimportant. However, it is generally desired to obtain the luminous flux, x and y chromaticity, and photocurrent calibration values at a number of different temperatures, so that the non-linear relationships between these measurements and drive current can be accurately characterized across the operating temperature range of each LED. In one preferred embodiment, the illumination device may be subjected to two substantially different ambient temperatures, which are selected from across the operating temperature range of the illumination device. While it is possible to obtain the measurements described herein at three (or more) temperatures, doing so may add significant expense, complexity and/or time to the calibration process. For this reason, it is generally preferred that the emission LEDs and the dedicated photodetector(s) be calibrated at only two different temperatures (e.g., about 25° C. and about 70° C.).

In some embodiments, the illumination device may be subjected to the first and second ambient temperatures by artificially generating the temperatures during the calibration process. However, it is generally preferred that the first and second ambient temperatures are ones which occur naturally during production of the illumination device, as this simplifies the calibration process and significantly decreases the costs associated therewith. In one embodiment, the measurements obtained at the elevated temperature may be taken after burn-in of the LEDs when the illumination device is relatively hot (e.g., roughly 50° C. to 85° C.), and sometime thereafter (e.g., at the end of the manufacturing line), a room temperature calibration may be performed to obtain measurements when the illumination device is relatively cool (e.g., roughly 20° C. to 30° C.).

Once the calibration measurements are obtained, the calibration values may be stored within the illumination device (in step 22), so that the stored values can be later used to compensate the illumination device for changes in luminous flux and/or chromaticity that may occur over variations in drive current, temperature and time. In one embodiment, the calibration values may be stored within a table of calibration values as shown, for example, in FIG. 7. The table of calibration values may be stored within a storage medium of the illumination device, as discussed below with reference to FIG. 19.

FIG. 7 illustrates one embodiment of a calibration table that may be generated in accordance with the calibration method shown in FIG. 6. In the illustrated embodiment, the calibration table includes six luminous flux measurements (Luma), six x chromaticity measurements (x chrom), and six y chromaticity measurements (y chrom), which were obtained from each emission LED (e.g., white, blue, green and red emission LEDs) at the three different drive currents (e.g., 10%, 30% and 100% of a max drive current) and the two different temperatures (T0, T1) in steps 10, 12, 14, 18, 20 and 22 of the calibration method. The calibration table shown in FIG. 7 also includes six photocurrent measurements (Iph_d1) that were induced on the photodetector by the illumination produced by each of the emission LEDs at the three different drive currents levels and the two different temperatures in steps 10, 12, 16, 20 and 22 of the calibration method.

For each emission LED (e.g., each white, blue, green and red emission LED) and each ambient temperature (T0, T1), the calibration table shown in FIG. 7 also includes the forward voltage (Vfe) that was measured across the emission LED and the forward voltage (Vfd1) that was measured across the dedicated photodetector immediately after each of the three different drive currents levels is supplied to the emission LEDs. In this example embodiment, steps 10, 12, 16, 18, 20 and 22 of the calibration method result in six Vfe measurements and six Vfd1 measurements being stored for each emission LED, as shown in FIG. 7.

The calibration table shown in FIG. 7 represents only one example of the calibration values that may be stored within an LED illumination device, in accordance with the calibration method described herein. In some embodiments, the calibration method shown in FIG. 6 may be used to store substantially different calibration values, or substantially different numbers of calibration values, within the calibration table of the LED illumination device.

As noted above, the present invention is not limited to the exemplary number of drive current levels and values of drive current shown in FIGS. 6 and 7. It is certainly possible to obtain a greater/lesser number of optical and electrical measurements from the emission LEDs and the at least one dedicated photodetector by applying a greater/lesser number of drive current levels to the emission LEDs. It is also possible to use substantially different values of drive current, other than the 10%, 30% and 100% of the max drive current illustrated in FIG. 7.

It is also possible to obtain and store a different number of forward voltage (Vfe) measurements from the emission LEDs, or a different number of forward voltage (Vfd1) measurements from the at least one dedicated photodetector. For example, the calibration table shown in the embodiment of FIG. 7 stores six forward voltage (Vfe) measurements from each emission LED and six*n forward voltage (Vfd1) measurements from each dedicated photodetector, where 'n' is the number of emission LEDs included within the illumination device. As noted above, the six Vfe measurements and six*n Vfd measurements are preferably obtained at two different ambient temperatures (T0, T1) immediately after each operative drive current level (e.g., 10%, 30% and 100% of a max drive current) is applied to each emission LED. Such an embodiment is generally preferred, as it provides a good indication of how the emitter and detector junction temperatures change with changes in ambient temperature and changes in drive current. In addition, such an embodiment enables the compensation method shown in FIG. 13 (and described below) to compensate for emitter aging when only detector forward voltages (Vfd1) are measured during operation of the device.

As shown in FIGS. 6-7 and described above, the calibration method may obtain only one Vfe and only one Vfd1 measurement for each emission LED at a given temperature (e.g., T0) and a given drive current (e.g., 10% of the max drive current). In one alternative embodiment, the calibration method of FIG. 6 may obtain a plurality of Vfe and a plurality of Vfd1 measurements for each emission LED at a given temperature (e.g., T0) and a given drive current (e.g., 10% of the max drive current). The plurality of Vfe and Vfd1 measurements may be obtained over a short period of time (e.g., 100 msec), and the plurality of Vfe measurements and the plurality of Vfd1 measurements obtained during each time period may be averaged and filtered before they are stored within the calibration table of FIG. 7.

In another alternative embodiment, the calibration method of FIG. 6 may obtain only two forward voltage (Vfe) measurements from each emission LED, one for each of the two different temperatures (T0, T1), as described in commonly assigned U.S. patent application Ser. Nos. 13/970,944, 13/970,964 and 13/970,990. Likewise, only two*n forward voltage (Vfd1) measurements may be obtained from the dedicated photodetector, where 'n' is the number of emission LEDs included within the illumination device. In this embodiment, however, the forward voltage (Vfe and Vfd1) measurements stored in the calibration table would only provide an indication of how the emitter and detector junction temperatures change with changes in ambient temperature, not with drive current induced temperature changes.

In another alternative embodiment of the invention, the calibration method shown in FIG. 6 may omit the emitter forward voltage (Vfe) measurements altogether, and rely solely on the photodetector forward voltage (Vfd1) measurements to provide an indication of temperature. However, the Vfe measurements may only be omitted if the temperature difference between the emission LEDs and the dedicated photodetector(s) remains relatively the same over the operating temperature range. To maintain a consistent temperature difference between the emission LEDs and the photodetector(s), an improved emitter module is provided herein and described below with reference to FIG. 18A.

In yet another alternative embodiment of the invention, the calibration method shown in FIG. 6 may be used to obtain additional measurements, which may be later used to compensate for phosphor aging, and thereby, control the chromaticity of a phosphor converted white LED over time.

As noted above, some embodiments of the invention may include a phosphor converted white emission LED within the emitter module. These LEDs may be formed by coating or covering, e.g., a blue LED having a peak emission wavelength of about 400-500 with a phosphor material (e.g., YAG) to produce substantially white light with a CCT of about 3000K. Other combinations of LEDs and phosphors may be used to form a phosphor converted LED, which is capable of producing white or near-white light with a CCT in the range of about 2700K to about 10,000 k.

Figure 21:
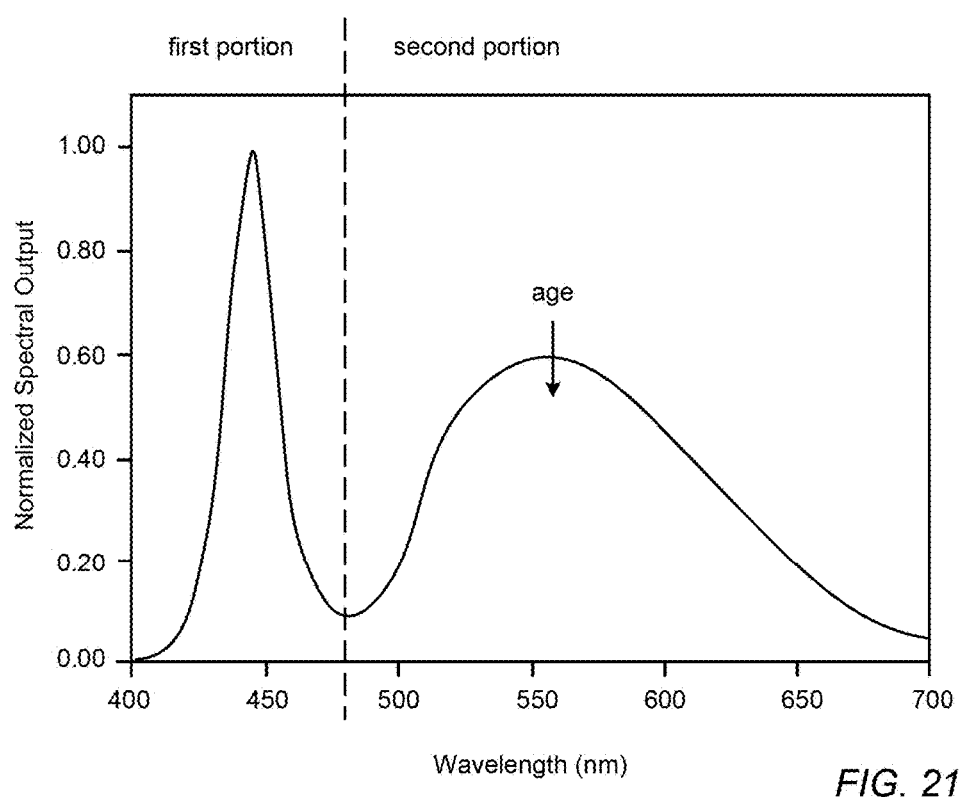
FIG. 21 is an exemplary graph depicting how the spectrum of a phosphor converted LED may be divided into two portions, and showing how the phosphor efficiency decreases as the phosphor ages.

In phosphor converted LEDs, the spectral content of the LED combines with the spectral content of the phosphor to produce white or near-white light. As shown in FIG. 21, the combined spectrum may include a first portion having a first peak emission wavelength (e.g., about 400-500), and a second portion having a second peak emission wavelength (e.g., about 500-650), which is substantially different from the first peak emission wavelength. In this example, the first portion of the spectrum is generated by the light emitted by the blue LED, and the second portion is generated by the light that passes through the phosphor (e.g., YAG).

As the phosphor converted LED ages, the efficiency of the phosphor decreases, which causes the chromaticity of the phosphor converted LED to appear "cooler" over time. In order to account for age-related chromaticity shifts in a phosphor converted LED, it may be desirable in some embodiments of the calibration method shown in FIG. 6 to measure the photocurrents induced by the LED portion and the photocurrents induced by the phosphor portion of the phosphor converted LED separately. Thus, some embodiments of the invention may use two different colors of photodetectors to measure photocurrents, which are separately induced by different portions of the phosphor converted LED spectrum. In particular, an emitter module of the illumination device may include a first photodetector whose detection range is configured for detecting only the first portion of the spectrum emitted by the phosphor converted LED, and a second photodetector whose detection range is configured for detecting only the second portion of the spectrum emitted by the phosphor converted LED.

In general, the detection range of the first and second photodetectors may be selected based on the spectrum of the phosphor converted LED being measured. In the exemplary embodiment described above, in which a phosphor converted white emission LED is included within the emitter module and implemented as described above, the detection range of the first photodetector may range between about 400 nm and about 500 nm for measuring the photocurrents induced by light emitted by the blue LED portion, and the detection range of the second photodetector may range between about 500 nm and about 650 nm for measuring the photocurrents induced by light that passes through the phosphor portion of the phosphor converted white LED. The first and second photodetectors may include dedicated photodetectors and/or emission LEDs, which are sometimes configured for detecting incident light.

As noted above, the emitter module of the illumination device preferably includes at least one dedicated photodetector. In one embodiment, the emitter module may include two different colors of dedicated photodetectors, such as one or more dedicated green photodetectors and one or more dedicated red photodetectors (see, e.g., FIG. 17B). In another embodiment, the emitter module may include only one dedicated photodetector, such as a single red, orange or yellow photodetector (see, e.g., FIG. 16B). In such an embodiment, one of the emission LEDs (e.g., the green emission LED) may be configured, at times, as a photodetector for measuring a portion of the phosphor converted LED spectrum.

In the calibration method described above and shown in FIG. 6, the at least one dedicated photodetector may be used in step 16 to measure the photocurrents (Iph_d1), which are induced in the dedicated photodetector by the illumination produced by each of the emission LEDs when the emission LEDs are successively driven to produce illumination at the plurality of different drive current levels (e.g., 100%, 30% and 10% of a max drive level) and the plurality of different temperatures (e.g., T0 and T1). Sometime before or after each of the photocurrent measurements (Iph_d1) is obtained from the dedicated photodetector, a forward voltage (Vfd1) is measured across the dedicated photodetector to provide an indication of the detector junction temperature at each of the calibrated drive current levels.

In some embodiments of the calibration method shown in FIG. 6, the dedicated photodetector used to obtain the photocurrent (Iph_d1) and forward voltage (Vfd1) measurements may be, e.g., a red LED. When calibrating a phosphor converted white LED, the dedicated red photodetector may be used to measure the photocurrent (Iph_d1) induced by the light that passes through the phosphor (i.e., the "second portion" of the spectrum shown in FIG. 21). In some embodiments, another dedicated photodetector (or one of the emission LEDs) may be used to measure the photocurrent (Iph_d2), which is induced by the light emitted by the LED portion (i.e., the "first portion" of the spectrum shown in FIG. 21) of the phosphor converted white LED. This photodetector may be, for example, a dedicated green photodetector or one of the green emission LEDs.

As shown in FIG. 7, the additional photodetector may be used in step 16 of the calibration method shown in FIG. 6 to measure the photocurrents (Iph_d2), which are induced in the additional photodetector by the illumination produced by the LED portion of the phosphor converted white LED when that LED is successively driven to produce illumination at a plurality of different drive current levels (e.g., 100%, 30% and 10% of a max drive level) and a plurality of different temperatures (e.g., T0 and T1). In addition to measuring the photocurrents induced by the LED portion of the phosphor converted white LED, the photocurrents (Iph_d2) induced by the illumination produced by the blue emission LED may also be obtained from the additional photodetector in step 16 and used as a reference in the compensation method of FIG. 13. Before or after each of the photocurrent measurements (Iph_d2) is obtained from the additional photodetector, a forward voltage (Vfd2) is measured across the additional photodetector to provide an indication of the detector junction temperature at each of the calibrated drive current levels.

In addition to storing separate photocurrent measurements (Iph_d2 and Iph_d1) for the phosphor converted white LED, the calibration table may also store separate luminous flux (Luma), x chromaticity (x chrom) and y chromaticity (y chrom) measurements for the LED portion and the phosphor portion of the phosphor converted white LED spectrum at each of the calibrated drive currents and temperatures. While this is not explicitly shown in FIG. 7, measuring the luminous flux (Luma), x chromaticity (x chrom) and y chromaticity (y chrom) attributed to each portion of the phosphor converted white LED spectrum, and storing these values within the calibration table, the stored calibration values may be later used during one or more of the compensation methods described herein to control the luminous flux and chromaticity of the LED portion and the phosphor portion of the phosphor converted white LED, separately, as if the LED were two different LEDs.

Exemplary methods for calibrating an illumination device comprising a plurality of emission LEDs and one or more photodetectors has now been described with reference to FIGS. 6-7. Although the method steps shown in FIG. 6 are described as occurring in a particular order, one or more of the steps of the illustrated method may be performed in a substantially different order. In one alternative embodiment, for example, the plurality of electrical measurements (e.g., Iph, Vfd and Vfe) may be obtained from the one or more photodetector(s) and emission LEDs in step 16 before the plurality of optical measurements (e.g., Luma, x chrom, y chrom) are obtained from the emission LEDs in step 14. In another alternative embodiment, the external calibration tool may obtain the optical measurements (in step 14) at substantially the same time as the LED driver and receiver circuit is obtaining the electrical measurements (in step 16). While the calibration method shown in FIG. 6 stores the calibration values within the illumination device at the end of the calibration method (e.g., in step 22), a skilled artisan would recognize that these values may be stored at substantially any time during the calibration process without departing from the scope of the invention. The calibration method described herein is considered to encompass all such variations and alternative embodiments.

The calibration method provided herein improves upon conventional calibration methods in a number of ways. First, the method described herein calibrates each emission LED (or chain of LEDs) individually, while turning off all other emission LEDs not currently under test. This not only improves the accuracy of the stored calibration values, but also enables the stored calibration values to account for process variations between individual LEDs, as well as differences in output characteristics that inherently occur between different colors of LEDs.

Accuracy is further improved herein by supplying a relatively small (i.e., non-operative) drive current to the emission LEDs and the photodetector(s) when obtaining forward voltage measurements, as opposed to the operative drive current levels typically used in conventional calibration methods. By using non-operative drive currents to obtain the forward voltage measurements, the present invention avoids inaccurate compensation by ensuring that the forward voltage measurements for a given temperature and fixed drive current do not change significantly over time (due to parasitic resistances in the junction when operative drive currents are used to obtain forward voltage measurements).

As another advantage, the calibration method described herein obtains a plurality of optical measurements from each emission LED and a plurality of electrical measurements from each photodetector at a plurality of different drive current levels and a plurality of different temperatures. This further improves calibration accuracy by enabling the non-linear relationship between luminous flux and drive current and the non-linear relationship between photocurrent and drive current to be precisely characterized for each individual LED. Furthermore, obtaining the calibration values at a number of different ambient temperatures improves compensation accuracy by enabling the compensation methods (described below) to interpolate between the stored calibration values, so that accurate compensation values may be determined for current operating temperatures.

As yet another advantage, the calibration method described herein may use different colors of photodetectors to measure photocurrents, which are induced by different portions (e.g., an LED portion and a phosphor portion) of a phosphor converted LED spectrum. The different colors of photodetectors may also be used to measure the photocurrent, which is induced by a reference emission LED, whose peak emission wavelength falls within the LED portion of the spectrum emitted by the phosphor converted LED. By storing these calibration values within the illumination device, the calibration values may be later used to detect and account for chromaticity shifts that may occur in a phosphor converted LED over time.

As described in more detail below, the calibration values stored within the calibration table can be used in one or more compensation methods described herein to adjust the individual drive currents supplied to the emission LEDs, so as to obtain a desired luminous flux and a desired chromaticity over changes in drive current, changes in temperature and over time, as the LEDs age. For example, the luminous flux (Luma) measurements may be used in some embodiments to maintain a consistent lumen output and chromaticity over changes in temperature. In other embodiments, the luminous flux (Luma) measurements may be used along with the chromaticity (e.g., x chrom, y chrom) measurements to obtain a new target lumen output or a new target chromaticity when the dimming level or color point setting for the illumination device is changed. Regardless of the particular luminous flux or chromaticity setting used, the photocurrent (Iph) measurements may be used to adjust the individual drive currents supplied to the emission LEDs to account for LED aging effects. While the most accurate results may be obtained by utilizing all such measurements when compensating an LED illumination device, one skilled in the art would understand how one or more of the calibration values described herein may be used to improve upon the compensation methods performed by prior art illumination devices.

Exemplary Embodiments of Improved Methods for Controlling an Illumination Device FIGS. 8-15 illustrate exemplary embodiments of improved methods for controlling an illumination device that generally includes a plurality of emission LEDs and at least one dedicated photodetector. More specifically, FIGS. 8-15 illustrate exemplary embodiments of improved compensation methods that may be used to adjust the drive currents supplied to individual LEDs of an LED illumination device, so as to obtain a desired luminous flux and a desired chromaticity over changes in drive current, changes in temperature and over time, as the LEDs age.

In some embodiments, the compensation methods shown in FIGS. 8-15 may be used to control an illumination device having LEDs all of the same color. However, the compensation methods described herein are particularly well-suited for controlling an illumination device comprising two or more differently colored LEDs (i.e., a multi-colored LED illumination device), since output characteristics of differently colored LEDs vary differently over drive current, temperature and time. The compensation methods described herein are also particularly well-suited for controlling an illumination device that provides dimming and/or color tuning capabilities (i.e., a tunable LED illumination device), since changes in drive current inherently affect the lumen output, color and temperature of the illumination device.

Exemplary embodiments of an illumination device will be described below with reference to FIGS. 16-20, which show different types of LED illumination devices, each having one or more emitter modules. As shown in FIGS. 16B, 17B, 18A and 18B, each emitter module may generally include a plurality of emission LEDs arranged in an array, and one or more photodetectors spaced about a periphery of the array. In one exemplary embodiment, the array of emission LEDs may include red, green, blue and white (or yellow) LEDs, and the one or more photodetectors may include one or more red, orange, yellow and/or green LEDs. However, the present invention is not limited to any particular color, number, combination or arrangement of emission LEDs and photodetectors. A skilled artisan would understand how the method steps described herein may be applied to other LED illumination devices having substantially different emitter modules.

Figure 8:
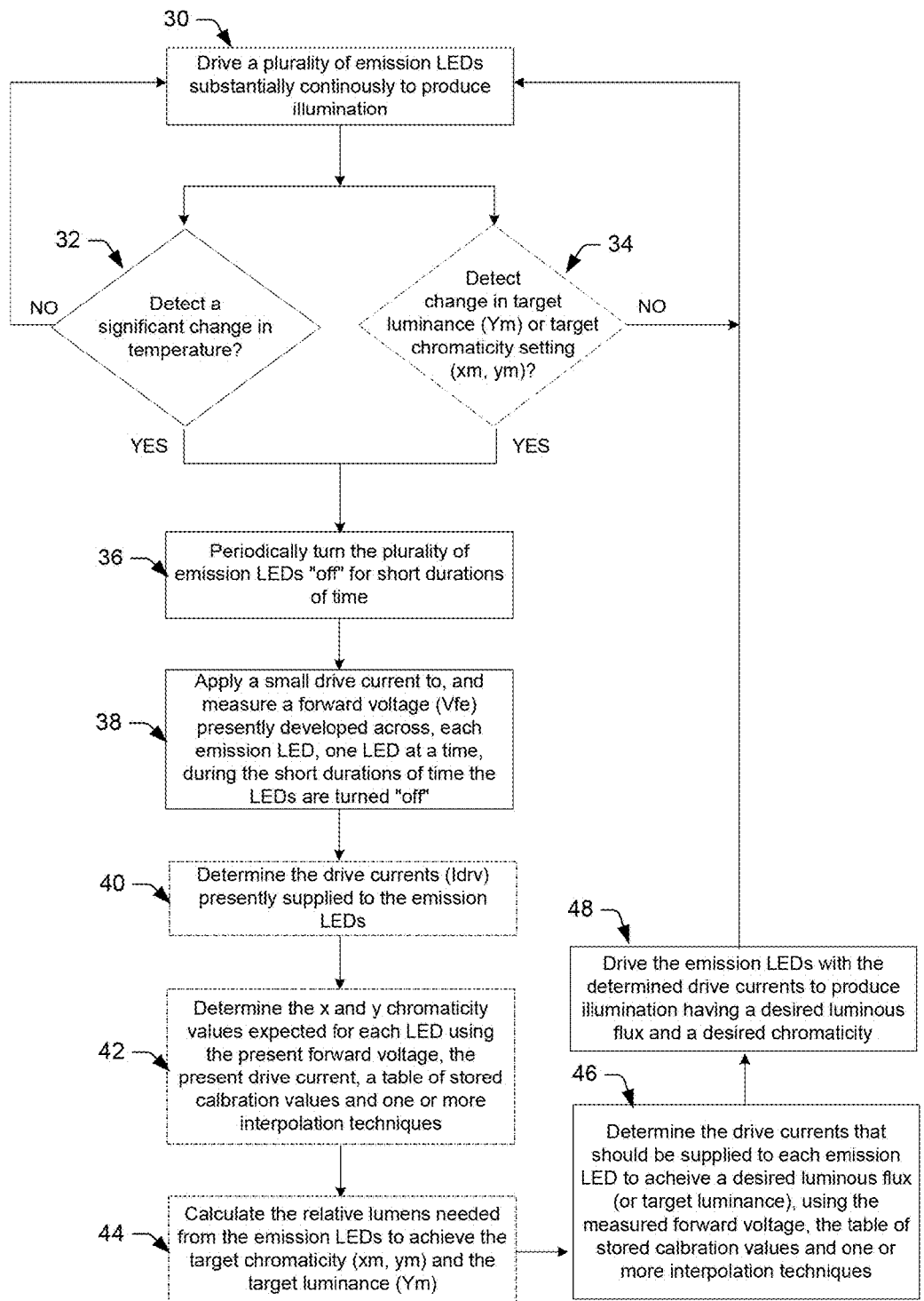
FIG. 8 is a flowchart diagram of an improved compensation method, in accordance with one embodiment of the invention.

According to one embodiment, FIG. 8 illustrates an exemplary compensation method that may be used to adjust the drive currents supplied to individual LEDs of an LED illumination device, so as to maintain a desired luminous flux and a desired chromaticity over changes in temperature. The compensation method steps shown in solid outline in FIG. 8 are similar to the compensation method steps described in FIG. 5 of commonly assigned U.S. patent application Ser. Nos. 13/970,944, 13/970,964 and 13/970,990, which provided improved illumination devices and temperature compensation methods.

However, the previously filed applications failed to disclose methods for controlling an illumination device, so as to maintain a desired luminous flux and a desired chromaticity over time, or to obtain a new luminous flux or a new chromaticity when the dimming level or the color point setting is changed for the illumination device. The optional method steps shown in dashed outline in FIG. 8 improve upon the compensation method described in the previously filed applications by enabling the luminous flux and chromaticity to be precisely controlled over a range of dimming levels and a range of color point settings. The compensation method shown in FIG. 13, and discussed below, further improves upon the compensation method described in the previously filed applications by providing a method for maintaining a desired luminous flux and a desired chromaticity over time, as the LEDs age. The compensation methods shown in FIGS. 8 and 13 may be used alone, or together to provide accurate compensation for all LEDs used in the illumination device over changes in drive current, temperature and time.

As shown in FIG. 8, the improved compensation method may generally begin by driving the plurality of emission LEDs substantially continuously to produce illumination (in step 30). When the illumination device is first turned "on," the ambient temperature surrounding the LEDs steadily increases over time, until the temperature stabilizes. In some embodiments, the compensation method may be performed soon after the illumination device is turned "on," and may be repeated a number of times until the temperature surrounding the LEDs stabilizes. However, since changes in drive current and other factors affect the ambient temperature surrounding the LEDs, the compensation method shown in FIG. 8 may be performed at other times during operation of the illumination device.

In one preferred embodiment, the compensation method may be performed only if a significant change in ambient temperature is detected (in step 32). In some embodiments, the ambient temperature may be monitored by a dedicated temperature sensor or an additional LED, which is used as both a temperature sensor and an optical sensor, as discussed below with reference to FIG. 20. A "significant change" may be any incremental increase or decrease in ambient temperature (e.g., 1° C.) and is generally set within the control circuitry of the illumination device as a specified amount. If no significant temperature change is detected ("No" branch in step 32), the compensation method may continue to drive the plurality of emission LEDs substantially continuously to produce illumination (in step 30). Otherwise, the compensation method may proceed to step 36.

In some embodiments, the compensation method may also be performed if the dimming level and/or the color point setting is changed in a tunable illumination device. To accommodate such changes, the compensation method may monitor the target luminance (Ym) and the target chromaticity setting (xm, ym) stored within the control circuitry of the illumination device. In some embodiments, the target luminance (Ym) may be expressed as a finite set of dimming levels, and the target chromaticity setting (xm, ym) may be expressed as a range of x,y coordinates within the color gamut of the illumination device. In some embodiments, the target luminance (Ym) and the target chromaticity setting (xm, ym) may be stored, e.g., as 16 bit integer values within a hardware or software register of the control circuitry, and may be changed by a user or a building controller by storing alternative values within the illumination device. If no changes to the stored Ym, xm and ym values are detected by the control circuitry ("No" branch in step 34), the compensation method may continue to drive the plurality of emission LEDs substantially continuously to produce illumination (in step 30). Otherwise, the compensation method may proceed to step 36.

Figure 13:
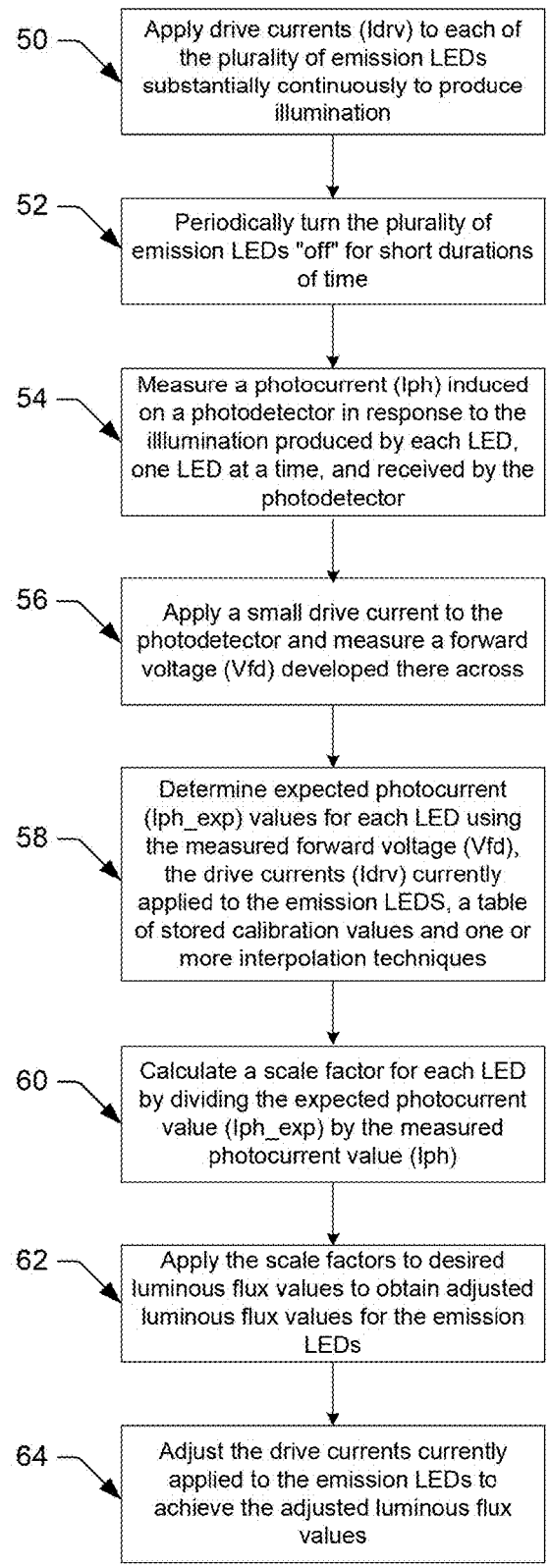
FIG. 13 is a flowchart diagram of an improved compensation method, in accordance with another embodiment of the invention.
Figure 14:
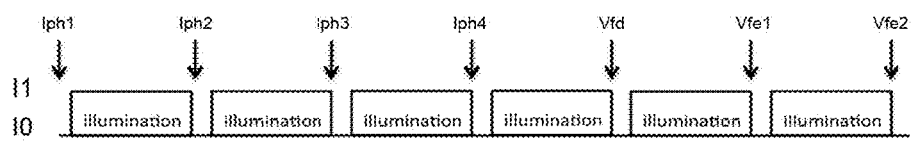
FIG. 14 is an exemplary timing diagram for an illumination device comprising four emission LEDs, illustrating the periodic intervals during which measurements are obtained from the one or more photodetectors (e.g., induced photocurrent and detector forward voltage) and from each emission LED, one LED at a time (e.g., emitter forward voltage)

As used herein, the term "substantially continuously" means that an operative drive current is supplied to the plurality of emission LEDs almost continuously, with the exception of periodic intervals during which the plurality of emission LEDs are momentarily turned "off" for short durations of time (in step 36). In the exemplary embodiment of FIG. 8, the periodic intervals are utilized for obtaining forward voltage (Vfe) measurements from each of the emission LEDs, one LED at a time (in step 38). These periodic intervals may also be used for other purposes, as shown in FIGS. 13-14 and discussed in more detail below.

Figure 9:
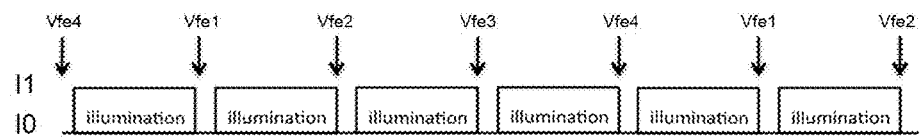
FIG. 9 is an exemplary timing diagram for an illumination device comprising four emission LEDs, illustrating the periodic intervals during which measurements (e.g., emitter forward voltage) are obtained from each emission LED, one LED at a time.

FIG. 9 is an exemplary timing diagram illustrating steps 30, 36 and 38 of the compensation method shown in FIG. 8, according to one embodiment of the invention. As shown in FIGS. 8 and 9, the plurality of emission LEDS are driven substantially continuously with operative drive current levels (denoted generically as I1 in FIG. 9) to produce illumination (in step 30 of FIG. 8). At periodic intervals, the plurality of emission LEDs are turned off for short durations of time (in step 36 of FIG. 8) by removing the drive currents, or at least reducing the drive currents to non-operative levels (denoted generically as I0 in FIG. 9). Between the periodic intervals, the illumination device produces continuous illumination with DC current supplied to the LEDs.

During each periodic interval, one emission LED is driven with a relatively small, non-operative drive current (e.g., approximately 0.1-10 mA, not shown in FIG. 9) and the forward voltage developed across that LED is measured (e.g., Vfe1). In this manner, forward voltages (e.g., Vfe1, Vfe2, Vfe3 and Vfe4) are measured across each emission LED, one LED at a time, as shown in FIG. 9. In some cases, the forward voltages associated with each individual emission LED may be averaged over a period of time, filtered to eliminate erroneous data, and stored for example in a register of the illumination device.

FIG. 9 provides an exemplary timing diagram for measuring the present forward voltages (i.e., Vfe_present, or the forward voltages that develop across the emission LEDs during operation of the device), which provide an indication of the current junction temperatures of each emission LED included in the illumination device. Although FIG. 9 provides an exemplary timing diagram for an illumination device comprising four emission LEDs, such as RGBY or RGBW, the timing diagram and method described herein can be easily modified to accommodate a fewer or greater number of emission LEDs. As described in more detail below, the timing diagram described herein can also be easily modified to accommodate additional measurements, as shown for example in FIG. 14.

In one alternative embodiment, the compensation method of FIG. 8 may measure the detector forward voltage (Vfd_present) that develops across the one or more photodetectors in step 38, instead of the emitter forward voltages (Vfe_present) shown in FIGS. 8-9. However, the detector forward voltage may only be used in the presently described compensation method if a temperature difference between the emission LEDs and the photodetector(s) remains relatively the same over the operating temperature range. To maintain a substantially consistent temperature difference between the emission LEDs and the photodetector(s), an improved emitter module is provided herein and described below with reference to FIG. 18A.

Figure 10:
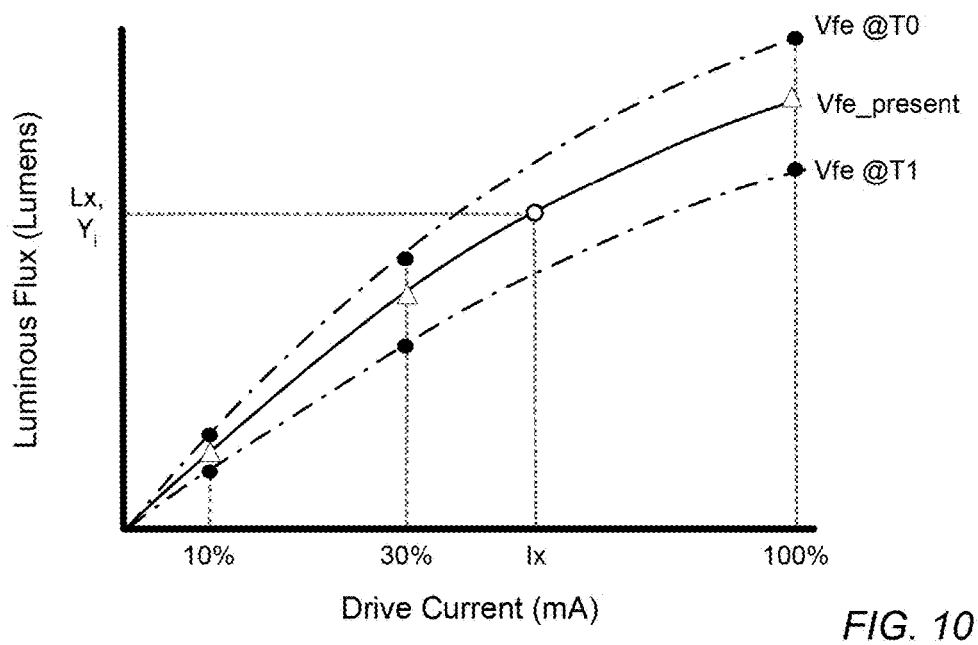
FIG. 10 is a graphical representation depicting how one or more interpolation technique(s) may be used in the compensation method of FIG. 8 to determine the drive current needed to produce a desired luminous flux for a given LED using the calibration values obtained during the calibration method of FIG. 6 and stored within the illumination device.

In some embodiments of the invention, the compensation method shown in FIG. 8 may continue to step 46 if a temperature change was detected in step 32, but the target luminance (Ym) and the target chromaticity setting (xm, ym) were not changed in step 34. As shown in FIGS. 8 and 10, the compensation method may determine the drive current (Ix) needed to achieve a desired luminous flux (Lx) from each emission LED using the present forward voltages (Vfe_present), the table of stored calibration values generated during the calibration method of FIG. 6 and one or more interpolation techniques (in step 46 of FIG. 8). For example, the compensation method may interpolate between the stored luminous flux calibration values to calculate a luminous flux value that would be expected for the present forward voltage at each of the previously calibrated (i.e., known) drive current levels. Once a luminous flux value is calculated at each of the calibrated drive current levels, another interpolation technique may be used to determine an unknown drive current (Ix) needed to produce a desired luminous flux (Lx), should the desired luminous flux differ from one of the calculated luminous flux values.

FIG. 10 is a graphical illustration depicting how one or more interpolation technique(s) may be used to determine the drive current (Ix) needed to produce a desired luminous flux (Lx) from the stored calibration values. In FIG. 10, the six solid dots (●'s) represent the luminous flux calibration values, which were obtained during calibration at three different drive currents (e.g., 10%, 30% and 100% of the maximum drive current) and two different temperatures (e.g., T0 and T1). As noted above, the luminous flux calibration values (●'s) were previously stored within a table of calibration values (see, e.g., FIG. 7) for each emission LED included in the illumination device.

To determine the drive current (Ix) needed to produce a desired luminous flux (Lx) for a given LED, the compensation method of FIG. 8 interpolates between each of the stored calibration values (●'s) to calculate the luminous flux values (Δ's), which should be produced at the present operating temperature (Vfe_present) when using the same three drive currents (e.g., 10%, 30% and 100% of the maximum drive current). If the desired luminous flux (Lx) differs from one of the calculated luminous flux values (Δ's), the compensation method of FIG. 8 may apply another interpolation technique to the calculated luminous flux values (Δ's) to generate a relationship there between (denoted by a solid line in FIG. 10). From this relationship, the drive current (Ix) needed to produce a desired luminous flux (Lx) may be determined.

In some embodiments, the interpolation technique(s) used to calculate the luminous flux values (Δ's) and to generate the relationship between the calculated values may depend on the color of the LED being compensated. For example, the luminous flux vs. junction temperature (or forward voltage) relationship for blue, green and white LEDs is substantially linear over the operating temperature range (see, FIG. 2). Because of this linear relationship, the compensation method is able to calculate luminous flux values (Δ's) at the present forward voltage for blue, green and white LEDs by linearly interpolating between the calibration values stored at each of the calibrated drive current levels. However, red, red-orange and yellow LEDs exhibit a substantially more non-linear relationship between luminous flux vs. junction temperature (see, FIG. 3). For these LEDs, a higher-order interpolation technique may be used to calculate the luminous flux values (Δ's) at the present forward voltage for each of the calibrated drive current levels.

In one embodiment, the higher-order interpolation technique may be in the form of a quadratic interpolation, which follows the general equation:

$$ax^2+bx+c=y \qquad (EQ. 1)$$

where 'x' is Vf (or temperature), 'y' is luminous flux, and 'a,' 'b' and 'c' are coefficients. If forward voltage and luminous flux values were previously obtained during the calibration phase at three different temperatures, the 'a,' 'b' and 'c' coefficient values may be precisely determined by inserting the stored calibration values into EQ. 1 and separately solving the equation for 'a,' 'b' and 'c'. If, on the other hand, the LED was calibrated at only two different temperatures, as described above, the 'a' coefficient may be obtained from data sheets provided by the LED manufacturer, while the 'b' and 'c' coefficients are determined from the calibration values. While the latter method (sometimes referred to as a "poor man's quadratic interpolation") may sacrifice a small amount of accuracy, it may represent an acceptable trade-off between accuracy and calibration costs. In some embodiments, the calibration table may store the actual (i.e., measured) luminous flux calibration values, or just the coefficients needed for the higher-order interpolation. In other embodiments, a combination of measured values and coefficients may be stored in the calibration table.

In some embodiments, the relationship (solid line in FIG. 10) between the calculated luminous flux values (Δ's) may be determined through another interpolation technique, if a desired luminous flux (Lx) differs from one of the calculated values. However, since the relationship between luminous flux and drive current is non-linear for all LED colors (see, FIGS. 4-5), the relationship is preferably derived through a higher-order interpolation of the calculated luminous flux values. Alternatively, a piece-wise linear interpolation could be used to characterize the non-linear relationship between the calculated luminous flux values, or a typical curvature could be assumed from data sheets provided by the LED manufacturer.

In some embodiments, an appropriate interpolation technique may be selected based on trade-offs between memory and processing requirements, and/or based upon the particular color of LED being compensated. As noted above, some LED colors, such as blue and green, exhibit a comparatively more non-linear luminous flux vs. drive current relationship than other LED colors, such as red and red-orange (see, FIGS. 4-5). LED colors exhibiting substantially greater non-linear behaviors (such as blue and green) may be more accurately compensated by obtaining more luminous flux calibration values and using a piece-wise linear interpolation technique, or by obtaining fewer calibration values and using a higher-order interpolation technique or an assumed curvature to generate the non-linear relationship between luminous flux and drive current.

Once the relationship between luminous flux and drive current is derived for a given LED, the drive current (Ix) needed to produce a desired luminous flux (Lx) may be selected from the generated relationship, as shown in the example of FIG. 10. The selected drive current may then be used to drive the LED to produce illumination with the desired luminous flux (in step 48 of FIG. 8). This process is performed for each emission LED, until each LED is configured for producing a desired luminous flux (Lx) at the present operating temperature (Vfe_present). The drive currents supplied to the LEDs may be adjusted to meet the selected drive currents either by adjusting the drive current level (i.e., current dimming), or by changing the duty cycle of the drive current through Pulse Width Modulation (PWM) dimming.

In some embodiments, the compensation method shown in FIG. 8 may perform additional steps (e.g., steps 40, 42, and 44), if the target luminance (Ym) and/or the target chromaticity setting (xm, ym) was changed in step 34. As noted above, the target luminance (Ym) or target chromaticity setting (xm, ym) may be changed by a user or a building controller to adjust the dimming level or the color point setting of a tunable LED illumination device. If a change in either target luminance or chromaticity is detected in step 34, the compensation method may determine the drive currents (Idrv), which are presently supplied to each of the emission LEDs (in step 40). The present drive currents (Idrv) may be obtained from the LED driver circuitry. Although illustrated in FIG. 8 as occurring after the present forward voltages (Vfe_present) are measured in step 38, the present drive currents (Idrv) may be determined before the forward voltages are measured, in alternative embodiments of the invention.

Figure 11:
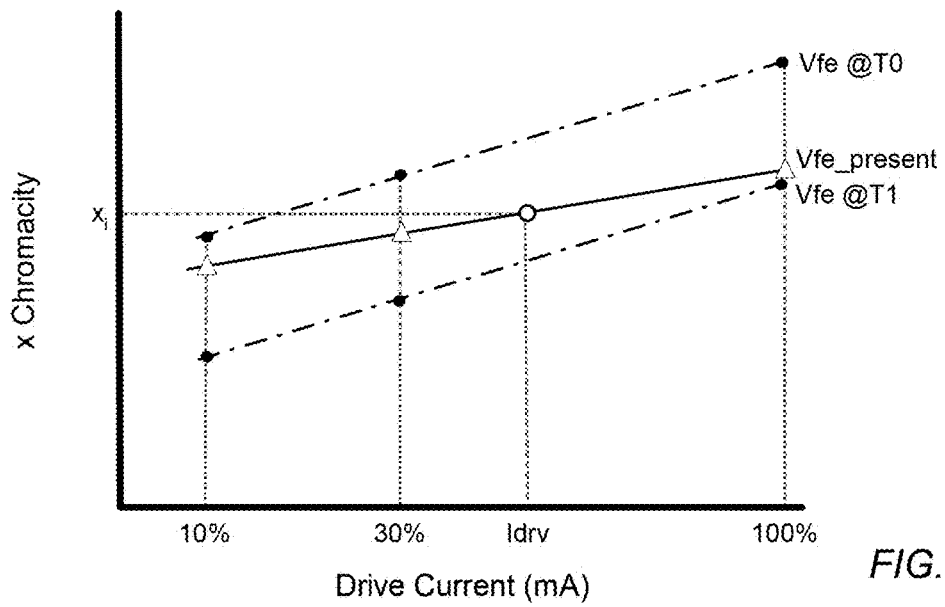
FIG. 11 is a graphical representation depicting how one or more interpolation technique(s) may be used in the compensation method of FIG. 8 to determine the expected x chromaticity value for a given LED using the present forward voltage, the present drive current and the calibration values obtained during the calibration method of FIG. 6 and stored within the illumination device.
Figure 12:
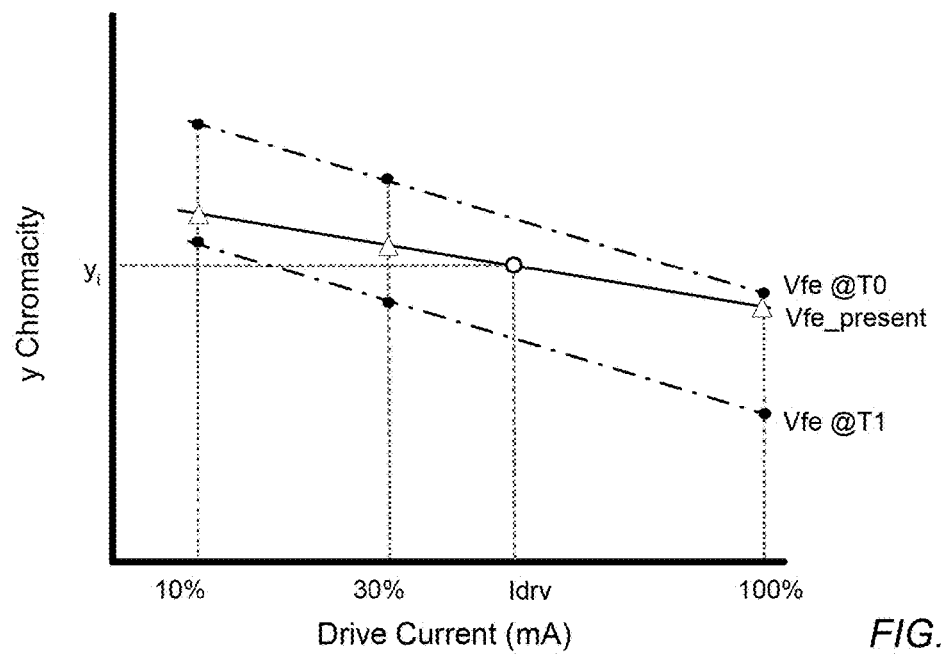
FIG. 12 is a graphical representation depicting how one or more interpolation technique(s) may be used in the compensation method of FIG. 8 to determine the expected y chromaticity value for a given LED using the present forward voltage, the present drive current and the calibration values obtained during the calibration method of FIG. 6 and stored within the illumination device.

Once the present forward voltages and the present drive currents are determined, the compensation method may determine the chromaticity values ($x_i$, $y_i$) that are expected for each emission LED (in step 42) using the present forward voltage (Vfe_present) measured across the LED, the present drive current (Idrv) supplied to the LED, the table of stored calibration values generated during the calibration method of FIG. 6, and one or more interpolation techniques. FIGS. 11-12 depict how one or more interpolation technique(s) may be used to determine the expected x and y chromaticity values ($x_i$, $y_i$) for a given LED at the present operating temperature (Vfe_present) and the present drive current (Idrv) from the table of stored calibration values.

In FIGS. 11-12, the solid dots (●'s) represent the x and y chromaticity calibration values, which were obtained during calibration at three different drive currents (e.g., 10%, 30% and 100% of the maximum drive current) and two different temperatures (e.g., T0 and T1). As noted above, these x and y chromaticity calibration values (●'s) were stored within a table of calibration values (see, e.g., FIG. 7) for each emission LED included within the illumination device. To determine the expected x and y chromaticity values ($x_i$, $y_i$) for a given LED, the compensation method of FIG. 8 interpolates between the stored calibration values (●'s) to calculate the x and y chromaticity values (Δ's), which should be produced at the present operating temperature (Vfe_present) when using the same three drive currents (e.g., 10%, 30%, and 100% of the maximum drive current). In most cases, a linear interpolation technique may be used to calculate the x and y chromaticity values (Δ's) at the present operating temperature (Vfe_present). However, if the x and y chromaticity values were calibrated at more than two temperatures, a non-linear interpolation technique may be used to calculate the x and y chromaticity values (Δ's) at the present operating temperature (Vfe_present).

If the drive current (Idrv) presently supplied to the emission LED differs from one of the calibrated drive current levels, the compensation method of FIG. 8 may apply another interpolation technique to the calculated x and y chromaticity values (Δ's) to generate a relationship there between (denoted by a solid line in FIGS. 11-12). From this relationship, the expected x and y chromaticity values ($x_i$, $y_i$) may be determined for the present drive current (Idrv).

The interpolation technique used to generate the relationship between the calculated x and y chromaticity values (Δ's) may generally depend on the color of LED being compensated. As noted above, the change in chromaticity with drive current and temperature is significantly different for different colors of LEDs. For a red LED, the peak emission wavelength increases relatively linearly with drive current, yet increases significantly with temperature. The peak emission wavelength of a blue LED decreases somewhat non-linearly with drive current and increases slightly with temperature. Although the peak emission wavelength of a green LED varies very little with temperature, it decreases very non-linearly with drive current. In some embodiments, a piecewise linear interpolation technique may be used to generate the relationship between the calculated x and y chromaticity values ($\Delta$'s), or a typical curvature may be assumed from data sheets provided by an LED manufacturer. In other embodiments, however, a higher-order interpolation technique may be used to increase accuracy when compensating certain colors of LEDs (e.g., green LEDs), which exhibit more significant non-linear changes in chromaticity with drive current.

The x and y chromaticity values expected for each emission LED may be expressed as a color point in the form of $(x_i, y_i)$. In an illumination device comprising four emission LEDs, step 42 of the compensation method may result in the generation of four expected color points: $(x_1, y_1)$, $(x_2, y_2)$, $(x_3, y_3)$, and $(x_4, y_4)$. Once the expected color points are determined in step 42, the compensation method may calculate the relative lumens needed from each of the emission LEDs to achieve the target luminance (Ym) and the target chromaticity setting (xm, ym) in step 44. For example, when light from four emission LEDs is combined, the target luminance (Ym) of the combined light may be expressed as:

$$Ym = Y_1 + Y_2 + Y_3 + Y_4 \quad (EQ. 2)$$

where $Y_1, Y_2, Y_3$, and $Y_4$ represent the relative lumens of the four emission LEDs. The relative lumen values ($Y_1, Y_2, Y_3$ and $Y_4$) may be calculated using well-known color mixing equations, the target luminance (Ym) and target chromaticity (xm, ym) values set within the illumination device, and the expected color points $(x_1, y_1)$, $(x_2, y_2)$, $(x_3, y_3)$, $(x_4, y_4)$ determined in step 42 of the compensation method. As these equations are well-known and readily understood by a skilled artisan, further description of such equations will be omitted herein.

Once the relative lumens (e.g., $Y_1, Y_2, Y_3$, and $Y_4$) are calculated for each emission LED (in step 44), the drive currents that should be supplied to each emission LED to achieve the target luminance (Ym) are determined in step 46 similar to the manner described above. However, instead of determining a drive current (Ix) needed to achieve a "desired luminous flux" (Lx) from each emission LED, the current embodiment determines the drive current (Ix) needed to achieve the relative lumen value ($Y_1, Y_2, Y_3$ or $Y_4$), which was calculated for each emission LED in step 44. Once the individual drive currents (Ix) are determined in step 46, the emission LEDs are driven with the determined drive currents to produce illumination having a desired luminous flux and a desired chromaticity in step 48.

The compensation method shown in FIG. 8 may be used to adjust the drive currents supplied to the emission LEDs whenever a significant change in the temperature is detected (in step 32) and/or the target luminance or target chromaticity setting is changed (in step 34). However, since changes in drive current inherently affect the LED junction temperature, the method steps shown in FIG. 8 may generally be repeated a number of times until the temperature stabilizes and the target luminance and chromaticity values remain unchanged.

One embodiment of a compensation method for controlling an LED illumination device over changes in drive current and temperature has now been described with reference to FIGS. 8-12. Although the compensation method described herein references target chromaticity settings and chromaticity calibration values from the CIE 1931 XYZ color space, one skilled in the art would readily understand how the compensation method could be modified to use target chromaticity settings and chromaticity calibration values from other color spaces, such as the CIE 1931 RGB color space, the CIE 1976 LUV color space, and various other RGB color spaces (e.g., sRGB, Adobe RGB, etc.). For this reason, the compensation method described herein and recited in the claims is considered to encompass any color space that can be used to describe the gamut of an LED illumination device comprising substantially any combination of emission LEDs as described herein.

The compensation method shown in FIG. 8 provides many advantages over conventional compensation methods. As noted above, conventional methods typically measure forward voltages by applying operative drive current levels to the emission LEDs. Unfortunately, forward voltages measured at operative drive current levels vary significantly over the lifetime of an LED. As an LED ages, the parasitic resistance within the junction increases, which in turn, causes the forward voltage measured at operating current levels to increase over time, regardless of temperature. For this reason, the present compensation method uses a relatively small drive current (e.g., about 0.1 mA to about 10 mA) to obtain forward voltage measurements from each LED individually, while turning off all emission LEDs not currently under test. This improves the accuracy of the operating forward voltage values and enables each emission LED to be individually compensated for temperature and process.

Conventional methods often rely on typical values or linear relationships between luminous flux and drive current when performing temperature compensation. In contrast, the compensation method described herein interpolates between a plurality of stored luminous flux calibration values taken at different drive currents and different temperatures, and derives a non-linear relationship between luminous flux and drive current for each LED at the present operating temperature (Vfe_present). This enables the present compensation method to accurately and individually characterize the luminous flux vs. drive current relationship for each LED included within the illumination device, and to provide accurate temperature compensation, regardless of process. As a consequence, the compensation method described herein provides more accurate control of the luminous flux over temperature changes.

The compensation method shown in FIG. 8 further improves upon conventional compensation methods by providing a more accurate method of controlling the luminance and chromaticity of the illumination device when the dimming level or color point setting is changed by a user or building controller. When a change in target luminance or target chromaticity is detected by the illumination device, the drive currents supplied to the emission LEDs must be adjusted to achieve the new target value(s). The compensation method described herein increases the accuracy with which new drive currents are determined by interpolating between a plurality of stored chromaticity calibration values taken at different temperatures, and deriving a relationship between chromaticity and drive current for each emission LED at the present operating temperature (Vfe_present). This enables the present compensation method to accurately determine the expected chromaticity values that should be produced for each emission LED at the present operating temperature and the present drive current. As a consequence, the compensation method described herein provides more accurate control of the chromaticity as drive current changes.

While the compensation method shown in FIG. 8 provides an accurate method for controlling the luminous flux and chromaticity of an LED illumination device over changes in drive current and temperature, it does not account for LED aging effects. In order to mitigate such effects, FIG. 13 provides an improved method for maintaining a desired luminous flux and a desired chromaticity over time, as the LEDs age. As noted above, the compensation methods shown in FIGS. 8 and 13 may be used alone, or together to provide accurate compensation for all LEDs used in the illumination device over changes in drive current, temperature and time.

In general, the compensation method shown in FIG. 13 may be performed repeatedly throughout the lifetime of the illumination device to account for LED aging effects. The method shown in FIG. 13 may be performed at substantially any time, such as when the illumination device is first turned "on," or at periodic or random intervals throughout the lifetime of the device. In some embodiments, the compensation method shown in FIG. 13 may be performed after a change in temperature, dimming level or color point setting is detected to fine tune the drive current values determined in the compensation method of FIG. 8.

As shown in FIG. 13, the age compensation method may generally begin by driving the plurality of emission LEDs substantially continuously to produce illumination, e.g., by applying operative drive currents (Idrv) to each of the plurality of emission LEDs (in step 50). As noted above, the term "substantially continuously" means that an operative drive current is applied to the plurality of emission LEDs almost continuously, with the exception of periodic intervals during which the plurality of emission LEDs are momentarily turned off for short durations of time (in step 52). In the method shown in FIG. 13, the periodic intervals may be used for obtaining various measurements from a dedicated photodetector (e.g., a red photodetector) included within the illumination device or an emission LED (e.g., a red emission LED) configured to detect incident light. In step 54, for example, the periodic intervals are used for measuring a photocurrent (Iph), which is induced on the photodetector in response to illumination that is produced by each emission LED, one LED at a time, and received by the photodetector. In step 56, the periodic intervals are used for obtaining a forward voltage (Vfd), which develops across the photodetector upon applying a relatively small (i.e., non-operative) drive current thereto.

FIG. 14 is an exemplary timing diagram illustrating steps 50, 52, 54 and 56 of the compensation method shown in FIG. 13, according to one embodiment of the invention. As shown in FIGS. 13 and 14, the plurality of emission LEDS are driven substantially continuously with operative drive current levels (denoted generically as I1 in FIG. 14) to produce illumination (in step 50 of FIG. 13). At periodic intervals, the plurality of emission LEDs are turned "off" for short durations of time (in step 52 of FIG. 13) by removing the drive currents, or at least reducing the drive currents to non-operative levels (denoted generically as I0 in FIG. 14). Between the periodic intervals, the illumination device produces continuous illumination with DC current supplied to the emission LEDs.

During some of the periodic intervals, one emission LED is driven with an operative drive current level (I1) to produce illumination, while the remaining LEDs remain "off," and the photocurrent (e.g., Iph1) induced in the photodetector by the illumination from the driven LED is measured. The photocurrents (e.g., Iph1, Iph2, Iph3, and Iph4) induced in the photodetector by the illumination produced by each of the emission LEDs are measured, one LED at a time, as shown in FIG. 14 and step 54 of FIG. 13. Although FIG. 14 provides an exemplary timing diagram for an illumination device comprising four emission LEDs, such as RGBY or RGBW, the timing diagram described herein can be easily modified to accommodate a fewer or greater number of emission LEDs.

Sometime before or after the photocurrent (Iph) measurements are obtained, a forward voltage (Vfd) is measured across the photodetector by applying a relatively small, non-operative drive current (e.g., approximately 0.1-0.3 mA) to the photodetector (in step 56 of FIG. 13). This forward voltage measurement (also referred to herein as Vfd_present) provides an indication of the current junction temperature of the photodetector. Although the timing diagram of FIG. 14 shows only one forward voltage (Vfd) measurement obtained from a single photodetector, the timing diagram can be easily modified to accommodate a greater number of photodetectors.

In one exemplary embodiment, the presently described compensation method may be utilized within an illumination device comprising a plurality of photodetectors implemented with differently colored LEDs. In particular, each emitter module of the illumination device may include one or more red LEDs and one or more green LEDs as photodetectors. In such an embodiment, a forward voltage measurement (Vfd) may be obtained from each photodetector by applying a small drive current thereto (in step 56). In some cases, the photocurrents associated with each emission LED (e.g., Iph1, Iph2, Iph3, Iph4) and the forward voltage(s) associated with each photodetector (Vfd) may be independently averaged over a period of time, filtered to eliminate erroneous data, and stored for example in a register of the illumination device.

In addition to the photocurrents and detector forward voltage(s), the periodic intervals shown in FIG. 14 may be used to obtain other measurements, such as the emitter forward voltages (Vfe1, Vfe2, etc.) described above with respect to FIGS. 8 and 9. The periodic intervals may also be used for other purposes not specifically illustrated herein. For example, some of the periodic intervals may be used by the photodetector to detect light originating from outside of the illumination device, such as ambient light or light from other illumination devices. In some cases, ambient light measurements may be used to turn the illumination device on when the ambient light level drops below a threshold (i.e., when it gets dark), and turn the illumination device off when the ambient light level exceeds another threshold (i.e., when it gets light). In other cases, the ambient light measurements may be used to adjust the lumen output of the illumination device over changes in ambient light level, for example, to maintain a consistent level of brightness in a room. If the periodic intervals are used to detect light from other illumination devices, the detected light may be used to avoid interference from the other illumination devices when obtaining the photocurrent and detector forward voltage measurements in the compensation method of FIG. 13.

In other embodiments, the periodic intervals may be used to measure different portions of a particular LED's spectrum using two or more different colors of photodetectors. For example, the spectrum of a phosphor converted white LED may be divided into two portions, and each portion may be measured separately during two different periodic intervals using two different photodetectors. Specifically, a first periodic interval may be used to detect the photocurrent, which is induced on a first photodetector (e.g., a green photodetector) by a first spectral portion (e.g., about 400 nm to about 500 nm) of the phosphor converted white LED. A second periodic interval may then be used to detect the photocurrent, which is induced on a second photodetector (e.g., a red photodetector) by a second spectral portion (e.g., about 500 nm to about 650 nm) of the phosphor converted white LED. As described in more detail below, dividing the spectrum of the phosphor converted white LED into two portions, and measuring each portion separately with two different colors of photodetectors may enable the compensation method of FIG. 13 to detect and account for changes in chromaticity that occur as the phosphor converted LED ages.

Figure 15:
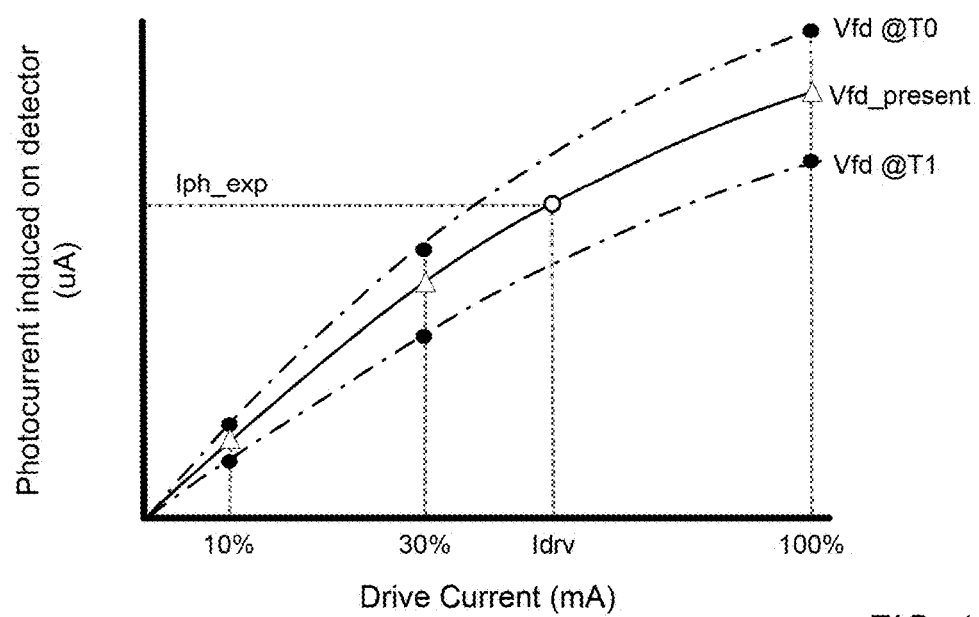
FIG. 15 is a graphical representation depicting how one or more interpolation technique(s) may be used in the compensation method of FIG. 13 to determine the expected photocurrent value for a given LED using the present forward voltage, the present drive current and the calibration values obtained during the calibration method of FIG. 6 and stored within the illumination device.

Once the photocurrents and detector forward voltage(s) are measured, the compensation method shown in FIG. 13 may determine the photocurrents (Iph_exp) that are expected for each emission LED (in step 58) using the forward voltage (Vfd_present) presently measured across the photodetector, the drive current (Idrv) presently applied to the LED, the table of stored calibration values generated during the calibration method of FIG. 6, and one or more interpolation techniques. FIG. 15 depicts how one or more interpolation techniques may be used to determine the expected photocurrent (Iph_exp) for a given LED at the present operating temperature (Vfd_present) and the present drive current (Idrv) from the table of stored calibration values.

In FIG. 15, the solid dots (●'s) represent the photocurrent calibration values, which were obtained during calibration at three different drive currents (e.g., 10%, 30% and 100% of the maximum drive current) and two different temperatures (e.g., T0 and T1). As noted above, the photocurrent calibration values (●'s) were stored within a table of calibration values for each emission LED included within the illumination device (see, e.g., FIG. 7). To determine the expected photocurrent value (Iph_exp) for a given LED, the compensation method of FIG. 13 interpolates between the stored calibration values (●'s) to calculate the photocurrent values (Δ's), which should be produced at the present operating temperature (Vfd_present) when using the same three drive currents (e.g., 10%, 30% and 100% of the maximum drive current).

The change in photocurrent over temperature is non-linear for all LED colors, since both the emitted power and the responsivity of the photodetector decrease linearly with temperature. For this reason, a non-linear interpolation technique may be used to calculate the photocurrent values (Δ's) at the present operating temperature for all LED colors. In some embodiments, the non-linear interpolation technique may be a higher-order interpolation, a "poor man's" quadratic interpolation, or an assumed curvature. In other embodiments, the results of two different linear interpolations (e.g., a linear interpolation between emitted power and temperature, and a linear interpolation between detector responsivity and temperature) may be multiplied together to calculate the photocurrent values (Δ's) at the present operating temperature.

If the drive current (Idrv) presently supplied to the emission LED differs from one of the calibrated drive current levels, the compensation method of FIG. 13 may apply another interpolation technique to the calculated photocurrent values (Δ's) to generate a relationship there between (denoted by a solid line in FIG. 15). In some cases, a higher-order interpolation of the calculated photocurrent values (Δ's) may be used to generate a non-linear relationship between photocurrent and drive current. In other cases, a piece-wise linear interpolation could be used to characterize the non-linear relationship between the calculated photocurrent values, or a typical curvature could be assumed from data sheets provided by the LED manufacturer. From the generated relationship, the expected photocurrent value (Iph_exp) may be determined for the present drive current (Idrv).

Once expected photocurrents (Iph_exp) are determined for each emission LED (in step 58), the compensation method shown in FIG. 13 calculates a scale factor for each emission LED (in step 60) by dividing the photocurrent (Iph_exp) expected for each LED by the photocurrent (e.g., Ipd1) measured for each LED. Next, the compensation method applies each scale factor to a desired luminous flux value for each emission LED to obtain an adjusted luminous flux value for each emission LED (in step 62). In some embodiments, the desired luminous flux value may be one of the relative lumen values ($Y_1$, $Y_2$, $Y_3$ or $Y_4$) calculated, e.g., in step 44 of the compensation method shown in FIG. 8 to account for any changes in the target luminance (Ym) and/or target chromaticity (xm, ym) settings stored within the illumination device. Finally, the drive currents presently applied to the emission LEDs are adjusted (in step 64) to achieve the adjusted luminous flux values if a difference exists between the expected and measured photocurrents for any of the emission LEDs.

The compensation method described above and illustrated in FIG. 13 provides an accurate method for adjusting the individual drive currents applied to the emission LEDs, so as to compensate for the degradation in lumen output that occurs over time as the LEDs age. By accurately controlling the luminous flux produced by each emission LED, the compensation method accurately controls the color of an LED illumination device comprising a plurality of multi-colored, non-phosphor converted emission LEDs. However, and as noted above, some embodiments of the invention may include a phosphor converted emission LED (e.g., a white or yellow LED) within the emitter module. In such embodiments, additional steps may be taken to control the luminous flux and chromaticity of the phosphor converted LED over time.

Like non-phosphor converted LEDs, the luminous flux produced by a phosphor converted LED generally decreases over time. Unlike non-phosphor converted LEDs, however, phosphor converted LEDs are also susceptible to changes in chromaticity over time, since the efficiency of the phosphor degrades as the phosphor ages. When a phosphor converted LED is included in the emitter module, the compensation method shown in FIG. 13 may be used to detect and account for chromaticity shifts that occur in the phosphor converted LED by separately measuring and compensating for the chromaticity shifts caused by phosphor aging. In order to do so, two separate photodetectors may be included within the emitter module for measuring the photocurrents, which are induced by two different portions of the phosphor converted LED spectrum. In some embodiments, the emitter module may include two different colors of dedicated photodetectors (e.g., red and green photodetectors as shown in FIG. 17B) for measuring the photocurrents induced by the two different portions of the phosphor converted LED spectrum (as shown, e.g., in FIG. 21). In other embodiments, only one dedicated photodetector may be included within the emitter module (e.g., a red photodetector, as shown in FIG. 16B), and one of the emission LEDs (e.g., a green emission LED) may be used, at times, as an additional photodetector.

In order to detect and account for chromaticity shifts that occur over time in a phosphor converted white LED, the different portions of the phosphor converted LED spectrum must first be calibrated. For example, the dedicated red photodetector and the dedicated green photodetector (or the green emission LED) may both be used in step 16 of the calibration method of FIG. 6 to obtain photocurrent measurements from the phosphor converted white LED. The white LED-on-red detector photocurrent measurements are stored in the calibration table of FIG. 7 as "Iph_d1". The white LED-on-green detector photocurrent measurements are stored in the calibration table of FIG. 7 as "Iph_d2". The Iph_d2 calibration values are italicized in FIG. 7 to show that they are optional values, which may only be obtained when a phosphor converted LED is included within the emitter module.

As described above and shown in FIG. 7, the Iph_d1 and Iph_d2 calibration values may be obtained for a phosphor converted white LED at each of the three different drive currents (e.g., 10%, 30% and 100% of the max drive current) and at each of the two different temperatures (e.g., T0 and T1). The white LED-on-green detector photocurrent (Iph_d2) measurements indicate the photocurrents that were induced in the green photodetector (or the green emission LED) by light emitted by the blue LED portion of the phosphor converted white LED (i.e., the first portion shown in FIG. 21). The white LED-on-red detector photocurrent (Iph_d1) measurements indicate the photocurrents that were induced in the red photodetector by the light that passed through the phosphor portion of the phosphor converted white LED (i.e., the second portion shown in FIG. 21).

Sometime before or after each Iph_d1 and Iph_d2 measurement is obtained, a forward voltage (Vfd1 or Vfd2) is measured across the dedicated red photodetector and the dedicated green photodetector (or the green emission LED) to provide an indication of the red detector junction temperature and the green detector junction temperature at each of the calibrated drive current levels and ambient temperatures. The Vfd1 and Vfd2 measurements may be stored within the calibration table, as shown in FIG. 7.

During the compensation method of FIG. 13, the white LED-on-red detector photocurrent (Iph_d1) and the white LED-on-green detector photocurrent (Iph_d2) can be measured as described in step 54, and the expected photocurrents (Iph_exp) for the white LED-on-red detector and the white LED-on-green detector can be determined as described in steps 56-58. Next, the expected photocurrents (Iph_exp) determined in step 58 can be respectively divided by the photocurrents measured in step 54 to produce a white LED-on-red detector scale factor and a white LED-on-green detector scale factor, as described in step 60. The white LED-on-green detector scale factor provides an indication of how the relative lumens of the LED portion of the phosphor converted LED has changed over time. The white LED-on-red detector scale factor provides an indication of how the relative lumens of the phosphor portion of the phosphor converted LED has changed over time. In some embodiments, the white LED-on-green detector scale factor and the white LED-on-red detector scale factor can be used to control the luminous flux and chromaticity of the phosphor converted white LED, as if it were two separate LEDs.

For example, the white LED-on-red detector scale factor can be applied in step 62 to an overall desired luminous flux value for the phosphor converted LED to account for lumen changes caused by LED and phosphor aging. In some cases, the overall desired luminous flux value for the phosphor converted LED may be determined by adding together the relative lumen values, which were separately calculated for the LED portion and the phosphor portion of the phosphor converted LED in steps 40-44 of the compensation method of FIG. 8. In order to calculate the relative lumen values for the LED portion and the phosphor portion separately, the compensation method of FIG. 8 may use the luminous flux, x chromaticity and y chromaticity calibration values, which were separately stored in the calibration table for each portion of the phosphor converted white LED spectrum, as described above with reference to FIG. 6.

To account for chromaticity shifts in the phosphor converted white LED over time, the white LED-on-green detector scale factor can be compared to the white LED-on-red detector scale factor. Based on such comparison, the actual chromaticity of the phosphor converted LED can be determined using well known color mixing equations, and the overall chromaticity of the illumination device can be maintained by adjusting the drive currents applied to all emission LEDs.

While the method described above provides an acceptable solution for controlling the luminous flux and chromaticity of a phosphor converted LED over time, the chromaticity of the phosphor converted white LED may be more accurately determined, in some embodiments, by accounting for detector aging. For example, the photocurrents induced on the red and green photodetectors (or the green emission LED) by a given amount of incident light generally decreases over time. Although such decrease is typically not large, it may cause the white LED-on-green detector scale factor and the white LED-on-red detector scale factor to likewise decrease over time, which in turn, decreases the accuracy with which the chromaticity of the phosphor converted white LED is adjusted. To eliminate this source of measurement error, the scale factors generated in step 60 for the phosphor converted LED may be adjusted, in some embodiments, to account for detector aging. This may be achieved, for example, by using the blue emission LED as a reference for the phosphor converted white LED.

In some embodiments, the dedicated red photodetector and the dedicated green photodetector (or the green emission LED) may both be used in step 54 of the compensation method of FIG. 13 to obtain Iph_d1 and Iph_d2 photocurrent measurements from the blue emission LED. After measuring the forward voltages measured across the red and green detectors in step 56, steps 58 and 60 of the compensation method of FIG. 13 may be repeated to produce a blue LED-on-red detector scale factor and a blue LED-on-green detector scale factor for the blue emission/reference LED. In some embodiments, the blue LED-on-red detector scale factor may be applied in step 62 to a desired luminous flux value for the blue emission/reference LED to adjust the luminous flux produced by the blue emission/reference LED. In some embodiments, the desired luminous flux value for the blue emission/reference LED may be a relative lumen value, which is calculated as described in steps 40-44 of the compensation method of FIG. 8.

In order to account for detector aging in the phosphor converted LED scale factors, the white LED-on-green detector scale factor may be divided by the blue LED-on-green detector scale factor to produce a white-over-blue-on-green scale factor ratio (WoBoG). Likewise, the white LED-on-red detector scale factor may be divided by the blue LED-on-red detector scale factor to produce a white-over-blue-on-red scale factor ratio (WoBoR). Next, the WoBoR scale factor ratio may be further divided by the WoBoG scale factor ratio to produce a White Phosphor over White Blue pump (WPoWB) ratio. The White Phosphor over White Blue pump (WPoWB) ratio provides an indication of how the spectrum of the phosphor converted white LED changes over time and accounts for any degradation of the detector responsivity that may over time. In some embodiments, the WPoWB ratio may be used to adjust the overall chromaticity of the phosphor converted LED. Once the overall chromaticity of the phosphor converted LED is set, the white-on-red detector scale factor may be applied in step 62 to the overall desired luminous flux value for the phosphor converted white LED to account for age related lumen changes.

The compensation method shown in FIG. 13 and described above provides many advantages over conventional compensation methods. As with the other methods described herein, the compensation method of FIG. 13 improves the accuracy with which the detector forward voltage(s) are measured by applying a relatively small drive current (e.g., about 0.1 mA to about 0.3 mA) to the photodetector(s). In addition, the compensation method of FIG. 13 interpolates between a plurality of stored photocurrent values taken at different drive currents and different temperatures, and derives a non-linear relationship between photocurrent and drive current for each emission LED at the present operating temperature (Vf_present). This enables the present compensation method to accurately and individually characterize the photocurrent vs. drive current relationship for each individual LED, thereby providing accurate age compensation for all emission LEDs included within the illumination device. Furthermore, the compensation method described herein accounts for both emitter and detector aging, and provides compensation for chromaticity shifts that occur when phosphor converted white emission LEDs age. As a consequence, the age compensation method described herein provides more accurate control of the luminous flux and chromaticity of the individual emission LEDs over time.

Exemplary Embodiments of Improved Illumination Devices

The improved methods described herein for calibrating and controlling an illumination device may be used within substantially any LED illumination device having a plurality of emission LEDs and one or more photodetectors. As described in more detail below, the improved methods described herein may be implemented within an LED illumination device in the form of hardware, software or a combination of both.

Illumination devices, which benefit from the improved methods described herein, may have substantially any form factor including, but not limited to, parabolic lamps (e.g., PAR 20, 30 or 38), linear lamps, flood lights and mini-reflectors. In some cases, the illumination devices may be installed in a ceiling or wall of a building, and may be connected to an AC mains or some other AC power source. However, a skilled artisan would understand how the improved methods described herein may be used within other types of illumination devices powered by other power sources (e.g., batteries or solar energy).

Exemplary embodiments of an improved illumination device will now be described with reference to FIGS. 16-20, which show different types of LED illumination devices, each having one or more emitter modules. Although examples are provided herein, the present invention is not limited to any particular type of LED illumination device or emitter module design. A skilled artisan would understand how the method steps described herein may be applied to other types of LED illumination devices having substantially different emitter module designs.

Figure 16A:
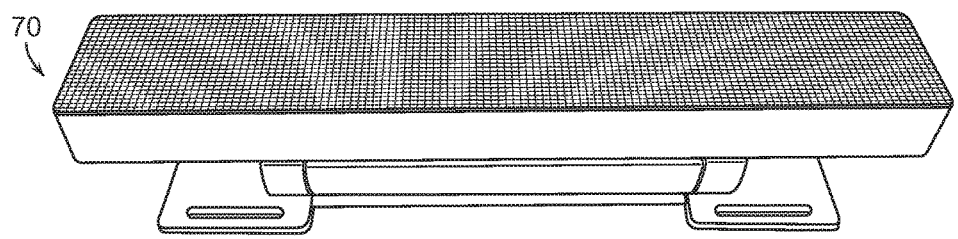
FIG. 16A is a photograph of an exemplary illumination device.
Figure 16B:
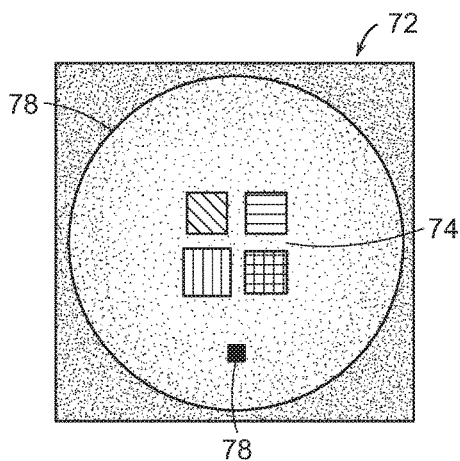
FIG. 16B is a computer generated image showing a top view of an exemplary emitter module that may be included within the exemplary illumination device of FIG. 16A.

FIG. 16A is a photograph of a linear lamp 70 comprising a plurality of emitter modules (not shown in FIG. 16A), which are spaced apart from one another and arranged generally in a line. Each emitter module included within linear lamp 70 includes a plurality of emission LEDs and at least one dedicated photodetector, all of which are mounted onto a common substrate and encapsulated within a primary optics structure. The primary optics structure may be formed from a variety of different materials and may have substantially any shape and/or dimensions necessary to shape the light emitted by the emission LEDs in a desirable manner. Although the primary optics structure is described below as a dome, one skilled in the art would understand how the primary optics structure may have substantially any other shape or configuration, which encapsulates the emission LEDs and the at least one photodetector.

An exemplary emitter module 72 that may be included within the linear lamp 70 of FIG. 16A is shown in FIG. 16B. In the illustrated embodiment, emitter module 72 includes four differently colored emission LEDs 74, which are arranged in a square array and placed as close as possible together in the center of a primary optics structure (e.g., a dome) 76, so as to approximate a centrally located point source. In some embodiments, the emission LEDs 74 may each be configured for producing illumination at a different peak emission wavelength. For example, the emission LEDs 74 may include RGBW LEDs or RGBY LEDs. In addition to the emission LEDs 74, a dedicated photodetector 78 is included within the dome 76 and arranged somewhere around the periphery of the array. The dedicated photodetector 78 may be any device (such as a silicon photodiode or an LED) that produces current indicative of incident light.

In at least one embodiment, photodetector 78 is an LED with a peak emission wavelength in the range of approximately 550 nm to 700 nm. A photodetector with such a peak emission wavelength will not produce photocurrent in response to infrared light, which reduces interference from ambient light sources. In at least one preferred embodiment, photodetector 78 may comprise a small red, orange or yellow LED. In some embodiments, the dedicated photodetector 78 may be arranged to capture a maximum amount light, which is reflected from a surface of the dome 76 from the emission LEDs having the shortest wavelengths (e.g., the blue and green emission LEDs).

In some embodiments, the emitter module 72 may include a phosphor converted white (W) emission LED 74, and the dedicated photodetector 78 may be used to measure the photocurrents (Iph_d1) that are induced by the light that passes through the phosphor portion of the phosphor converted LED. In order to measure the photocurrents (Iph_d2) induced by the blue LED portion of the phosphor converted LED, the green emission LED 74 may be configured, at times, as an additional photodetector. These photocurrent measurements may be stored within the calibration table of FIG. 7 and used within the compensation method of FIG. 13 to compensate for chromaticity shifts caused by phosphor aging.

Figure 17A:
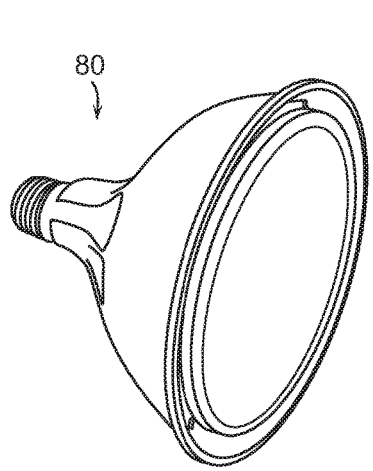
FIG. 17A is a photograph of another exemplary illumination device.
Figure 17B:
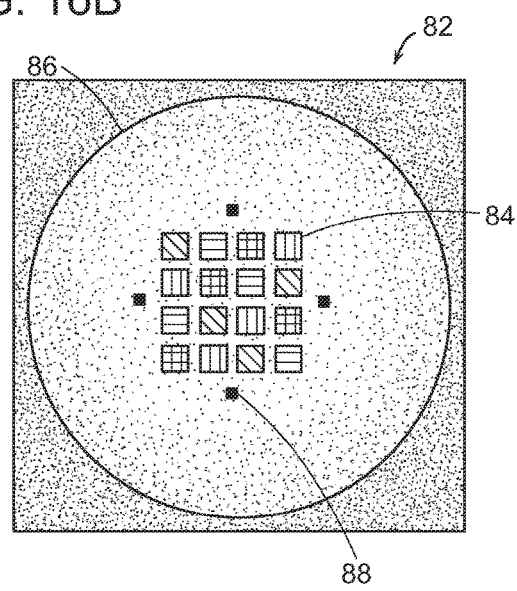
FIG. 17B is a computer generated image showing a top view of an exemplary emitter module that may be included within the exemplary illumination device of FIG. 17A.

FIGS. 17A and 17B illustrate a substantially different type of illumination device and emitter module design. Specifically, FIG. 17A depicts an illumination device 80 having a parabolic form factor (e.g., a PAR 38) and only one emitter module (not shown in FIG. 17A). As these illumination devices have only one emitter module, the emitter modules included in such devices typically include a plurality of differently colored chains of LEDs, where each chain includes two or more LEDs of the same color. FIG. 17B illustrates an exemplary emitter module 82 that may be included within the PAR lamp 80 shown in FIG. 17A.

In the illustrated embodiment, emitter module 82 includes an array of emission LEDs 84 and a plurality of dedicated photodetectors 88, all of which are mounted on a common substrate and encapsulated within a primary optics structure (e.g., a dome) 86. In some embodiments, the array of emission LEDs 84 may include a number of differently colored chains of LEDS, wherein each chain is configured for producing illumination at a different peak emission wavelength. According to one embodiment, the array of emission LEDs 84 may include a chain of four red LEDs, a chain of four green LEDs, a chain of four blue LEDs, and a chain of four white or yellow LEDs. Each chain of LEDs is coupled in series and driven with the same drive current. In some embodiments, the individual LEDs in each chain may be scattered about the array, and arranged so that no color appears twice in any row, column or diagonal, to improve color mixing within the emitter module 82.

In the exemplary embodiment of FIG. 17B, four dedicated photodetectors 88 are included within the dome 86 and arranged around the periphery of the array. In some embodiments, the dedicated photodetectors 88 may be placed close to, and in the middle of, each edge of the array and may be connected in parallel to a receiver of the illumination device. By connecting the dedicated photodetectors 88 in parallel with the receiver, the photocurrents induced on each photodetector may be summed to minimize the spatial variation between the similarly colored LEDs, which may be scattered about the array. The dedicated photodetectors 88 may be any devices that produce current indicative of incident light (such as a silicon photodiode or an LED). In one embodiment, however, the dedicated photodetectors 88 are preferably LEDs with peak emission wavelengths in the range of 500 nm to 700 nm. Photodetectors with such peak emission wavelengths will not produce photocurrent in response to infrared light, which reduces interference from ambient light.

In at least one preferred embodiment, emitter module 82 includes a phosphor converted white (W) emission LED 84 and two different colors of photodetectors for measuring different portions of the phosphor converted LED spectrum. In one example, the dedicated photodetectors 88 may include one or more small red LEDs and one or more small green LEDs. In such an example, the dedicated red photodetector(s) 88 may be used to measure the photocurrents (Iph_d1) that are induced by the light that passes through the phosphor portion of the phosphor converted LED, while the dedicated green photodetector(s) 88 are used to measure the photocurrents (Iph_d2) induced by the light emitted by blue LED portion of the phosphor converted LED. These photocurrent measurements (Iph_d1 and Iph_d2) may be stored within the calibration table of FIG. 7 and used within the compensation method of FIG. 13 to compensate for chromaticity shifts caused by phosphor aging.

The illumination devices shown in FIGS. 16A and 17A and the emitter modules shown in FIGS. 16B and 17B are provided merely as examples of illumination devices in which the improved calibration and compensation methods may be used. Further description of these illumination devices and emitter modules may be found in related U.S. patent application Ser. No. 14/097,339 and related U.S. Provisional Patent Application No. 61/886,471, which are commonly assigned and incorporated herein by reference in their entirety. However, the inventive concepts described herein are not limited to any particular type of LED illumination device, any particular number of emitter modules that may be included within an LED illumination device, or any particular number, color or arrangement of emission LEDs and photodetectors that may be included within an emitter module. Instead, the present invention may only require an LED illumination device to include at least one emitter module comprising a plurality of emission LEDs and at least one dedicated photodetector. In some embodiments, a dedicated photodetector may not be required, if one or more of the emission LEDs is configured, at times, to provide such functionality.

Figure 18A:
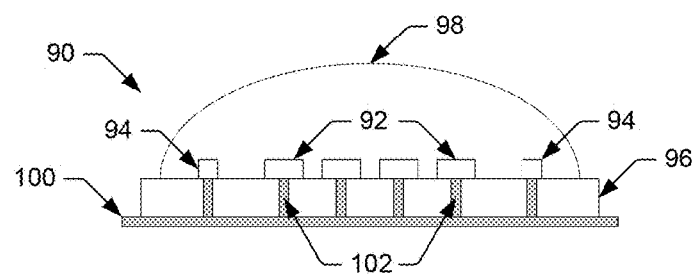
FIG. 18A is a side view of an improved emitter module, according to one embodiment of the invention.

FIG. 18A is a side view of one embodiment of an improved emitter module 90 comprising a plurality of emission LEDs 92 and one or more dedicated photodetectors 94, all of which are mounted on a common substrate 96 and encapsulated within a primary optics structure (e.g., a dome) 98. A heat sink 100 is coupled to a bottom surface of the substrate 96 for drawing heat away from the heat generating components of the emitter module 90. The heat sink 100 may comprise substantially any material with relatively high thermal and electrical conductivity. In some embodiments, the heat sink 100 is formed from a material having a thermal conductivity that ranges between about 200 W/(mK) and about 400 W/(mK). In one embodiment, the heat sink is formed from a copper or copper-alloy material, or an aluminum or aluminum alloy material. The heat sink 100 may be a relatively thick layer ranging between about 1 mm and about 10 mm, and in one embodiment, may be about 3 mm thick.

Emitter module 90 may include substantially any number and color of emission LEDs 92 and substantially any number and color of dedicated photodetectors 94. In one exemplary embodiment, the emission LEDs 92 include one or more red LEDs, one or more blue LEDs, one or more green LEDs and one or more white or yellow LEDs, as shown in FIGS. 16B and 17B. The emission LEDs 92 may generally be arranged in an array near the center of the dome 98, and the dedicated photodetectors 94 may generally be arranged about a periphery of the array. In one exemplary embodiment, the dedicated photodetectors 94 may include one or more red, orange, yellow and/or green LEDs. The LEDs used to implement the dedicated photodetectors 94 are generally smaller than the emission LEDs 92, and are generally arranged to capture a maximum amount of light that is emitted from the emission LEDs 92 and reflected from the dome 98. In some embodiments, dedicated photodetectors 114 may be omitted if one or more of the emission LEDs 112 are configured, at times, for detecting incident light.

The primary optics structure 98 may be formed from a variety of different materials and may have substantially any shape and/or dimensions necessary to shape the light emitted by the emission LEDs in a desirable manner. Although the primary optics structure 98 is described herein as a dome, one skilled in the art would understand how the primary optics structure may have substantially any other shape or configuration, which encapsulates the emission LEDs 92 and the at least one photodetector 94. In some embodiments, the shape, size and material of the dome 98 may be generally designed to improve optical efficiency and color mixing within the emitter module 90.

In one embodiment, substrate 96 may comprise a laminate material such as a printed circuit board (PCB) FR4 material, or a metal clad PCB material. However, substrate 96 may be formed from a ceramic material (or some other optically reflective material), in at least one preferred embodiment of the invention, so that the substrate may generally function to improve output efficiency by reflecting light back out of the emitter module 90. In addition, substrate 96 may be configured to provide a relatively high thermal impedance, or low thermal conductivity, in the lateral direction (i.e., the direction in the plane of the substrate). In one embodiment, substrate 96 may be formed from a material (e.g., aluminum nitride, AN) having a thermal conductivity less than or equal to about 150 W/(mK). In another embodiment, substrate 96 may be formed from a material (e.g., an aluminum oxide $Al_2O_3$ material) having a thermal conductivity less than about 30 W/(mK), or material (e.g., a PCB laminate material) having a thermal conductivity less than about 1 W/(mK). The high thermal impedance, or low thermal conductivity, provided by substrate 96 in the lateral direction advantageously isolates the junction temperatures of the emission LEDs 92 and the photodetectors 94, and avoids inaccurate Vfe and Vfd measurements.

In some embodiments, substrate 96 may be further configured to provide a relatively low thermal impedance, or high thermal conductivity, in the vertical direction (i.e., the direction perpendicular to the plane of the substrate). In particular, a relatively low thermal impedance path 102 may be provided between each emission LED 92 and each photodetector 94 to the heat sink 100. In addition to improving heat dissipation, the low thermal impedance paths 102 enable the substrate 96 to maintain a consistent temperature difference between the emitter and detector junction temperatures over operating conditions.

As noted above, alternative embodiments of the temperature compensation method shown in FIG. 8 may use the forward voltage (Vfd) measured across the photodetector(s), instead of the forward voltages (Vfe) measured across the emission LEDs, to provide an indication of the current operating temperature. However, these alternative embodiments note that the detector forward voltage (Vfd) may only be used if the temperature difference between the emission LEDs and the photodetector(s) remains substantially the same over the operating temperature range.

The improved emitter module 90 shown in FIG. 18A maintains a relatively fixed temperature difference between the emission LEDs 92 and the dedicated photodetectors 94 by providing each of the emission LEDs 92 and each of the photodetectors 94 with a low thermal impedance path 102 to the heat sink 100. This may be achieved in a number of different ways. In the particular embodiment shown in FIG. 18A, a low thermal impedance path 102 is provided by minimizing the thickness of the substrate 96 (which minimizes the vertical distance between the emission LEDs 92, the photodetectors 94 and the heat sink 100), and by connecting each of the emission LEDs 92 and each of the photodetectors 94 to the heat sink 100 with a plurality of thermally conductive lines 102. In one example, the thickness (T) of substrate 96 may range between about 300 μm and about 500 μm.

In general, the plurality of thermally conductive lines 102 may comprise substantially any thermally conductive material. In some embodiments, the thermally conductive lines 102 are formed from a material having a thermal conductivity that ranges between about 200 W/(mK) and about 400 W/(mK). The material used for the thermally conductive lines 102 may be the same material used for the heat sink 100, or may be different. In one embodiment, the thermally conductive lines 102 are formed from an aluminum, aluminum-alloy, copper or copper-alloy material. The plurality of thermally conductive lines 102 may be formed by drilling vertical holes through the substrate (using any mechanical or optical means), and filling or plating the holes (or vias) with a metal material using any appropriate method. In some embodiments, each thermally conductive line 102 may comprise a plurality (e.g., about 10-20) of densely packed vias, with each via being on the order of a couple of hundred microns wide.

If the emitter module 90 shown in FIG. 18A is utilized within an illumination device, the detector forward voltage (Vfd) may be used within the temperature compensation method of FIG. 8 to provide a good indication of the junction temperatures of the emission LEDs 92. Since the temperature difference between the emission LEDs 92 and the photodetectors 94 is fixed, the detector forward voltage (Vfd) may be measured in step 38 of FIG. 8 (instead of the emitter forward voltages), and the emitter forward voltages (Vfe) may be calculated using the detector forward voltage (Vfd) measurement and the emitter forward voltages (Vfe) stored in the calibration table of FIG. 7. This would advantageously reduce the number of forward voltage measurements that need to be obtained during the temperature compensation method of FIG. 8.

While the emitter module shown in FIG. 18A provides desirable thermal characteristics, it may not provide sufficient electrical isolation between the emission LEDs, photodetectors and heat sink. For both the emission LEDs and the photodetectors, the electrical contacts to either the anode, cathode, or both (in a flip-chip LED design) are generally provided on the backside of the LEDs. These contacts cannot be electrically coupled to the heat sink by directly connecting the contacts to the heat sink with the metal lines shown in FIG. 18A. In order to provide electrical isolation between the LEDs and the heat sink, routing layers are provided in FIG. 18B for connecting a chain of LEDs together and for connecting the LED anodes/cathodes to external contacts outside of the dome.

Figure 18B:
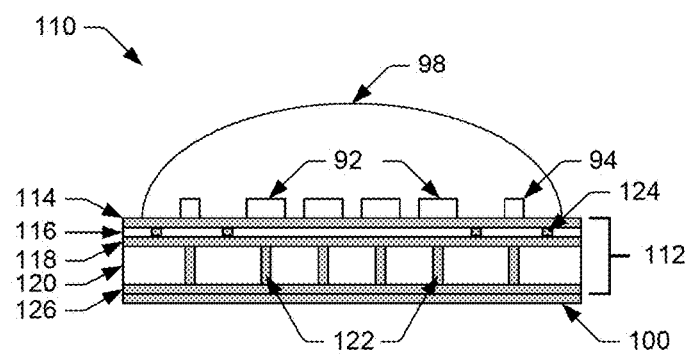
FIG. 18B is a side view of an improved emitter module, according to another embodiment of the invention.

FIG. 18B is a side view of another embodiment of an improved emitter module 110 comprising a plurality of emission LEDs 92 and one or more dedicated photodetectors 94, all of which are mounted on a common substrate 112 and encapsulated within a primary optics structure 98. Many of the components shown in FIG. 18B are similar to those shown in FIG. 18A. Like components are denoted with like reference numerals.

Emitter module 110 may include substantially any number, color and arrangement of emission LEDs 92 and substantially any number, color and arrangement of dedicated photodetectors 94. The emission LEDs 92 and the dedicated photodetectors 94 may be similar to those described above, but are not limited to such. In some embodiments, one or more of the dedicated photodetectors 94 may be omitted if one or more of the emission LEDs 92 are configured, at times, for detecting incident light.

The primary optics structure 98 may be formed from a variety of different materials and may have substantially any shape and/or dimensions necessary to shape the light emitted by the emission LEDs 92 in a desirable manner. Although the primary optics structure 98 is described herein as a dome, one skilled in the art would understand how the primary optics structure may have substantially any other shape or configuration, which encapsulates the emission LEDs 92 and the at least one photodetector 94. In some embodiments, the shape, size and material of the dome 98 may be generally designed to improve optical efficiency and color mixing within the emitter module 110.

Heat sink 100 is coupled to a bottom surface of the substrate 112 for drawing heat away from the heat generating components of the emitter module 110. The heat sink 100 may comprise substantially any material with relatively high thermal and electrical conductivity. In some embodiments, heat sink 100 is formed from a material having a thermal conductivity that ranges between about 200 W/(mK) and about 400 W/(mK). In one embodiment, the heat sink is formed from a copper or copper-alloy material, or an aluminum or aluminum alloy material. In some embodiments, the heat sink 100 may be a relatively thick layer ranging between about 1 mm and about 10 mm, and in one embodiment, may be about 3 mm thick.

Emitter module 110 differs from emitter module 90, in at least one aspect, by electrically isolating the electrical contacts of the emission LEDs 92 and the photodetectors 94 from the heat sink 100. This is achieved in the embodiment of FIG. 18B by utilizing a substrate 112 having multiple layers. While an overall thickness (e.g., about 300 µm to about 500 µm) of the multiple layer substrate 112 may be similar to the single layer substrate 96 shown in FIG. 18A, in some embodiments, the multiple layer substrate 112 shown in FIG. 18B is generally formed to include multiple routing and dielectric layers, which not only provide electrical isolation between the electrical contacts of the LEDs and the heat sink, but also improve routing flexibility.

According to one embodiment, multiple layer substrate 112 may include a first routing layer 114, a first dielectric layer 116, a second routing layer 118 and a second dielectric layer 120. The first routing layer 114 is coupled to the electrical contacts of the emission LEDs 92 and the one or more photodetectors 94, and may be formed on the first dielectric layer 116. The first routing layer 114 may have a thickness that ranges between about 10 µm to about 20 µm, may be formed of a material (e.g., a copper or aluminum material, or an alloy thereof) having a thermal conductivity that ranges between 200 W/(mK) and about 400 W/(mK), and may be formed by any well-known process on the upper surface of the first dielectric layer 116. For example, the first routing layer 114 may be formed by printing or depositing metal lines on the upper surface of the first dielectric layer 116.

The first dielectric layer 116 is sandwiched between the first routing layer 114 and the second routing layer 118 for electrically isolating the electrical contacts of the LEDs from the heat sink 100. In some embodiments, the first dielectric layer 116 may be a relatively thin layer having a thickness between about 10 µm and about 100 µm, and may be formed from a dielectric material having a relative permittivity that ranges between about 3 and 12. In one example, the first dielectric layer 116 may be formed from an aluminum nitride material or an aluminum oxide material, but is not limited to such materials.

In addition to providing electrical isolation, first dielectric layer 116 provides a relatively high thermal impedance in the lateral direction by using a material with a relatively low thermal conductivity, which is less than about 150 W/(mK), and keeping the thickness of the layer small relative to the spacing between the emission LEDs and the photodetectors. In one exemplary embodiment, the first dielectric layer 116 may have a thickness of about 30 µm, and the emission LEDs 92 and photodetectors 94 may be spaced at least 200-300 µm apart on an upper surface of the substrate 112. Such an embodiment would provide at least 10 times higher thermal conductivity in the vertical direction than in the lateral direction.

The second routing layer 118 is coupled between the first dielectric layer 116 and the second dielectric layer 120 and is generally configured for routing signals between the first routing layer 114 and external electrical contacts (not shown) arranged outside of the primary optics structure. Like the first routing layer 114, the second routing layer 118 may have a thickness that ranges between about 10 µm to about 20 µm, may be formed of a material (e.g., a copper or aluminum material, or an alloy thereof) having a thermal conductivity that ranges between 200 W/(mK) and about 400 W/(mK), and may be formed by any well-known process on the upper surface of the second dielectric layer 120. For example, the second routing layer 118 may be formed by printing or depositing metal lines on the upper surface of the second dielectric layer 120. In order to route signals between the first routing layer 114 and the second routing layer 118, vias 124 may be formed within the first dielectric layer 116. These vias may be formed in accordance with any known process.

In some embodiments, the second dielectric layer 120 may be coupled between the second routing layer 118 and the heat sink 100 and may be generally configured for providing a relatively high thermal impedance in the lateral direction, and a relatively low thermal impedance in the vertical direction. In some embodiments, the second dielectric layer 120 may be a relatively thick layer having a thickness between about 100 µm and about 1000 µm, which imparts rigidity to the emitter module 110. In some embodiments, the second dielectric layer 120 may be formed from a dielectric material having a relative permittivity that ranges between about 3 and 12 and a thermal conductivity that is less than about 150 W/(mK). In one example, the second dielectric layer 120 may be formed from an aluminum nitride material or an aluminum oxide material, but is not limited to such materials.

The second dielectric layer 120 is similar to the substrate 96 shown in FIG. 18A, in that it provides a relatively high thermal impedance in the lateral direction by implementing the second dielectric layer 120 with a material having a thermal conductivity less than about 150 W/(mK), and a relatively low thermal impedance in the vertical direction by including a plurality of thermally conductive lines 122, which extend vertically through the second dielectric layer 120 between the second routing layer 118 and the heat sink 100. As noted above, the plurality of thermally conductive lines 122 may be formed from a material having a thermal conductivity that ranges between about 200 W/(mK) and about 400 W/(mK), such as a copper or aluminum material, or an alloy thereof. The plurality of thermally conductive lines 122 may be formed by drilling vertical holes through the second dielectric layer (using any mechanical or optical means), and filling or plating the holes (or vias) with an appropriate metal material using any appropriate method. In some embodiments, each thermally conductive line 122 may comprise a plurality (e.g., about 10-20) of densely packed vias, with each via being a couple of hundred microns wide.

In some embodiments, a third routing layer 126 may be coupled between the second dielectric layer 120 and the heat sink 100. Unlike the first and second routing layers, which comprise metal lines printed on the first and second dielectric layers, the third routing layer 126 may extend substantially continuously across an upper surface of the heat sink 100 for improving the thermal contact between the plurality of thermally conductive lines 122 and the heat sink 100 and improving heat spreading there across.

Like the substrate 96 shown in FIG. 18A, the multiple layer substrate 112 shown in FIG. 18B provides good thermal isolation between the emission LEDs 92, and between the emission LEDs and the photodetectors, while providing rigidity and maintaining good overall thermal conductivity to the heat sink 100. This allows the detector forward voltage (Vfd) measurements to be used in lieu of emitter forward voltage (Vfe) measurements in the compensation method of FIG. 8, which reduces the number of forward voltage measurements that need to be obtained during the compensation method.

The multiple layer substrate 112 shown in FIG. 18B also provides other advantages, which the single layer substrate 96 cannot provide. For example, substrate 112 includes multiple routing and dielectric layers, which improve routing flexibility for connecting chains of the emission LEDs 92 together, and provides electrical isolation between the electrical contacts of the emission LEDs and photodetectors and the heat sink 100.

The multiple layer substrate 112 can also be implemented somewhat differently in alternative embodiments of the invention. For example, instead of using dielectric or ceramic materials for layers 116 and 120, these layers could be using a laminate material such as a printed circuit board (PCB) FR4 material, or a metal clad PCB material. However, since the thermal conductivity of laminate materials (e.g., less than about 1 W/(mK)) is much less than that of ceramic materials, using a laminate material in lieu of a ceramic material would reduce the thermal conductivity of layer 120. Regardless of the material used for layer 120, thermal conductivity may be increased in some embodiments of the invention by increasing the number of thermally conductive lines 122 included under the LED array. While this approach would provide better overall thermal conductivity from the LED array to the heat sink, it would provide worse thermal separation between the emission LEDs.

FIG. 19 is one example of a block diagram of an illumination device 110 configured to accurately maintain a desired luminous flux and a desired chromaticity over variations in drive current, temperature and time. The illumination device illustrated in FIG. 19 provides one example of the hardware and/or software that may be used to implement the calibration method shown in FIG. 6 and the compensation methods shown in FIGS. 8 and 13.

In the illustrated embodiment, illumination device 110 comprises a plurality of emission LEDs 126 and one or more dedicated photodetectors 128. The emission LEDs 126, in this example, comprise four chains of any number of LEDs. In typical embodiments, each chain may have 2 to 4 LEDs of the same color, which are coupled in series and configured to receive the same drive current. In one example, the emission LEDs 126 may include a chain of red LEDs, a chain of green LEDs, a chain of blue LEDs, and a chain of white or yellow LEDs. However, the present invention is not limited to any particular number of LED chains, any particular number of LEDs within the chains, or any particular color or combination of LED colors.

Although the one or more dedicated photodetectors 128 are also illustrated in FIG. 19 as including a chain of LEDs, the present invention is not limited to any particular type, number, color, combination or arrangement of photodetectors. In one embodiment, the one or more dedicated photodetectors 128 may include a small red, orange or yellow LED, as discussed above with respect to FIG. 16B. In another embodiment, the one or more dedicated photodetectors 128 may include one or more small red LEDs and one or more small green LEDs, as discussed above with respect to FIG. 17B. In some embodiments, one or more of the dedicated photodetector(s) 128 shown in FIG. 19 may be omitted if one or more of the emission LEDs 126 are configured, at times, to function as a photodetector. The plurality of emission LEDs 126 and the (optional) dedicated photodetectors 128 may be included within an emitter module, as discussed above. In some embodiments, an illumination device may include more than one emitter module, as discussed above.

In addition to including one or more emitter modules, illumination device 110 includes various hardware and software components, which are configured for powering the illumination device and controlling the light output from the emitter module(s). In one embodiment, the illumination device is connected to an AC mains 112, and includes an AC/DC converter 114 for converting AC mains power (e.g., 120V or 240V) to a DC voltage ($V_{DC}$). As shown in FIG. 19, this DC voltage (e.g., 15V) is supplied to the LED driver and receiver circuit 124 for producing the operative drive currents applied to the emission LEDs 126 for producing illumination. In addition to the AC/DC converter, a DC/DC converter 116 is included for converting the DC voltage $V_{DC}$ (e.g., 15V) to a lower voltage $V_L$ (e.g., 3.3V), which is used to power the low voltage circuitry included within the illumination device, such as PLL 118, wireless interface 120, and control circuit 122.

In the illustrated embodiment, PLL 118 locks to the AC mains frequency (e.g., 50 or 60 HZ) and produces a high speed clock (CLK) signal and a synchronization signal (SYNC). The CLK signal provides the timing for control circuit 122 and LED driver and receiver circuit 124. In one example, the CLK signal frequency is in the tens of mHz range (e.g., 23 MHz), and is precisely synchronized to the AC Mains frequency and phase. The SNYC signal is used by the control circuit 122 to create the timing used to obtain the various optical and electrical measurements described above. In one example, the SNYC signal frequency is equal to the AC Mains frequency (e.g., 50 or 60 HZ) and also has a precise phase alignment with the AC Mains.

In some embodiments, a wireless interface 120 may be included and used to calibrate the illumination device 110 during manufacturing. As noted above, for example, an external calibration tool (not shown in FIG. 19) may communicate luminous flux and chromaticity calibration values to an illumination device under test via the wireless interface 120. The calibration values received via the wireless interface 120 may be stored in the table of calibration values within a storage medium 121 of the control circuit 122, for example. In some embodiments, the control circuit 122 may use the calibration values to generate calibration coefficients, which are stored within the storage medium 121 in addition to, or in lieu of, the received calibration values.

Wireless interface 120 is not limited to receiving only calibration data, and may be used for communicating information and commands for many other purposes. For example, wireless interface 120 could be used during normal operation to communicate commands, which may be used to control the illumination device 110, or to obtain information about the illumination device 110. For instance, commands may be communicated to the illumination device 110 via the wireless interface 120 to turn the illumination device on/off, to control the dimming level and/or color set point of the illumination device, to initiate the calibration procedure, or to store calibration results in memory. In other examples, wireless interface 120 may be used to obtain status information or fault condition codes associated with illumination device 110.

In some embodiments, wireless interface 120 could operate according to ZigBee, WiFi, Bluetooth, or any other proprietary or standard wireless data communication protocol. In other embodiments, wireless interface 120 could communicate using radio frequency (RF), infrared (IR) light or visible light. In alternative embodiments, a wired interface could be used, in place of the wireless interface 120 shown, to communicate information, data and/or commands over the AC mains or a dedicated conductor or set of conductors.

Using the timing signals received from PLL 118, the control circuit 122 calculates and produces values indicating the desired drive current to be used for each LED chain 126. This information may be communicated from the control circuit 122 to the LED driver and receiver circuit 124 over a serial bus conforming to a standard, such as SPI or I²C, for example. In addition, the control circuit 122 may provide a latching signal that instructs the LED driver and receiver circuit 124 to simultaneously change the drive currents supplied to each of the LEDs 126 to prevent brightness and color artifacts.

In general, the control circuit 122 may be configured for determining the respective drive currents needed to achieve a desired luminous flux and/or a desired chromaticity for the illumination device in accordance with one or more of the compensation methods shown in FIGS. 8 and 13 and described above. In some embodiments, the control circuit 122 may determine the respective drive currents by executing program instructions stored within the storage medium 121. In one embodiment, the storage medium may be a non-volatile memory, and may be configured for storing the program instructions along with a table of calibration values, such as the table described above with respect to FIG. 7. Alternatively, the control circuit 122 may include combinatorial logic for determining the desired drive currents, and the storage medium 121 may only be used for storing the table of calibration values.

In general, the LED driver and receiver circuit 124 may include a number (N) of driver blocks 130 equal to the number of emission LED chains 126 included within the illumination device. In the exemplary embodiment discussed herein, LED driver and receiver circuit 124 comprises four driver blocks 130, each configured to produce illumination from a different one of the emission LED chains 126. The LED driver and receiver circuit 124 also comprises the circuitry needed to measure ambient temperature (optional), the detector and/or emitter forward voltages, and the detector photocurrents, and to adjust the LED drive currents accordingly. Each driver block 130 receives data indicating a desired drive current from the control circuit 122, along with a latching signal indicating when the driver block 130 should change the drive current.

FIG. 20 is an exemplary block diagram of an LED driver and receiver circuit 124, according to one embodiment of the invention. As shown in FIG. 20, the LED driver and receiver circuit 124 includes four driver blocks 130, each block including a buck converter 132, a current source 134, and an LC filter 138 for generating the drive currents that are supplied to a connected chain of emission LED 126a to produce illumination and obtain forward voltage (Vfe) measurements. In some embodiments, buck converter 132 may produce a pulse width modulated (PWM) voltage output (Vdr) when the controller 154 drives the "Out_En" signal high. This voltage signal (Vdr) is filtered by the LC filter 138 to produce a forward voltage on the anode of the connected LED chain 126a. The cathode of the LED chain is connected to the current source 134, which forces a fixed drive current equal to the value provided by the "Emitter Current" signal through the LED chain 126a when the "Led_On" signal is high. The "Vc" signal from the current source 134 provides feedback to the buck converter 132 to output the proper duty cycle and minimize the voltage drop across the current source 134.

As shown in FIG. 20, each driver block 130 includes a difference amplifier 137 for measuring the forward voltage drop (Vfe) across the chain of emission LEDs 126a. When measuring Vfe, the buck converter 132 is turned off and the current source 134 is configured for drawing a relatively small drive current (e.g., about 1 mA) through the connected chain of emission LEDs 126a. The voltage drop (Vfe) produced across the LED chain 126a by that current is measured by the difference amplifier 137. The difference amplifier 137 produces a signal that is equal to the forward voltage (Vfe) drop across the emission LED chain 126a during forward voltage measurements.

As noted above, some embodiments of the invention may use one of the emission LEDs (e.g., a green emission LED), at times, as a photodetector. In such embodiments, the driver blocks 130 may include additional circuitry for measuring the photocurrents (Iph_d2), which are induced across an emission LED, when the emission LED is configured for detecting incident light. For example, each driver block 130 may include a transimpedance amplifier 135, which generally functions to convert an input current to an output voltage proportional to a feedback resistance. As shown in FIG. 20, the positive terminal of transimpedance amplifier 135 is connected to the Vdr output of the buck converter 132, while the negative terminal is connected to the cathode of the last LED in the LED chain 126a. Transimpedance amplifier 135 is enabled when the "LED_On" signal is low. When the "LED_On" signal is high, the output of transimpedance amplifier 135 is tri-stated.

When measuring the photocurrents (Iph_d2) induced by an emission LED, the buck converters 132 connected to all other emission LEDs should be turned off to avoid visual artifacts produced by LED current transients. In addition, the buck converter 132 coupled to the emission LED under test should also be turned off to prevent switching noise within the buck converter from interfering with the photocurrent measurements. Although turned off, the Vdr output of the buck converter 132 coupled to the emission LED under test is held to a particular value (e.g., about 2-3.5 volts times the number of emission LEDs in the chain) by the capacitor within LC filter 138. When this voltage (Vdr) is supplied to the anode of emission LED under test and the positive terminal of the transimpedance amplifier 135, the transimpedance amplifier produces an output voltage (relative to Vdr) that is supplied to the positive terminal of difference amplifier 136. Difference amplifier 136 compares the output voltage of transimpedance amplifier 135 to Vdr and generates a difference signal, which corresponds to the photocurrent (Iph_d2) induced across the LED chain 126a.

In addition to including a plurality of driver blocks 130, the LED driver and receiver circuit 124 may include one or more receiver blocks 140 for measuring the forward voltages (Vfd) and photocurrents (Iph_d1 or Iph_d2) induced across the one or more dedicated photodetectors 128. Although only one receiver block 140 is shown in FIG. 20, the LED driver and receiver circuit 124 may generally include a number of receiver blocks 140 equal to the number of dedicated photodetectors included within the emitter module.

In the illustrated embodiment, receiver block 140 comprises a voltage source 142, which is coupled for supplying a DC voltage (Vdr) to the anode of the dedicated photodetector 128 coupled to the receiver block, while the cathode of the photodetector 128 is connected to current source 144. When photodetector 128 is configured for obtaining forward voltage (Vfd), the controller 154 supplies a "Detector_On" signal to the current source 144, which forces a fixed drive current (Idrv) equal to the value provided by the "Detector Current" signal through photodetector 128.

When obtaining detector forward voltage (Vfd) measurements, current source 144 is configured for drawing a relatively small amount of drive current (Idrv) through photodetector 128. The voltage drop (Vfd) produced across photodetector 128 by that current is measured by difference amplifier 147, which produces a signal equal to the forward voltage (Vfd) drop across photodetector 128. As noted above, the drive current (Idrv) forced through photodetector 128 by the current source 144 is generally a relatively small, non-operative drive current. In the embodiment in which four dedicated photodetectors 128 are coupled in parallel, the non-operative drive current may be roughly 1 mA. However, smaller/larger drive currents may be used in embodiments that include fewer/greater numbers of photodetectors, or embodiments that do not connect the photodetectors in parallel.

Similar to driver block 130, receiver block 140 also includes circuitry for measuring the photocurrents (Iph_d1 or Iph_d2) induced on photodetector 128 by light emitted by the emission LEDs. As shown in FIG. 20, the positive terminal of transimpedance amplifier 145 is coupled to the Vdr output of voltage source 142, while the negative terminal is connected to the cathode of photodetector 128. When connected in this manner, the transimpedance amplifier 145 produces an output voltage relative to Vdr (e.g., about 0-1V), which is supplied to the positive terminal of difference amplifier 146. Difference amplifier 146 compares the output voltage to Vdr and generates a difference signal, which corresponds to the photocurrent (Iph_d1 or Iph_d2) induced across photodetector 128. Transimpedance amplifier 145 is enabled when the "Detector_On" signal is low. When the "Detector_On" signal is high, the output of transimpedance amplifier 145 is tri-stated.

As noted above, some embodiments of the invention may scatter the individual LEDs within each chain of LEDs 126 about the array of LEDs, so that no two LEDs of the same color exist in any row, column or diagonal (see, e.g., FIG. 17B). By connecting a plurality of dedicated photodetectors 128 in parallel with the receiver block 140, the photocurrents (Iph_d1 or Iph_d2) induced on each photodetector 128 by the LEDs of a given color may be summed to minimize the spatial variation between the similarly colored LEDs, which are scattered about the array.

As shown in FIG. 20, the LED driver and receiver circuit 124 may also include a multiplexor (Mux) 150, an analog to digital converter (ADC) 152, a controller 154, and an optional temperature sensor 156. In some embodiments, multiplexor 150 may be coupled for receiving the emitter forward voltage (Vfe) and the (optional) photocurrent (Iph_d2) measurements from the driver blocks 130, and the detector forward voltage (Vfd) and detector photocurrent (Iph_d1 and/or Iph_d2) measurements from the receiver block 140. The ADC 152 digitizes the emitter forward voltage (Vfe) and the optional photocurrent (Iph_d2) measurements output from the driver blocks 130, and the detector forward voltage (Vfd) and detector photocurrent (Iph_d1 and/or Iph_d2) measurements output from the receiver block 140, and provides the results to the controller 154. The controller 154 determines when to take forward voltage and photocurrent measurements and produces the Out_En, Emitter Current and Led_On signals, which are supplied to the driver blocks 130, and the Detector Current and Detector_On signals, which are supplied to the receiver block 140 as shown in FIG. 20.

In some embodiments, the LED driver and receiver circuit 124 may include an optional temperature sensor 156 for taking ambient temperature (Ta) measurements. In such embodiments, multiplexor 150 may also be coupled for multiplexing the ambient temperature (Ta) with the forward voltage and photocurrent measurements sent to the ADC 152. In some embodiments, the temperature sensor 156 may be a thermistor, and may be included on the driver circuit chip for measuring the ambient temperature surrounding the LEDs, or a temperature from the heat sink of the emitter module. In other embodiments, the temperature sensor 156 may be an LED, which is used as both a temperature sensor and an optical sensor to measure ambient light conditions or output characteristics of the LED emission chains 126. If the optional temperature sensor 156 is included, the output of the temperature sensor may be used in some embodiments to determine if a significant change in temperature is detected in step 32 of FIG. 8.

One implementation of an improved illumination device 110 has now been described in reference to FIGS. 19-20. Further description of such an illumination device may be found in commonly assigned U.S. application Ser. Nos. 13/970,944, 13/970,964 and 13/970,990. A skilled artisan would understand how the illumination device could be alternatively implemented within the scope of the present invention.

It will be appreciated to those skilled in the art having the benefit of this disclosure that this invention is believed to provide an improved illumination device and improved methods for calibrating and compensating individual LEDs in the illumination device, so as to maintain a desired luminous flux and a desired chromaticity over variations in drive current, temperature and time. In addition, emitter modules having improved thermal and electrical characteristics are also provided herein. Further modifications and alternative embodiments of various aspects of the invention will be apparent to those skilled in the art in view of this description. It is intended, therefore, that the following claims be interpreted to embrace all such modifications and changes and, accordingly, the specification and drawings are to be regarded in an illustrative rather than a restrictive sense.

What is claimed is:

1. An illumination device, comprising:
a plurality of light emitting diode (LED) chains configured to produce illumination for the illumination device;
a photodetector configured for detecting the illumination produced by each of the plurality of LED chains;
an LED driver and receiver circuit configured for:
successively applying at least three different drive currents to each of the plurality of LED chains, one LED chain at a time, to produce illumination at different levels of brightness when the LED chains are subjected to a first ambient temperature;
measuring photocurrents induced on the photodetector by the illumination produced by each of the plurality of LED chains at each of the at least three different drive currents;
measuring forward voltages that develop across the photodetector before, during or after each induced photocurrent is measured; and
repeating the steps of successively applying at least three different drive currents to each of the LED chains, measuring photocurrents induced on the photodetector, and measuring forward voltages that develop across the photodetector when the LED chains are subjected to a second ambient temperature, which is different from the first ambient temperature;
an interface configured for receiving luminous flux and chromaticity measurements, which are measured by an external calibration tool upon receiving the illumination produced by each of the plurality of LED chains at each of the at least three different drive currents when the LED chains are subjected to the first and second ambient temperatures; and
a storage medium configured for storing the photocurrent, forward voltage, luminous flux, and chromaticity measurements obtained for each of the plurality of LED chains within a table of calibration values.

2. The illumination device as recited in claim 1, wherein the photocurrent, forward voltage, luminous flux, and chromaticity measurements stored within the storage medium comprise measured values or calculated coefficients.

3. The illumination device as recited in claim 1, wherein for each LED chain, the table of calibration values comprises:
a first plurality of photocurrent values obtained from the photodetector upon receiving illumination from the LED chain when the LED chain is subjected to the first ambient temperature and the at least three different drive currents are successively applied to the LED chain;
a second plurality of photocurrent values obtained from the photodetector upon receiving illumination from the LED chain when the LED chain is subjected to the second ambient temperature and the at least three different drive currents are successively applied to the LED chain; and
a plurality of forward voltage values measured across the photodetector before, during or after each photocurrent value is measured.

4. The illumination device as recited in claim 1, wherein for each LED chain, the table of calibration values comprises:
a first plurality of luminous flux values detected from the LED chain upon applying the at least three different drive currents to the LED chain when the LED chain is subjected to the first ambient temperature; and
a second plurality of luminous flux values detected from the LED chain upon applying the at least three different drive currents to the LED chain when the LED chain is subjected to the second ambient temperature.

5. The illumination device as recited in claim 1, wherein for each LED chain, the table of calibration values comprises:
a first plurality of x chromaticity values and a first plurality of y chromaticity values, which are detected from the LED chain upon applying the at least three different drive currents to the LED chain when the LED chain is subjected to the first ambient temperature; and
a second plurality of x chromaticity values and a second plurality of y chromaticity values, which are detected from the LED chain upon applying the at least three different drive currents to the LED chain when the LED chain is subjected to the second ambient temperature.

6. The illumination device as recited in claim 1, wherein for each LED chain, the table of calibration values comprises:
a first plurality of u chromaticity values and a first plurality of v chromaticity values, which are detected from the LED chain upon applying the at least three different drive currents to the LED chain when the LED chain is subjected to the first ambient temperature; and
a second plurality of u chromaticity values and a second plurality of v chromaticity values detected from the LED chain upon applying the at least three different drive currents to the LED chain when the LED chain is subjected to the second ambient temperature.

7. The illumination device as recited in claim 1, wherein for each LED chain, the LED driver and receiver circuit is further configured for applying a non-operative drive current to the LED chain and measuring a forward voltage that develops across the LED chain before, during or after each induced photocurrent is measured.

8. The illumination device as recited in claim 1, wherein the illumination device further comprises an additional photodetector, which is configured for detecting the illumination produced by a subset of the plurality of LED chains.

9. The illumination device as recited in claim 1, wherein the interface is a wireless interface configured to communicate using radio frequency (RF), infrared (IR) light or visible light.

10. The illumination device as recited in claim 1, wherein the interface is a wired interface, which is configured to communicate over an AC mains, a dedicated conductor or a set of conductors.

11. The illumination device as recited in claim 7, wherein for each LED chain, the table of calibration values comprises:
a first plurality of forward voltage values measured across the LED chain upon applying the non-operative drive current to the LED chain when the LED chain is subjected to the first ambient temperature; and
a second plurality of forward voltage values measured across the LED chain upon applying the non-operative drive current to the LED chain when the LED chain is subjected to the second ambient temperature.

12. The illumination device as recited in claim 8, wherein the subset of the plurality of LED chains comprise a chain of phosphor converted LEDs and a chain of reference LEDs.

13. The illumination device as recited in claim 12, wherein the chain of phosphor converted LEDs comprise a chain of phosphor converted white LEDs, and wherein the chain of reference LEDs comprise a chain of blue LEDs.

14. The illumination device as recited in claim 12, wherein the LED driver and receiver circuit is configured for:
measuring photocurrents induced on the additional photodetector by the illumination individually produced by the chain of phosphor converted LEDs and the chain of reference LEDs at each of the at least three different drive currents when the LED chains are subjected to the first and second ambient temperatures; and
measuring forward voltages that develop across the additional photodetector before, during or after each induced photocurrent is measured.

15. The illumination device as recited in claim 14, wherein the photocurrents and forward voltages measured across the additional photodetector are stored within the storage medium as measured values or calculated coefficients.

16. The illumination device as recited in claim 14, wherein for each LED chain within the subset, the table of calibration values comprises:
a first plurality of photocurrent values obtained from the additional photodetector upon receiving illumination from the LED chain when the LED chain is subjected to the first ambient temperature and the at least three different drive currents are successively applied to the LED chain;
a second plurality of photocurrent values obtained from the additional photodetector upon receiving illumination from the LED chain when the LED chain is subjected to the second ambient temperature and the at least three different drive currents are successively applied to the LED chain; and
a plurality of forward voltage values measured across the additional photodetector before, during, or after each photocurrent value is measured.

17. The illumination device as recited in claim 9, wherein the wireless interface is configured to operate according to at least one of ZigBee, WiFi, or Bluetooth communication protocols.

* * * * *